US010665616B2

(12) United States Patent
Inoue et al.

(10) Patent No.: US 10,665,616 B2
(45) Date of Patent: May 26, 2020

(54) THIN FILM TRANSISTOR SUBSTRATE AND METHOD OF MANUFACTURING THIN FILM TRANSISTOR SUBSTRATE

(71) Applicant: Mitsubishi Electric Corporation, Tokyo (JP)

(72) Inventors: Kazunori Inoue, Kumamoto (JP); Koji Oda, Kumamoto (JP); Kensuke Nagayama, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/020,290

(22) Filed: Jun. 27, 2018

(65) Prior Publication Data
US 2019/0013333 A1    Jan. 10, 2019

(30) Foreign Application Priority Data

Jul. 5, 2017    (JP) .................................. 2017-131663

(51) Int. Cl.
*H01L 29/04* (2006.01)
*H01L 27/12* (2006.01)
(Continued)

(52) U.S. Cl.
CPC .......... *H01L 27/124* (2013.01); *G02F 1/1337* (2013.01); *G02F 1/1339* (2013.01);
(Continued)

(58) Field of Classification Search
CPC ................. H01L 27/1251; H01L 27/1225
See application file for complete search history.

(56) References Cited

U.S. PATENT DOCUMENTS

| 6,016,174 A | 1/2000 | Endo et al. |
|---|---|---|
| 6,449,026 B1 | 9/2002 | Min et al. |

(Continued)

FOREIGN PATENT DOCUMENTS

| JP | H05-063196 A | 3/1993 |
|---|---|---|
| JP | H10-268353 A | 10/1998 |

(Continued)

OTHER PUBLICATIONS

U.S. Appl. No. 15/906,665.*
Nomura et al.; Room-temperature fabrication of transparent flexible thin-film transistors using amorphous oxide semiconductors; Nature; 2004; vol. 432; pp. 488-492.

(Continued)

*Primary Examiner* — Samuel A Gebremariam
(74) *Attorney, Agent, or Firm* — Studebaker & Brackett PC

(57) ABSTRACT

A TFT substrate includes: a first semiconductor layer made of a-Si, disposed on a gate insulation layer, facing to a first gate electrode; a first and a second contact layers made of oxide having semiconductor characteristics and each partially disposed in contact with the first semiconductor layer; a first and a second electrodes connected with the first and the second contact layers, respectively; a second semiconductor layer having the same composition as the first contact layer, disposed on the gate insulation layer, facing to a second gate electrode; a third and a fourth electrodes having the same composition as the first electrode and each partially disposed in contact with the second semiconductor layer; and a pixel electrode made of oxide having conductive characteristics and the same composition as the first contact layer, disposed on an insulation layer in a first region, connected with the second electrode.

6 Claims, 43 Drawing Sheets

(51) Int. Cl.
  *G02F 1/1337* (2006.01)
  *G02F 1/1335* (2006.01)
  *G02F 1/1343* (2006.01)
  *G02F 1/1339* (2006.01)
  *H01L 29/423* (2006.01)
  *H01L 29/417* (2006.01)
  *G09G 3/36* (2006.01)
  *G02F 1/1368* (2006.01)
  *H01L 29/786* (2006.01)
  *G02F 1/1362* (2006.01)

(52) U.S. Cl.
  CPC ...... *G02F 1/1368* (2013.01); *G02F 1/133514* (2013.01); *G02F 1/134309* (2013.01); *G09G 3/3655* (2013.01); *H01L 27/1225* (2013.01); *H01L 27/1251* (2013.01); *H01L 27/1259* (2013.01); *H01L 27/1262* (2013.01); *H01L 27/1288* (2013.01); *H01L 29/41733* (2013.01); *H01L 29/42384* (2013.01); *H01L 29/7869* (2013.01); *H01L 29/78633* (2013.01); *H01L 29/78669* (2013.01); *G02F 1/133707* (2013.01); *G02F 1/134363* (2013.01); *G02F 2001/134372* (2013.01); *G02F 2001/136295* (2013.01); *G02F 2201/086* (2013.01); *G02F 2201/121* (2013.01); *G02F 2201/123* (2013.01); *G02F 2201/501* (2013.01)

(56) References Cited

U.S. PATENT DOCUMENTS

| 7,061,014 B2 | 6/2006 | Hosono et al. |
| 8,344,372 B2 | 1/2013 | Yamazaki et al. |
| 8,552,423 B2 | 10/2013 | Yamazaki et al. |
| 2012/0300151 A1 | 11/2012 | Yamazaki et al. |
| 2013/0126878 A1 | 5/2013 | Yamazaki et al. |
| 2014/0293183 A1 | 10/2014 | Yamazaki et al. |
| 2015/0053976 A1 | 2/2015 | Yamazaki et al. |
| 2016/0118417 A1 | 4/2016 | Yamazaki et al. |

FOREIGN PATENT DOCUMENTS

| JP | H11-119252 A | 4/1999 |
| JP | 2001-056474 A | 2/2001 |
| JP | 2004-103957 A | 4/2004 |
| JP | 2005-077822 A | 3/2005 |
| JP | 2011-029579 A | 2/2011 |
| JP | 2011-044699 A | 3/2011 |

OTHER PUBLICATIONS

Chuang et al.; P-13: Photosensitivity of Amorphous IGZO TFTs for Active-Matrix Flat-Panel Displays; SID Digest; 2008; pp. 1215-1218.

Gosain et al.; Instability of Amorphous Indium Gallium Zinc Oxide Thin Film Transistors under Light Illumination; Japanese Journal of Applied Physics; 2009; vol. 48; pp. 03B018-1-03B018-5.

\* cited by examiner

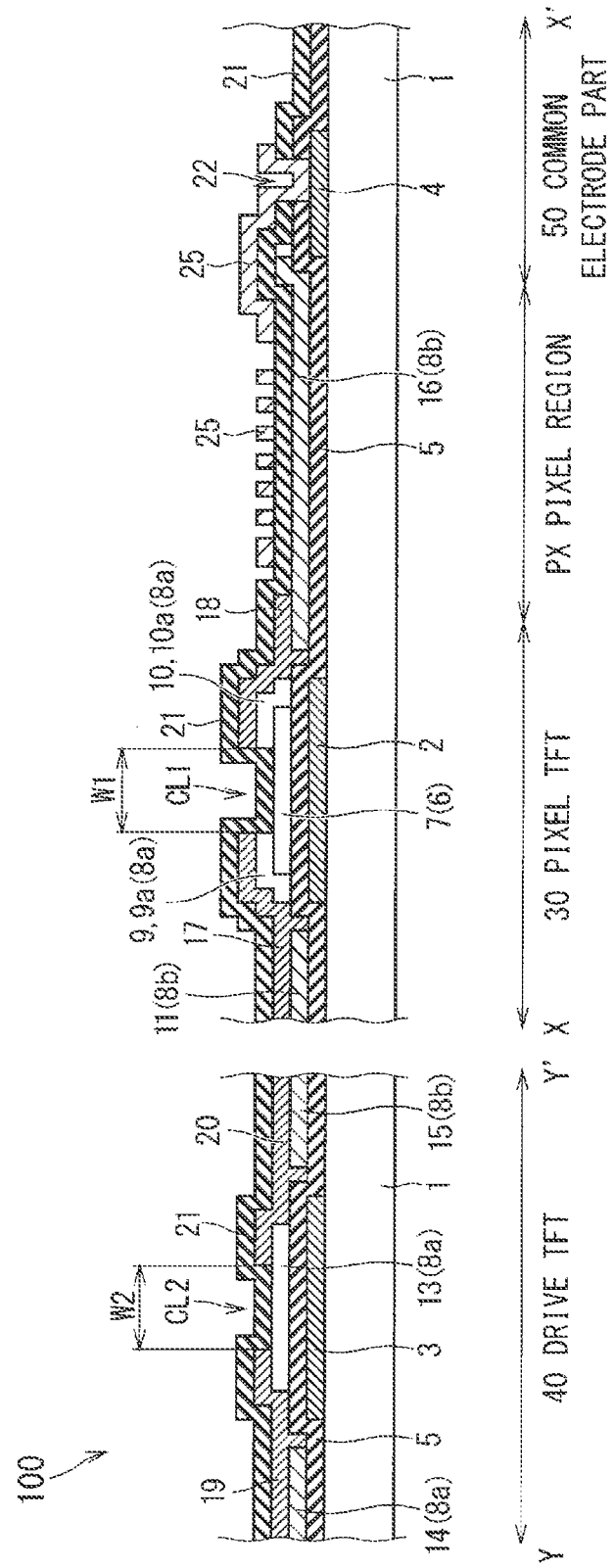

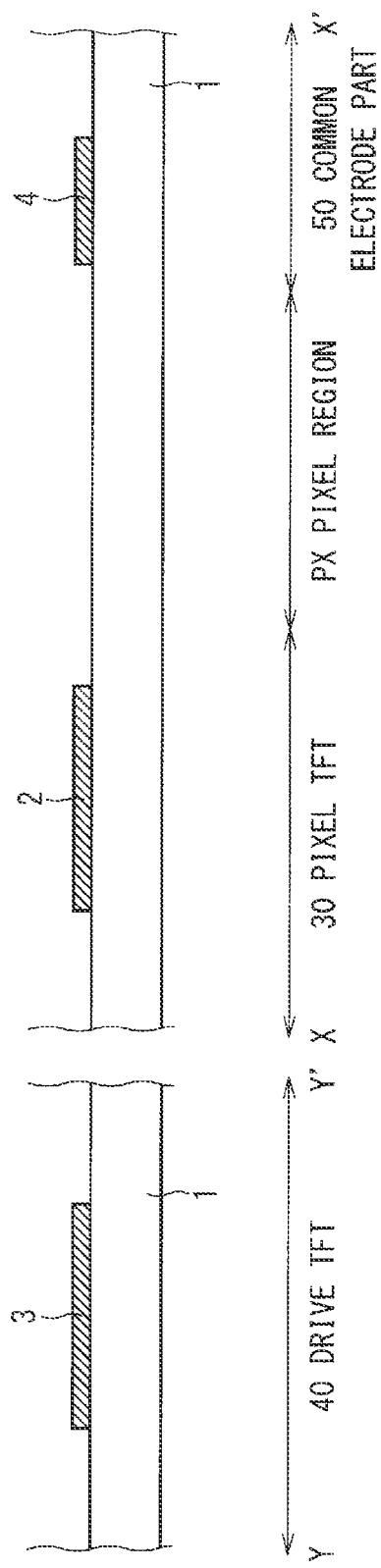
F I G. 5

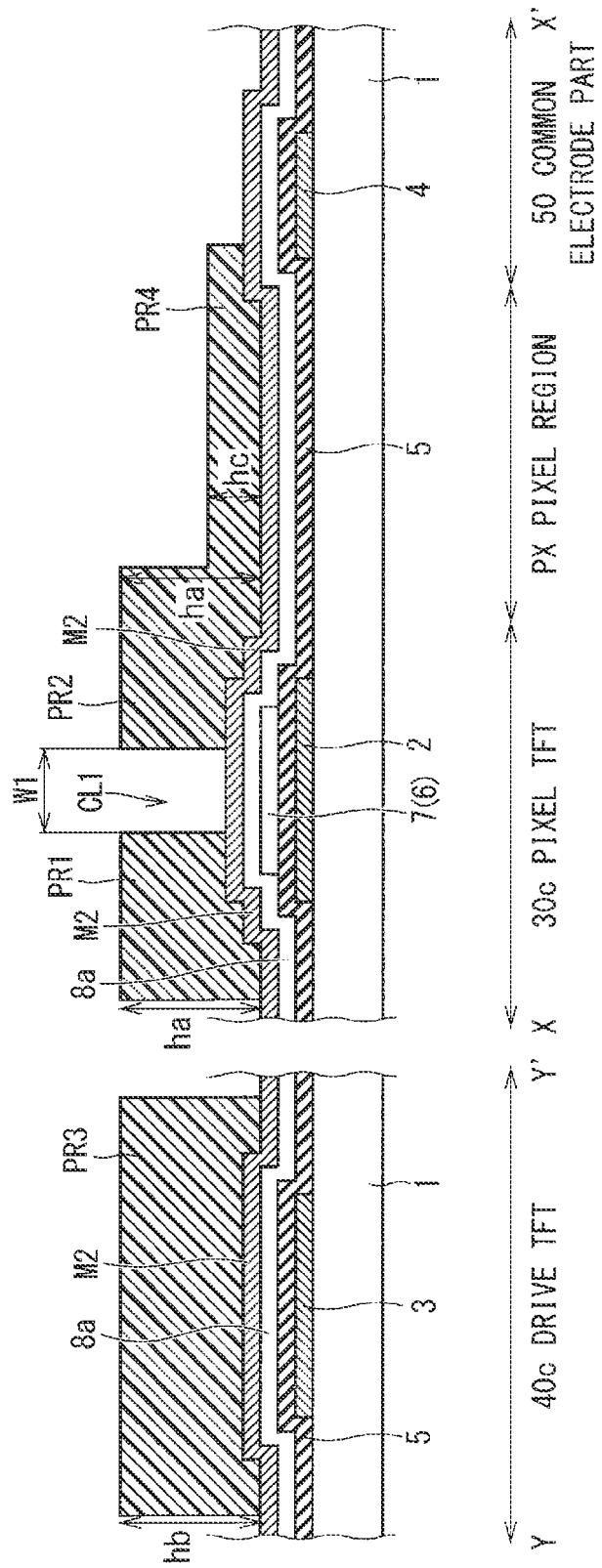

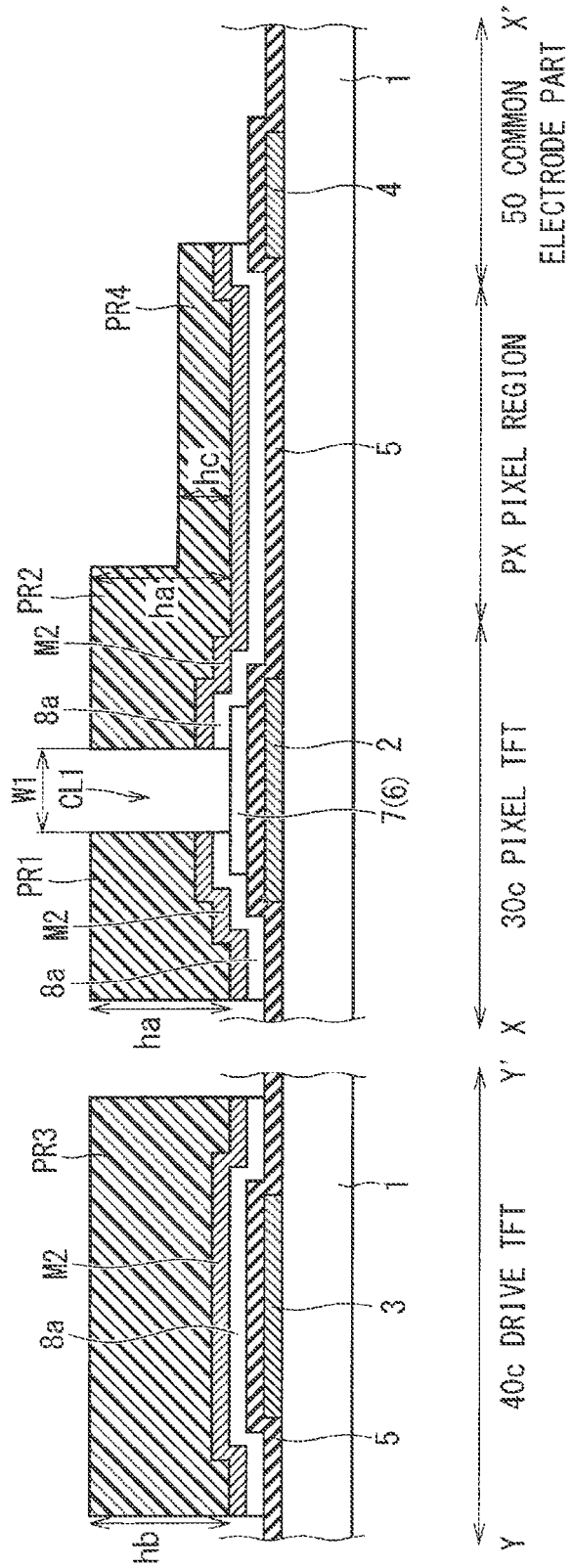
F I G. 2 0

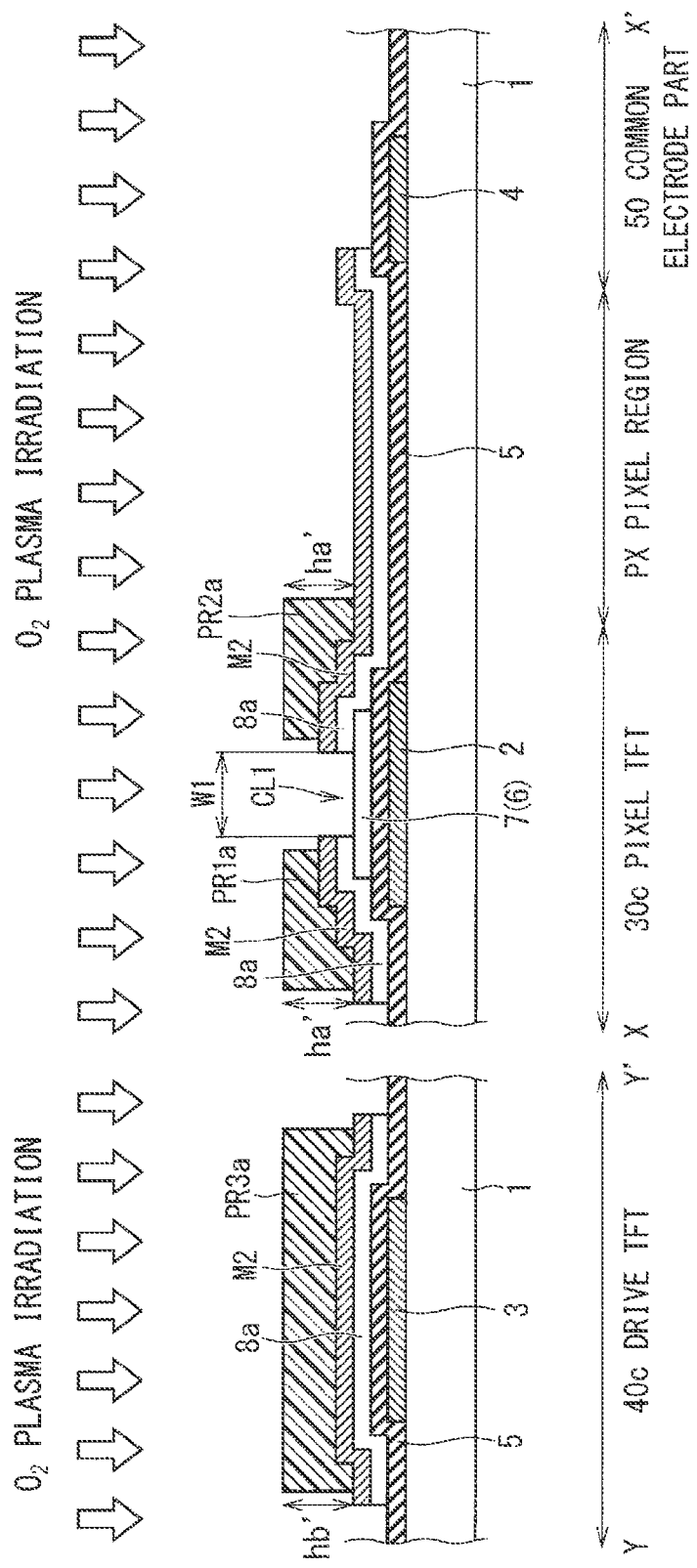

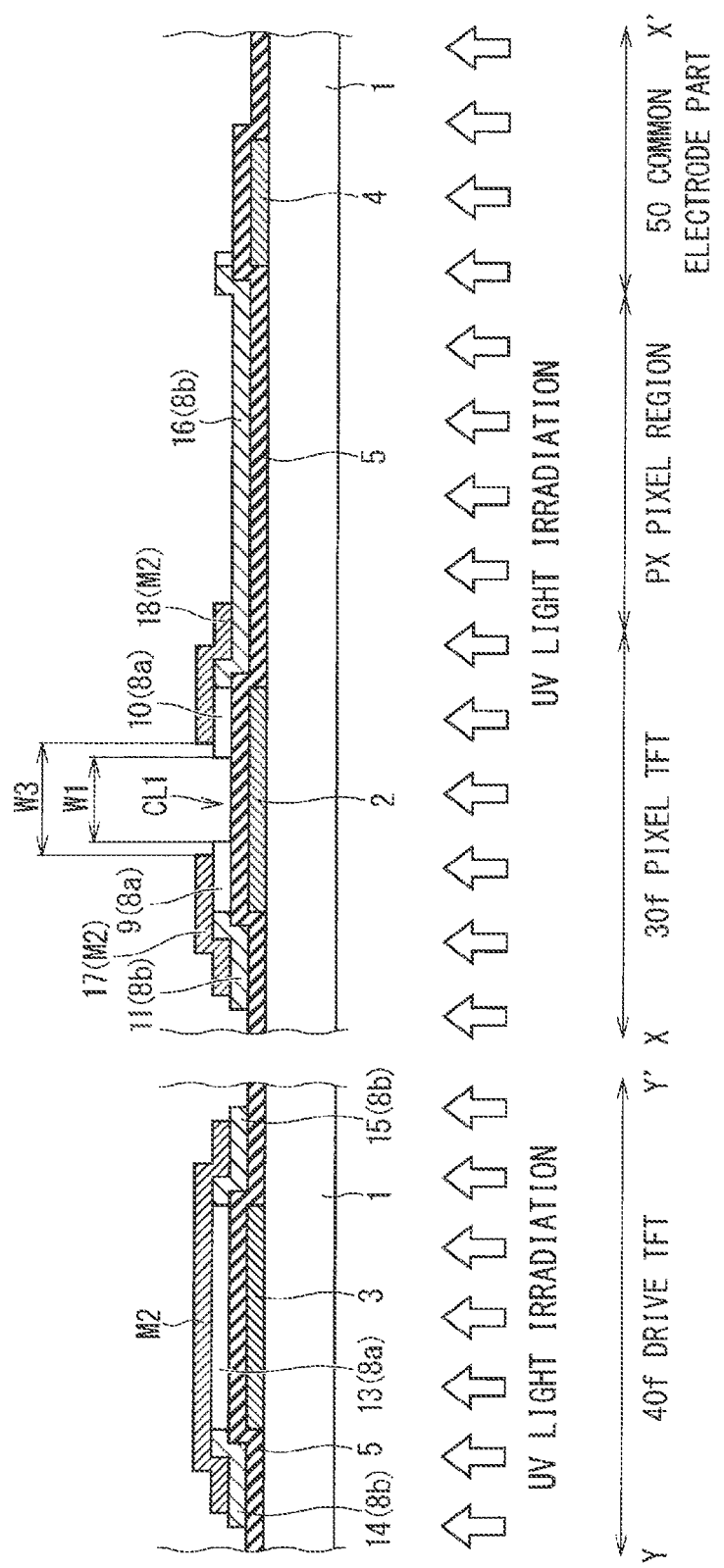

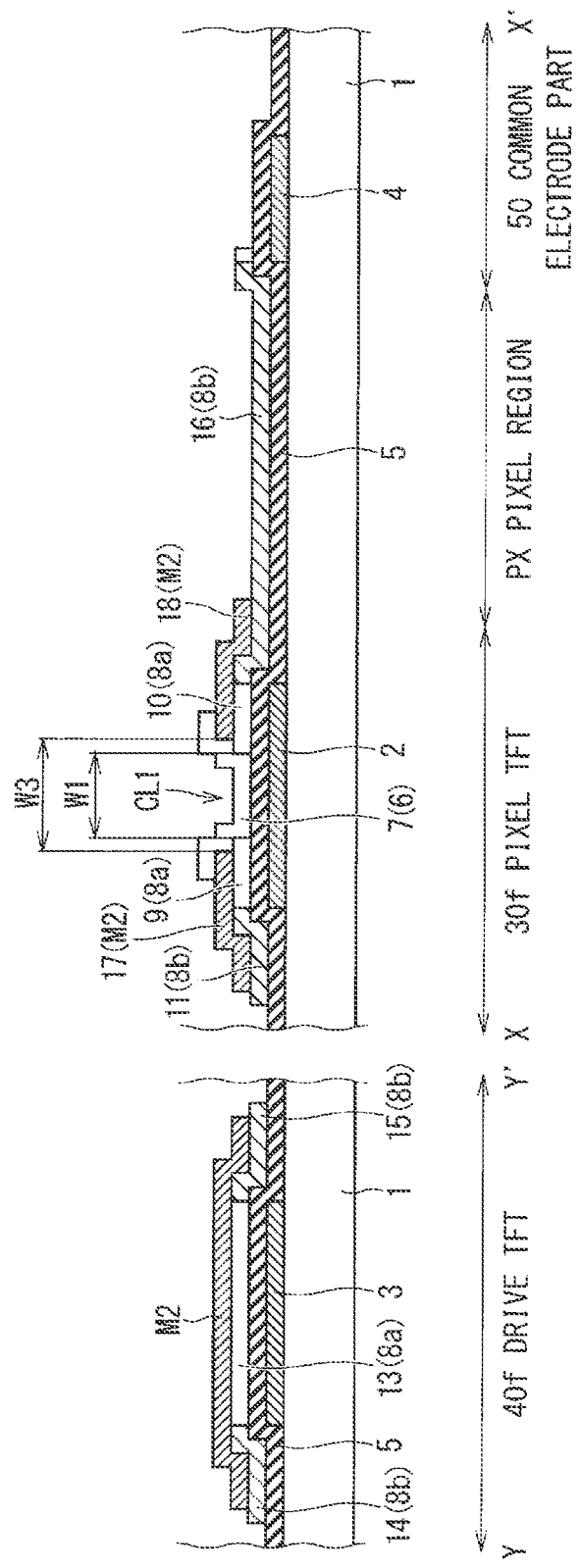
F I G. 4 2

THIN FILM TRANSISTOR SUBSTRATE AND METHOD OF MANUFACTURING THIN FILM TRANSISTOR SUBSTRATE

BACKGROUND OF THE INVENTION

Field of the Invention

The present invention relates to a thin film transistor (TFT) substrate included in a liquid crystal display device, and a thin film transistor (TFT) substrate manufacturing method.

Description of the Background Art

Liquid crystal displays (LCDs) as a kind of conventionally typical thin panels have advantages such as low electric power consumption, small size, and light weight, and have been widely used for, for example, display monitors of personal computers and portable information terminals, and televisions. LCDs have been also increasingly applied to on-board devices such as car navigation products and meter display monitors.

An electro-optical device such as an LCD typically includes an active matrix substrate (hereinafter referred to as "TFT substrate") on which image display drive elements that are thin film transistors (TFTs) are disposed in a matrix in a panel plane. Improvement of display performance such as wide view angle, high definition, and high quality has been desired for an LCD (TFT-LCD) using a TFT substrate, as well as cost reduction through a simplified TFT substrate manufacturing process.

The basic structure of a conventionally typical TFT-LCD includes as a basic structure a liquid crystal panel obtained by laminating a TFT substrate (element substrate) and a counter substrate (CF substrate) with a liquid crystal layer interposed therebetween. The TFT substrate is a substrate on which a plurality of pixels each including a pixel electrode and a TFT (pixel TFT) connected with the pixel electrode are disposed in a matrix. The counter substrate includes a counter electrode disposed opposite to the pixel electrode, a color filter (CF), and the like. The TFT-LCD also includes, for example, a polarizer attached to the liquid crystal panel. For example, in a transmissive LCD configured to perform image display by transmitting light, a backlight (BL) is provided on the back surface side of a liquid crystal panel.

In a liquid crystal panel of a twisted nematic (TN) scheme, a pixel electrode and a counter electrode, which are used to generate electric field that drives liquid crystals, are disposed on the TFT substrate and the counter substrate, respectively, with the liquid crystal layer interposed therebetween. For example, Japanese Patent Application Laid-Open No. 10-268353 discloses the configuration of such a TFT substrate and a method of manufacturing the TFT substrate. In the liquid crystal panel of the TN scheme, the electric field that drives liquid crystals is applied in a direction perpendicular to the surface of the TFT substrate (and the counter substrate), and thus the TN scheme is also called a perpendicular electric field liquid crystal drive scheme. A liquid crystal panel of the perpendicular electric field drive scheme such as the TN scheme typically has a narrow view angle of image display.

As disclosed in, for example, Japanese Patent Application Laid-Open No. 11-119252, an LCD (IPS-LCD) of an in-plane switching (IPS; registered trademark of Japan Display Inc.) scheme, which is an in-plane electric field liquid crystal drive scheme, has been widely known as a display device having a wide view angle characteristic. However, the IPS-LCD has problems of a low aperture ratio and low transmissivity at a pixel display unit, and has difficulties in achieving a bright display characteristic. This is mainly because the electric field that drives liquid crystals does not effectively function above a pixel electrode having a comb-teeth shape in the IPS-LCD, and some of the liquid crystals on the pixel electrode do not operate. To solve this problem, an LCD (FFS-LCD) of a fringe field switching (FFS) scheme as disclosed in, for example, Japanese Patent Application Laid-Open No. 2001-56474 has been widely used as an LCD having a wide view angle.

The pixel TFT disposed on a conventional LCD TFT substrate typically includes a semiconductor channel layer made of amorphous silicon (a-Si). This is mainly because the amorphousness of a-Si allows formation of a film having uniform characteristics on a large-area substrate, and the temperature of an a-Si process including deposition is equal to or lower than 300° C. approximately, which is such a relatively low temperature that allows manufacturing on an inexpensive glass substrate having low thermal resistance. A TFT including a channel layer made of a-Si is suitable for the process of manufacturing, particularly for a television, an LCD having a large display area and required to achieve cost reduction.

A pixel TFT including a channel layer made of a-Si typically has a TFT structure called an inversely staggered structure. The use of a TFT having the inversely staggered structure provides advantage of efficiently manufacturing a TFT substrate of the TN scheme at low cost, as a method of the manufacturing disclosed in, for example, Japanese Patent Application Laid-Open No. 10-268353. Such a TFT having the inversely staggered structure basically has a TFT structure called a BCE type, which requires a back channel etching (BCE) process, and a BCE TFT using a-Si can be excellently used as a pixel TFT.

However, a TFT made of a-Si has a low mobility of 0.5 $cm^2$/Vsec approximately, and thus it is markedly difficult to incorporate such an a-Si TFT in a drive-circuit TFT (drive TFT), which is required to have high mobility to drive a pixel TFT. Accordingly, in a typical LCD drive circuit, an external drive IC chip on which high-mobility TFTs and capacitor elements are integrated is attached to a liquid crystal panel. Thus, a space for attaching any external IC is needed in the peripheral region of the liquid crystal panel, which limits downsizing and price reduction (manufacturing cost reduction) of an LCD product.

A high mobility exceeding 10 $cm^2$/Vsec can be achieved with a TFT including a channel layer made of micro crystalline or poly crystalline Si in place of amorphous Si. For example, Japanese Patent Application Laid-Open No. 5-63196 discloses a technology of forming a pixel TFT and a drive TFT on an identical substrate by using polycrystalline Si as a channel layer made. Such an LCD does not need an external IC, and the drive TFT can be formed through a photoengraving process like the pixel TFT, which leads to downsizing of the LCD and reduction of manufacturing cost thereof.

Recently, a TFT (oxide semiconductor TFT) including a channel layer made of oxide semiconductor has been developed (Japanese Patent Application Laid-Open No. 2004-103957, Japanese Patent Application Laid-Open No. 2005-77822, and Kenji Nomura et al., "Room-temperature fabrication of transparent flexible thin-film transistors using amorphous oxide semiconductors", Nature, 2004, Vol. 432, pp. 488 to 492, for example). Examples of the oxide semiconductor include zinc oxide (ZnO) semiconductor, and InGaZnO semiconductor obtained by adding gallium oxide ($Ga_2O_3$) and indium oxide ($In_2O_3$) to zinc oxide (ZnO).

The oxide semiconductor with an appropriate composition reliably provides a highly-uniform amorphous film and has a mobility (equal to or higher than 5 cm$^2$/Vsec) more than an order of magnitude higher than that achieved with conventionally used a-Si, thereby achieving a small-sized high-performance TFT. Thus, a pixel TFT and a drive TFT can be still formed on an identical substrate when oxide semiconductor film is used as a channel layer. Such technologies are disclosed in, for example, Japanese Patent Application Laid-Open No. 2011-29579 and Japanese Patent Application Laid-Open No. 2011-44699.

As described above, reduction of the size and price of an LCD product can be achieved when a pixel TFT and a drive TFT can be formed on an identical substrate. However, the mobility is low at a TFT including a channel layer made of a-Si, which has been conventionally excellently used for a pixel TFT, and thus it has been difficult to use such a TFT as a pixel drive TFT, for which high mobility is required.

As disclosed in Japanese Patent Application Laid-Open No. 10-268353, in manufacturing of a BCE TFT having the inversely staggered structure and including a channel layer made of a-Si, a favorable contact characteristic cannot be obtained at the interface between a-Si and a metal film. Thus, it is needed to provide an n-type low-resistance Si semiconductor layer (ohmic contact layer), the resistance of which reduced by increasing the number of electron carriers through addition of an element of group 13 such as phosphorus (P) to a-Si, at the interface between the channel layer and a source electrode or a drain electrode. This configuration requires the process (BCE process) of forming a channel (back channel) by removing the n-type low-resistance Si semiconductor layer on the a-Si semiconductor channel layer after forming the source electrode and the drain electrode.

In this process, since the channel layer and the n-type low resistance semiconductor layer are made of the same a-Si material, it is difficult to accurately remove the n-type low-resistance Si semiconductor layer only by selective etching, while leaving intact the a-Si semiconductor layer of the channel layer. In a case of a large-area substrate, uniformity defect of a TFT characteristic is likely to occur due to uniformity defect through the etching (removal) process, which leads to defect such as display ununiformity.

In the technology of forming a pixel TFT and a drive TFT on an identical substrate by using, as a channel layer, micro crystalline Si or polycrystalline Si having high mobility, which is disclosed in Japanese Patent Application Laid-Open No. 11-119252, crystallization of Si requires a process at high temperature close to 1000° C. Thus, a device such as a high-temperature annealing furnace needs to be newly installed. In addition, the process requires a highly thermally resistant and expensive substrate such as quartz, which leads to increase of material cost and difficulties in increasing the size of a substrate. Accordingly, it has been unable to manufacture a large-sized LCD.

Polycrystallization of Si at a relatively low temperature is achieved by, for example, a laser annealing method of irradiating Si with excimer laser or the like. Typically, the technology of Si polycrystallization through laser irradiation is widely known as a low-temperature polysilicon (LTPS) technology, and the polycrystallization is typically performed at a process temperature of 500° C. or lower. However, it is difficult to uniformly crystallize the Si channel layer in a large area by using this technology because fine control is needed at wide-range laser scanning. In addition, a laser irradiation device needs to be newly installed, which leads to increase of manufacturing cost.

When crystallized Si is used, the etching uniformity in a BCE process still occurs at manufacturing of a BCE TFT, like a case with a-Si.

Technologies of forming a pixel TFT and a drive TFT on an identical substrate by using oxide semiconductor as a channel layer, which are disclosed in Japanese Patent Application Laid-Open No. 2004-103957 and Japanese Patent Application Laid-Open No. 2005-77822 have advantage of achieving high-performance small pixel TFT and drive TFT on an identical substrate because the oxide semiconductor with an appropriate composition reliably provides a highly-uniform amorphous film and has a mobility higher than that achieved with conventionally used a-Si, as described above. In addition, an amorphous oxide film can be manufactured through a process at a relatively low temperature, and thus the TFTs can be manufactured with a conventionally used a-Si film at the same facility, which prevents increase of manufacturing cost.

However, it has been known that a TFT including a channel layer made of oxide semiconductor suffers TFT characteristic degradation (optical degradation) due to light (Chiao-Shun Chuang et al., "Photosensitivity of Amorphous IGZO TFTs for Active-Matrix Flat-Panel Displays", SID DIGEST, 2008, pp. 1215 to 1218, and Dharam Pal Gosain et al., "Instability of Amorphous Indium Gallium Zinc Oxide Thin Film Transistors under Light Illumination", Japanese Journal of Applied Physics, 2009, Vol. 48, pp. 03B018-1 to 03B018-5, for example). The drive TFT of a drive circuit formed in the peripheral region of the liquid crystal panel of an LCD can be prevented from suffering the optical degradation of TFT characteristics by, for example, shielding the peripheral region from light. However, the pixel TFT in a display region suffers optical degradation when leakage light (stray light) attributable to backlight (BL) from the back surface side and external light from the surface side enters into the channel layer, potentially causing display defect.

As described above, the use of the FFS-LCD is effective to obtain an excellent image display characteristic with a wide view angle. However, in the FFS-LCD, a pixel electrode layer and a counter electrode layer need to be disposed on a TFT substrate, unlike the TN scheme, which leads to reduced production efficiency as compared to the TN scheme and thus increase in manufacturing cost.

SUMMARY

The present specification is intended to provide a thin film transistor substrate that allows formation of a pixel TFT and a drive TFT having excellent characteristics on an identical substrate at low cost.

A thin film transistor substrate in the present specification includes a first gate electrode, a second gate electrode, a gate insulation layer, a first semiconductor layer, a first contact layer, a second contact layer, a first electrode, a second electrode, a second semiconductor layer, a third electrode, a fourth electrode, and a pixel electrode. The first gate electrode is made of a first conductive film. The first gate electrode is disposed in a predetermined first region on a substrate. The second gate electrode is made of a first conductive film having a composition same as a composition of the first gate electrode. The second gate electrode is disposed in a predetermined second region on the substrate. The gate insulation layer is disposed on the substrate to cover the first gate electrode and the second gate electrode. The first semiconductor layer is made of amorphous silicon.

The first semiconductor layer is disposed on the gate insulation layer, and overlaps the first gate electrode in plan view. The first contact layer is made of oxide having semiconductor characteristics. A part of the first contact layer is disposed in contact with a surface of the first semiconductor layer. The second contact layer is made of oxide having semiconductor characteristics and a composition same as a composition of the first contact layer. The second contact layer is disposed separately from the first contact layer. A part of the second contact layer is disposed in contact with the surface of the first semiconductor layer. The first electrode is made of a second conductive film. The first electrode is connected with the first contact layer. The second electrode is made of a second conductive film having a composition same as a composition of the first electrode. The second electrode is connected with the second contact layer. The second semiconductor layer is made of oxide having semiconductor characteristics and a composition same as the composition of the first contact layer and the second contact layer. The second semiconductor layer is disposed on the gate insulation layer, and overlaps the second gate electrode in plan view. The third electrode is made of the second conductive film having a composition same as the composition of the first electrode and the second electrode. A part of the third electrode is disposed in contact with a surface of the second semiconductor layer. The fourth electrode is made of the second conductive film having a composition same as the composition of the first electrode and the second electrode. The fourth electrode is disposed separately from the third electrode. A part of the fourth electrode is disposed in contact with the surface of the second semiconductor layer. The pixel electrode is made of oxide having conductive characteristics and a composition same as a composition of the oxide that has the semiconductor characteristics and of which the first contact layer is made. The pixel electrode is disposed on the gate insulation layer positioned in the predetermined first region and outside of a region in which the first gate electrode is formed. The pixel electrode is connected with the second electrode.

Another thin film transistor substrate in the present specification includes a first gate electrode, a second gate electrode, a gate insulation layer, a first contact layer, a second contact layer, a first electrode, a second electrode, a first semiconductor layer, a second semiconductor layer, a third electrode, a fourth electrode, and a pixel electrode. The first gate electrode is made of a first conductive film. The first gate electrode is disposed in a predetermined first region on a substrate. The second gate electrode is made of a first conductive film having a composition same as a composition of the first gate electrode. The second gate electrode is disposed in a predetermined second region on the substrate. The gate insulation layer is disposed on the substrate to cover the first gate electrode and the second gate electrode. The first contact layer is made of oxide having semiconductor characteristics. The first contact layer is disposed on the gate insulation layer, and a part of the first contact layer overlaps the first gate electrode in plan view. The second contact layer is made of oxide having semiconductor characteristics and a composition same as a composition of the first contact layer. The second contact layer is disposed on the gate insulation layer, and is separated from the first contact layer with a first separation part interposed between the first and second contact layers. A part of the second contact layer overlaps part of the first gate electrode in plan view. The first electrode is made of a second conductive film. The first electrode is disposed on the first contact layer. The second electrode is made of the second conductive film having a composition same as a composition of the first electrode. The second electrode is disposed on the second contact layer and separated from the first electrode with a second separation part interposed between the first and second electrodes. The second separation part positioned between the first electrode and the second electrode is larger than the first separation part positioned between the first contact layer and the second contact layer. The first semiconductor layer is made of amorphous silicon. The first semiconductor layer is disposed over the gate insulation layer exposed in the first separation part, part of the first electrode, and part of the second electrode. The first semiconductor layer is disposed in contact with the first contact layer and the second contact layer exposed in the second separation part. The second semiconductor layer is made of oxide having semiconductor characteristics and a composition same as the composition of the first contact layer and the second contact layer. The second semiconductor layer is disposed on the gate insulation layer, and overlaps the second gate electrode in plan view. The third electrode is made of the second conductive film having a composition same as the composition of the first electrode and the second electrode. A part of the third electrode is disposed in contact with a surface of the second semiconductor layer. The fourth electrode is made of the second conductive film having a composition same as the composition of the first electrode and the second electrode. The fourth electrode is disposed separately from the third electrode, and a part of the fourth electrode is disposed in contact with the surface of the second semiconductor layer. The pixel electrode is made of oxide having conductive characteristics and a composition same as a composition of the oxide that has the semiconductor characteristics and of which the first contact layer is made. The pixel electrode is disposed on the gate insulation layer positioned in the predetermined first region and outside of a region in which the first gate electrode is formed. The pixel electrode is connected with the second electrode.

Each thin film transistor substrate in the present specification allows formation of a pixel TFT including a channel layer made of amorphous silicon, and a drive TFT including a channel layer made of an oxide semiconductor, on an identical substrate at low cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view illustrating part of the configuration of the TFT substrate according to the first preferred embodiment;

FIGS. 5 to 9 are cross-sectional views each illustrating a process of manufacturing the TFT substrate according to the first preferred embodiment;

FIGS. 17 to 25 are cross-sectional views each illustrating a process of manufacturing the TFT substrate according to the fourth modification of the first preferred embodiment;

FIGS. 35 to 43 are cross-sectional views each illustrating a process of manufacturing the TFT substrate according to the third modification of the second preferred embodiment.

DESCRIPTION OF THE PREFERRED EMBODIMENTS

Preferred embodiments in the present specification will be described below in detail with reference to the accompanying drawings. A TFT according to the preferred embodiments in the present specification can be used as a switching element and applied to a pixel TFT and a drive TFT on a TFT substrate of an FFS liquid crystal display device (LCD) having a wide view angle.

First Preferred Embodiment

Figure 1B:
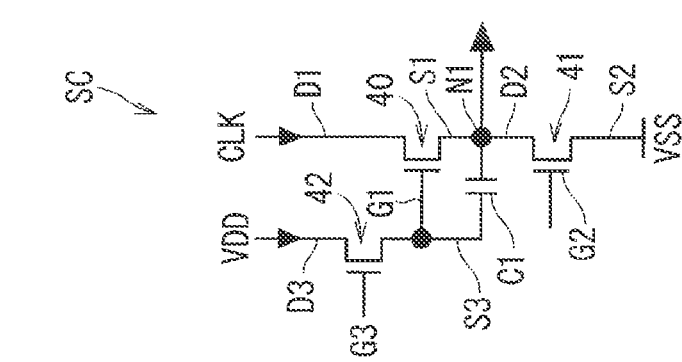
FIGS. 1A and 1B are each a plan view schematically illustrating an entire configuration of a TFT substrate according to a first preferred embodiment or a second preferred embodiment.
Figure 1A:
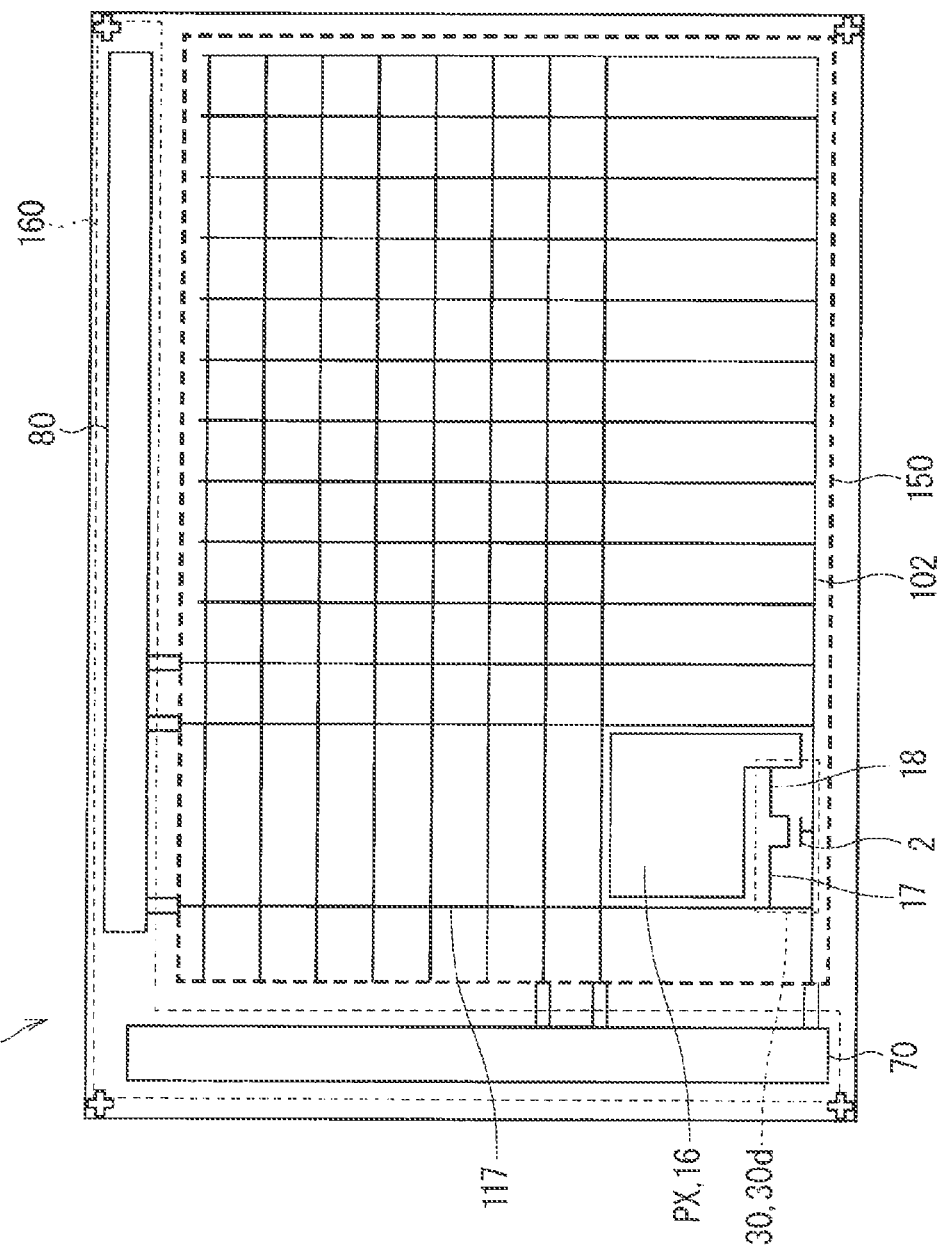

FIG. 1A is a plan view schematically illustrating an entire configuration of a TFT substrate 100 according to the present preferred embodiment. As illustrated in FIG. 1A, the plane of the TFT substrate 100 is roughly divided into a display region 150 and a frame region 160 (peripheral region) provided around the display region 150. The display region 150 includes a plurality of pixels (pixel regions) arrayed in a matrix. Each pixel includes a pixel TFT 30 as a first thin film transistor.

In the display region 150, a plurality of gate wires 102 orthogonally intersect with a plurality of source wires 117, and a pixel region PX is provided at an intersection between each gate wire and each source wire. The pixel region PX includes the pixel TFT 30 and a pixel electrode 16 electrically connected with the pixel TFT 30.

The frame region 160 includes a scanning signal drive circuit 70 configured to provide drive voltage to each gate wire and a display signal drive circuit 80 configured to provide drive voltage to each source wire. When the scanning signal drive circuit 70 applies current selectively to one of the gate wires and the display signal drive circuit 80 applies current selectively to one of the source wires, the pixel TFT 30 of a pixel at an intersection point between the wires is turned on, and electric charge is accumulated at the pixel electrode 16 connected with the pixel TFT 30.

The scanning signal drive circuit 70 includes a plurality of drive voltage generation circuits. FIG. 1B is a circuit diagram illustrating a single drive voltage generation circuit SC. The display signal drive circuit 80 includes a plurality of drive voltage generation circuits (not illustrated).

The drive voltage generation circuit SC includes a plurality of drive TFTs as second thin film transistors, such as a drive TFT 40, a drive TFT 41, and a drive TFT 42 as illustrated in FIG. 1B. Current flowing in each drive TFT flows from a drain electrode to a source electrode.

A clock signal CLK is provided to a drain D1 of the drive TFT 40. Ground potential VSS is provided to a source S2 of the drive TFT 41. A drain D2 of the drive TFT 41 is connected with a source S1 of the drive TFT 40. Power potential VDD is provided to a drain D3 of the drive TFT 42, and a source S3 of the drive TFT 42 is connected with a gate G1 of the drive TFT 40. A source S3 of the drive TFT 42 is connected with a connection node N1 between the drive TFT 40 and the drive TFT 41 through a capacitor C1. The connection node N1 between the drive TFTs 40 and 41 functions as an output node of the drive voltage generation circuit SC, and provides drive voltage to the corresponding gate wire or source wire. When the drive TFT 42 is turned on in response to a signal provided to a gate G3 of the drive TFT 42, the drive TFT 40 is turned on and the clock signal CLK is output from the connection node N1. When the drive TFT 41 is turned on in response to a signal provided to a gate G2 of the drive TFT 41, the potential of the connection node N1 is fixed to the ground potential VSS.

Although described later in detail, in the first preferred embodiment, the pixel TFT 30 includes a channel layer made of a-Si, which has been conventionally used. This configuration enables production of an LCD having stable display characteristics with reduced optical degradation. The drive TFTs 40, 41, and 42 each includes a channel layer made of oxide semiconductor. Since oxide semiconductor has high mobility, the scanning signal drive circuit 70 and the display signal drive circuit 80 that achieve stable operation can be obtained when produced by using, for example, the drive TFTs 40, 41, and 42 including channel layers made of oxide semiconductor. In addition, downsizing of the scanning signal drive circuit 70 and the display signal drive circuit 80 can be achieved, and thus the scanning signal drive circuit 70 and the display signal drive circuit 80 can be disposed in small areas in the frame region 160 of the TFT substrate 100. Thus, cost reduction of the scanning signal drive circuit 70 and the display signal drive circuit 80 can be achieved, and an LCD having a narrow frame with a reduced area of the frame region 160 can be produced.

(Configurations of Pixel TFT and Drive TFT)

The configurations of the pixel TFT 30 and the drive TFT 40 will be described below in detail with reference to the accompanying drawings. The drive TFTs 41 and 42 each have a basic configuration same as that of the drive TFT 40, and thus description thereof will be omitted. In the first preferred embodiment, the TFT substrate 100 on which the pixel TFT 30 and the drive FT 40 are formed is a TFT substrate to be included in a light transmissive liquid crystal panel, and has FFS in-plane field liquid crystal drive specifications.

Figure 2:
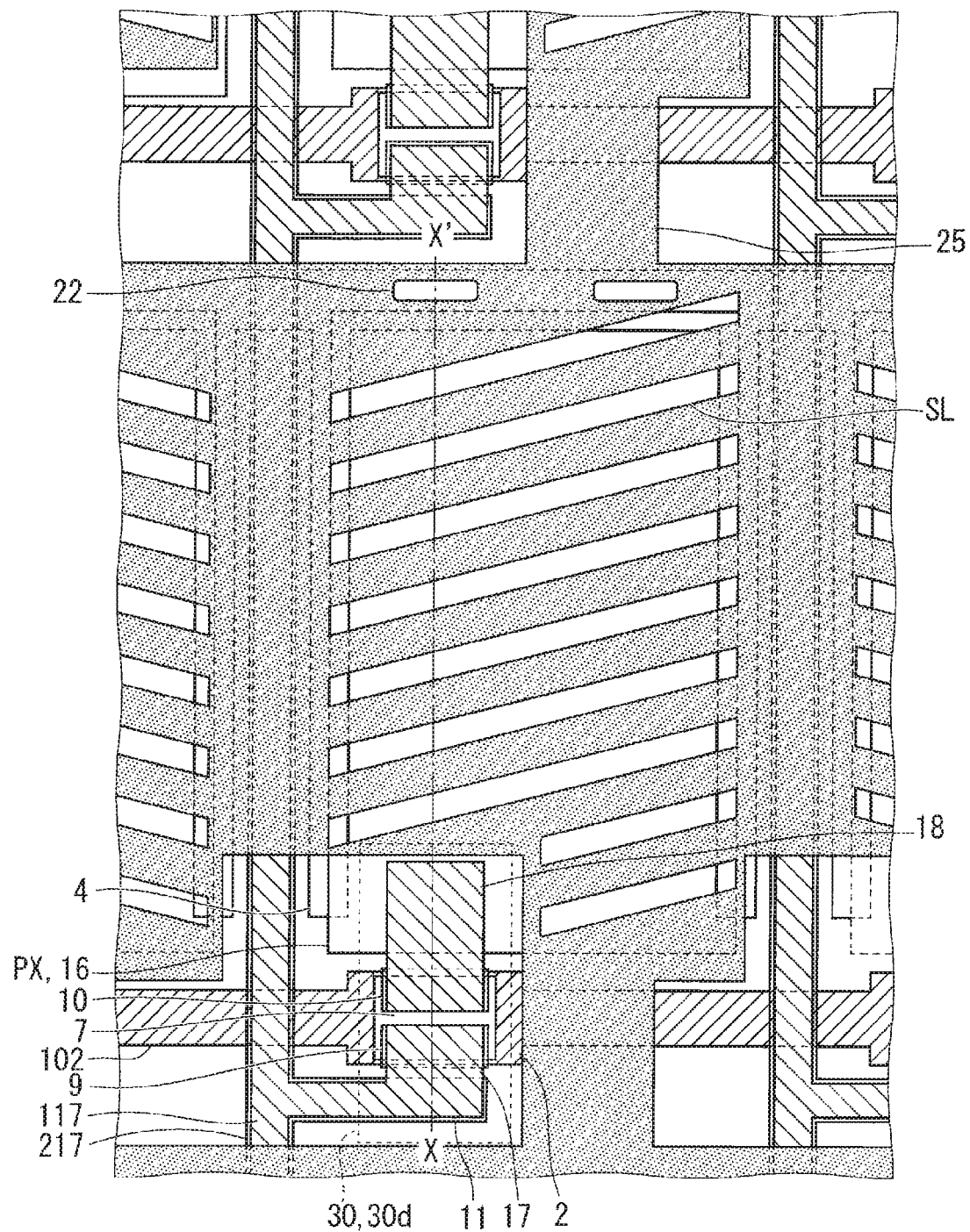
FIG. 2 is a plan view illustrating the structures of a pixel TFT and a pixel region according to the first preferred embodiment or the second preferred embodiment.
Figure 3:
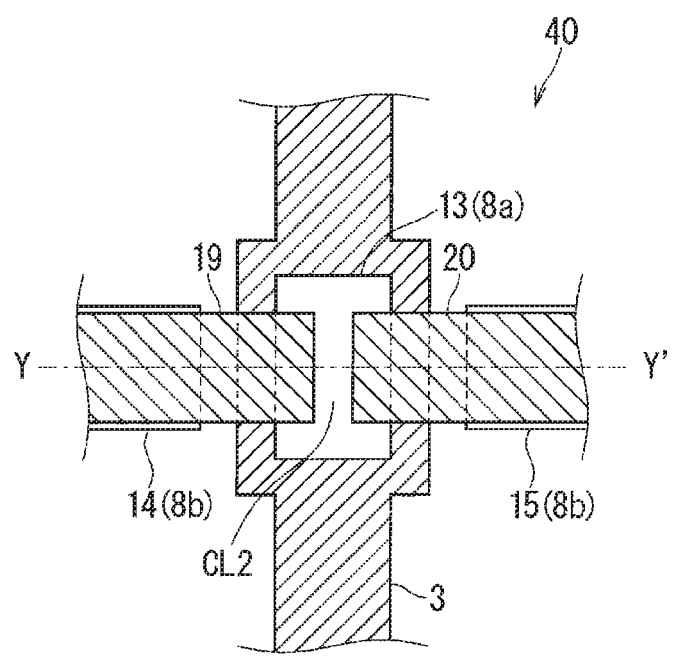
FIG. 3 is a plan view illustrating the structure of a drive TFT according to the first preferred embodiment or the second preferred embodiment.

FIG. 2 is a plan view illustrating part of the pixel TFT 30 and the pixel region PX according to the first preferred embodiment. FIG. 3 is a plan view of the drive TFT 40 according to the first preferred embodiment. The pixel TFT 30, the pixel region PX, and the drive TFT 40 are formed on the single TFT substrate 100. FIG. 4 is a cross-sectional view illustrating the structures of sections along line X-X' in FIG. 2 and line Y-Y' in FIG. 3. The configurations of the pixel TFT 30 and the drive TFT 40 will be described with reference to FIGS. 2, 3, and 4.

As illustrated in FIG. 4, the pixel TFT 30, the drive TFT 40, the pixel region PX, and a common electrode part 50 according to the first preferred embodiment are formed on a transparent insulating substrate 1 made of, for example, glass. A first gate electrode 2, a second gate electrode 3, and a common electrode 4 that are made of a first conductive film made of, for example, metal and having light-shielding characteristics are selectively formed on the substrate 1. The first gate electrode 2 is formed in a region in which the pixel TFT 30 is formed, and functions as a gate electrode of the pixel TFT 30. The second gate electrode 3 is formed in a region in which the drive TFT 40 is formed, and functions as a gate electrode of the drive TFT 40.

A gate insulation layer 5 made of a first insulating film is formed on the entire surface of the substrate 1 to cover the first gate electrode 2, the second gate electrode 3, and the like.

In the region of the pixel TFT 30, a first semiconductor layer 7 made of an a-Si film 6 is formed on the gate insulation layer 5. At least part of the first semiconductor layer 7 overlaps the first gate electrode 2 in plan view.

A semiconductor pattern 9a and a semiconductor pattern 10a that are made of an oxide film 8a having semiconductor characteristics are selectively formed on the first semiconductor layer 7. The semiconductor pattern 9a and the semiconductor pattern 10a are formed separately from each other at distance with a separation part W1 interposed therebetween in part of a region overlapping the first semiconductor layer 7 in plan view. The semiconductor pattern 9a is disposed between the first semiconductor layer 7 and a first source electrode 17 to be described later, and functions as an ohmic contact layer connecting the first semiconductor layer 7 and the first source electrode 17 at favorable electric property. In other words, the semiconductor pattern 9a is a source contact layer 9. The semiconductor pattern 10a is disposed between the first semiconductor layer 7 and a first drain electrode 18 to be described later, and functions as an ohmic contact layer connecting the first semiconductor layer 7 and the first drain electrode 18 at favorable electric property. In other words, the semiconductor pattern 10a is a drain contact layer 10. Typically, an a-Si film is made of an n-type semiconductor containing n-type carriers, and thus, the source contact layer 9 and the drain contact layer 10 are preferably made of the oxide film 8a having n-type semiconductor characteristics to achieve connection at favorable electric property.

The first source electrode 17 and the first drain electrode 18 that are made of a second conductive film are selectively formed to cover the source contact layer 9, the drain contact layer 10, and the gate insulation layer 5, and the like. The first source electrode 17 is formed in contact with at least a part of a surface of the source contact layer 9, and the first drain electrode 18 is formed in contact with at least a part of a surface of the drain contact layer 10 and connected with a partial region of the pixel electrode 16 to be described later.

In the region of the drive TFT 40, a second semiconductor layer 13 having a composition same as those of the source contact layer 9 and the drain contact layer 10 and made of the oxide film 8a having semiconductor characteristics is formed on the gate insulation layer 5. The second semiconductor layer 13 overlaps at least part of the second gate electrode 3 in plan view.

A second source electrode 19 and a second drain electrode 20 that are made of the second conductive film are selectively formed to cover a part on the second semiconductor layer 13 and the gate insulation layer 5 and the like. The second source electrode 19 and the second drain electrode 20 are each disposed partially in direct contact on the second semiconductor layer 13. In a partial region overlapping the second semiconductor layer 13, the second source electrode 19 and the second drain electrode 20 are formed at distance from each other, having a separation part W2 therebetween. The second source electrode 19 and the second drain electrode 20 are made of the second conductive film having a composition same as those of the first source electrode 17 and the first drain electrode 18. The second semiconductor layer 13 made of the oxide film 8a described above can achieve connection at favorable electric property when being in direct contact with the second source electrode 19 and the second drain electrode 20 that are made of the second conductive film.

As illustrated in FIGS. 2 to 4, a first source electrode lower layer wire 11 and a source lower layer wire 217 that are made of an oxide film 8b may be formed on a layer underneath a source wire 117, and on the gate insulation layer 5 and a layer underneath a partial region of the first source electrode 17 in plan view. The oxide film 8b has conductive characteristics and a composition same as those of the source contact layer 9 and the drain contact layer 10. A second source electrode underneath layer wire 14 and a second drain electrode underneath layer wire 15 that are made of the oxide film 8b may be formed on the gate insulation layer 5 and a layer underneath a region overlapping the second source electrode 19 and the second drain electrode 20 in plan view. These underneath layer wires functions as auxiliary wires and auxiliary electrodes of the source wire 117, the first source electrode 17, the second source electrode 19, and the second drain electrode 20, respectively, thereby preventing generation of breaking defect, for example, when part of the wires and electrodes has any pattern defect or the like.

As illustrated in FIG. 4, the pixel electrode 16 is formed on the gate insulation layer 5 in the pixel region PX. The pixel electrode 16 is made of the oxide film 8b having conductive characteristics and a composition same as those of the source contact layer 9 and the drain contact layer 10. The above-described first drain electrode 18 overlaps part of the pixel electrode 16.

A protective insulation layer 21 made of a second insulating film is formed on the entire surface of the substrate including the first source electrode 17, the first drain electrode 18, the second source electrode 19, the second drain electrode 20, and the pixel electrode 16. In the common electrode part 50, a common electrode part contact hole 22 is opened through the protective insulation layer 21 and the gate insulation layer 5 therebelow so that the surface of the common electrode 4 is partially exposed. The common electrode part contact hole 22 is disposed in a region overlapping the common electrode 4, but not the pixel electrode 16, in plan view.

In the pixel region PX, a counter electrode 25 made of a third conductive film is formed on the protective insulation layer 21, overlapping the pixel electrode 16 in plan view. In the first preferred embodiment, as illustrated in FIG. 2, the counter electrode 25 has a continuous shape that connects a plurality of pixel regions each surrounded by a gate wire 102 and the source wire 117. The counter electrode 25 is connected with the common electrode 4 through the common electrode part contact hole 22. Accordingly, a constant common potential signal from the common electrode 4 is applied to the counter electrode 25.

The counter electrode 25 includes a slit opening SL. With this structure, electric field substantially parallel to the substrate surface is generated above the counter electrode 25 when signal voltage is applied between the pixel electrode 16 and the counter electrode 25. Thus, the TFT substrate 100 is applicable to an FFS LCD having in-plane field drive specifications. An opening in a comb-teeth shape may be provided in place of the slit opening SL.

The following describes the configuration of a liquid crystal display panel including the TFT substrate 100 described above. In the configuration of the liquid crystal display panel, first, an alignment film and a spacer are disposed on the surface of the TFT substrate 100 illustrated in FIGS. 2 and 3. The alignment film is a film for arraying liquid crystals and made of, for example, polyimide. Subsequently, a separately prepared counter substrate (not illustrated) including, for example, a color filter and an alignment film is disposed facing to the TFT substrate 100. In this state, the spacer forms a gap between the TFT substrate and the counter substrate, and liquid crystals are sealed in the gap, thereby achieving an in-plane field drive FFS liquid crystal display panel. Lastly, a polarization plate, a wave plate, a backlight unit, and the like are disposed outside of the liquid crystal display panel, which completes an FFS LCD.

(Manufacturing Method)

The following describes a method of manufacturing a TFT formed on the TFT substrate 100 according to the first preferred embodiment with reference to the accompanying drawings. FIGS. 5 to 10 are each a sectional process diagram illustrating a method of manufacturing the TFT substrate 100 according to the first preferred embodiment. FIG. 4 is a cross-sectional view illustrating a last process. Line X-X' and line Y-Y' illustrated in each of FIGS. 5 to 10 correspond to the section along line X-X' illustrated in FIG. 2 and the section along line Y-Y' illustrated in FIG. 3, respectively.

First, the transparent insulation substrate 1 made of, for example, glass is cleaned by using cleaning liquid or pure water. In the first preferred embodiment, the substrate 1 is a glass substrate having a thickness of 0.6 mm. Then, the first conductive film, of which gate electrodes and the like are to be made, is formed entirely on one of main surfaces of the substrate 1 thus cleaned. An upper main surface of the substrate 1 is defined to be a main surface on which the gate electrode and the like are provided.

The first conductive film may be made of metal such as chromium (Cr), molybdenum (Mo), titanium (Ti), copper (Cu), tantalum (Ta), tungsten (W), or aluminum (Al), or alloy containing the metal element as a primary component in addition to at least one other kind of element. The primary component element is an element in a largest contained amount among elements contained in the alloy. The first conductive film may have a laminated structure including two or more layers made of the metals and the alloy. When the metals and alloy are used, a low-resistance conductive film having a specific resistance value of 50 μΩcm or smaller can be obtained. In the first preferred embodiment, a Cu film having a thickness of 200 nm is deposited as the first conductive film by a sputtering method using argon (Ar) gas.

Thereafter, photoresist material is applied on the first conductive film, and a photoresist pattern is formed through the first photoengraving process and used as a mask to pattern the first conductive film by etching. In this example, wet etching is performed by using solution including water solution containing ammonium peroxodisulfate at the concentration of 0.3 weight %. Thereafter, the photoresist pattern is removed to form the first gate electrode 2, the second gate electrode 3, and the common electrode 4 made of the first conductive film on the upper main surface of the substrate 1 as illustrated in FIG. 5.

Subsequently, the gate insulation layer 5 made of the first insulating film is formed on the entire upper main surface of the substrate 1 to cover the first gate electrode 2, the second gate electrode 3, and the like. The first insulating film functions as the gate insulation layer 5 in a TFT part, and thus is typically called a gate insulating film. In the first preferred embodiment, the gate insulation layer 5 is formed by depositing a silicon nitride film (SiN) having a thickness of 400 nm by a chemical vapor deposition (CVD) method.

Figure 6:
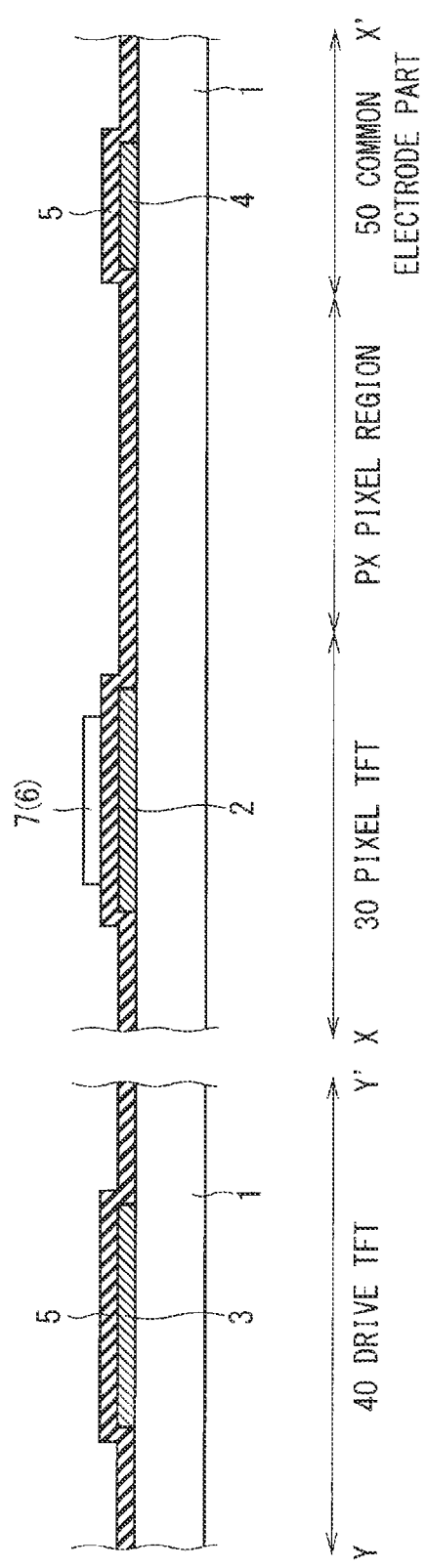

Subsequently, the a-Si film 6 of which the first semiconductor layer 7 is to be made is formed on the gate insulation layer 5. In the first preferred embodiment, the a-Si film 6 having a thickness of 100 nm is deposited by the CVD method. Thereafter, a photoresist pattern is formed through the second photoengraving process and used as a mask to pattern the a-Si film 6 by etching. In this example, dry etching is performed by using sulfur hexafluoride ($SF_6$) gas containing fluorine, and gas containing hydrogen chloride (HCl) gas. Thereafter, the photoresist pattern is removed to form the first semiconductor layer 7 made of the a-Si film 6 in a region overlapping the first gate electrode 2 in plan view on the gate insulation layer 5 as illustrated in FIG. 6.

Subsequently, the oxide film 8a, of which the second semiconductor layer 13 and the like are to be made, is formed on the first semiconductor layer 7 and the gate insulation layer 5. In the first preferred embodiment, metallic oxide (for example, InGaZnO) containing In, Ga, and Zn is used to form the oxide film 8a. More specifically, InGaZnO target [$In_2O_3 \cdot Ga_2O_3 \cdot 2(ZnO)$] having an atom composition ratio of In:Ga:Zn:O=1:1:1:4 is used to deposit an InGaZnO film having a thickness of 50 nm by the sputtering method using mixed gas of argon (Ar) gas and oxygen ($O_2$) gas. The InGaZnO film typically has characteristics of an n-type semiconductor having an electron carrier density of $1\times10^{12}/cm^3$ to $1\times10^{19}/cm^3$ inclusive. In other words, the oxide film 8a has n-type semiconductor characteristics in the first preferred embodiment. When the InGaZnO film is formed by the sputtering method, the electron carrier density of the InGaZnO film can be controlled by changing, for example, the mixture ratio of the Ar gas and the $O_2$ gas.

Figure 7:
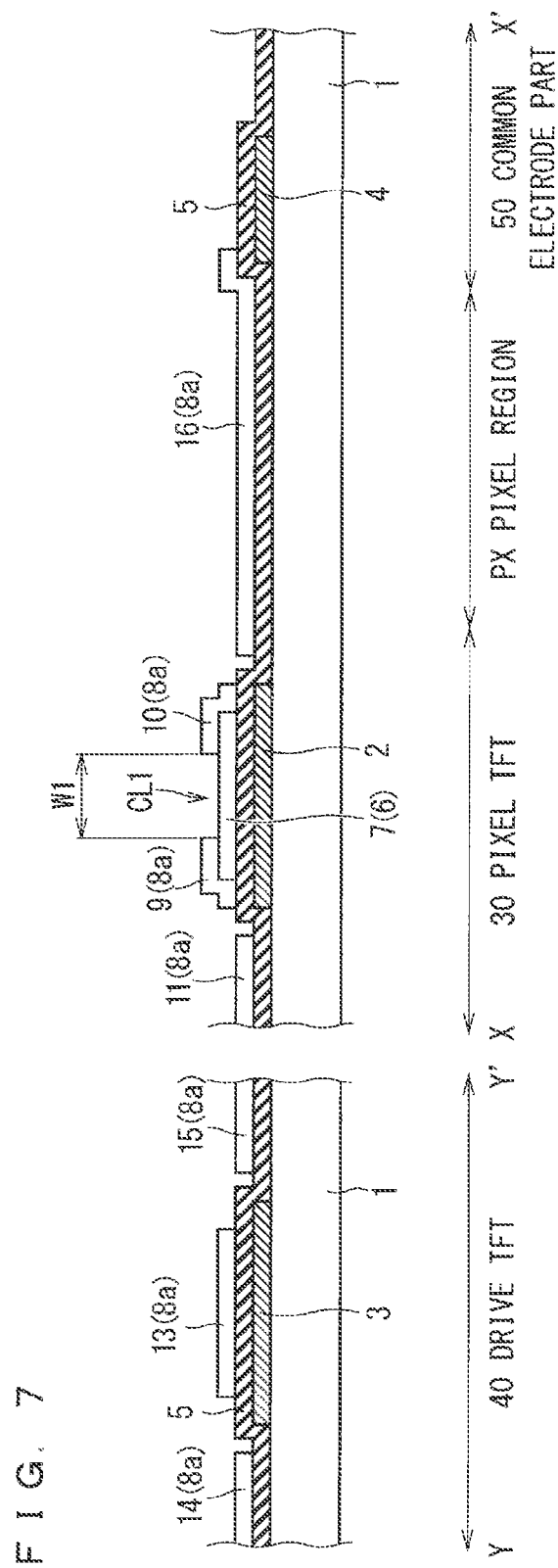

Thereafter, a photoresist pattern is formed through the third photoengraving process and used as a mask to pattern the oxide film 8a by etching. In this example, wet etching is performed by using solution including water solution containing oxalic acid (dicarboxylic acid) at the concentration of 5 weight %. Thereafter, the photoresist pattern is removed. As illustrated in FIG. 7, the source contact layer 9 and the drain contact layer 10 each overlapping part of the first semiconductor layer 7 and separated from each other through the separation part W1 are formed in the pixel TFT 30. The source contact layer 9 and the drain contact layer 10 thus formed are made of InGaZnO as the oxide film 8a having semiconductor characteristics. In the drive TFT 40, the second semiconductor layer 13 made of InGaZnO is formed in a region overlapping the second gate electrode 3 in plan view on the gate insulation layer 5. In other words, the second semiconductor layer 13 made of the oxide film 8a having a composition same as those of the source contact layer 9 and the drain contact layer 10 is formed.

The source contact layer 9 and the drain contact layer 10 are n-type semiconductor, and the source contact layer 9 functions as an ohmic contact layer disposed between the first semiconductor layer 7 and the first source electrode 17 to be described later to connect the first semiconductor layer 7 and the first source electrode 17 at favorable electric property. The drain contact layer 10 functions as an ohmic contact layer disposed between the first semiconductor layer 7 and the first drain electrode 18 to be described later to connect the first semiconductor layer 7 and the first drain electrode 18 at favorable electric property. To sufficiently achieve the functions, the source contact layer 9 and the drain contact layer 10 are preferably made of an n-type semiconductor having an electron carrier density of $1 \times 10^{12}$ cm$^3$ to $1 \times 10^{19}$/cm$^3$ inclusive. In other words, the specific resistance value is preferably 0.1 Ω·cm to $1 \times 10^6$ Ω·cm inclusive. Then, a channel region (back channel region) CL1 is formed on the first semiconductor layer 7 positioned between the source contact layer 9 and the drain contact layer 10.

The oxalic acid solution used to pattern the source contact layer 9, the drain contact layer 10, and the second semiconductor layer 13 is weakly acid liquid. The first semiconductor layer 7 made of the a-Si film 6 is not etched with the water solution at the concentration of 5 weight % used in the present preferred embodiment, but etchant for the first semiconductor 7 is not limited to it. The first semiconductor layer 7 is not etched with typical oxalic acid solution either. Accordingly, sufficient etching selectivity is achieved. Thus, when the TFT substrate 100 is produced by using the substrate 1 having a large size, selective etching can be uniformly performed on the source contact layer 9 and the drain contact layer 10 on the first semiconductor layer 7, and as a result, the favorable first channel region CL1 can be formed on the first semiconductor layer 7.

In the drive TFT 40, the second semiconductor layer 13, which is made of InGaZnO and formed in the region overlapping the second gate electrode 3 in plan view, functions as a semiconductor channel layer of the drive TFT 40. To sufficiently achieve the function, the second semiconductor layer 13 preferably has an electron carrier density of $1 \times 10^{12}$/cm$^3$ to $1 \times 10^{19}$/cm$^3$ inclusive, similarly to the source contact layer 9 and the drain contact layer 10 described above. In other words, the specific resistance value is preferably 0.1 Ω·cm to $1 \times 10^6$ Ω·cm inclusive. In the first preferred embodiment, the source contact layer 9, the drain contact layer 10, and the second semiconductor layer 13 are formed through identical processes. Thus, the second semiconductor layer 13 is made of the oxide film 8a having semiconductor characteristics same as those of the source contact layer 9 and the drain contact layer 10. In other words, the second semiconductor layer 13 is made of InGaZnO having a composition same as those of the source contact layer 9 and the drain contact layer 10.

In the first preferred embodiment, as illustrated in FIG. 7, the pattern of the pixel electrode 16 is formed in the pixel region PX by using the oxide film 8a made of InGaZnO having a composition same as those of the source contact layer 9 and the drain contact layer 10 through the third photoengraving process. In addition, the patterns of the first source electrode underneath layer wire 11 and the source underneath layer wire 217 are formed in a region overlapping the first source electrode 17 to be described later in plan view and a region overlapping the source wire 117 illustrated in FIG. 2 in plan view. In addition, the patterns of the second source electrode underneath layer wire 14 and the second drain electrode underneath layer wire 15 are formed in regions overlapping the second source electrode 19 to be described later and the second drain electrode 20 to be described later in plan view, respectively.

Figure 8:
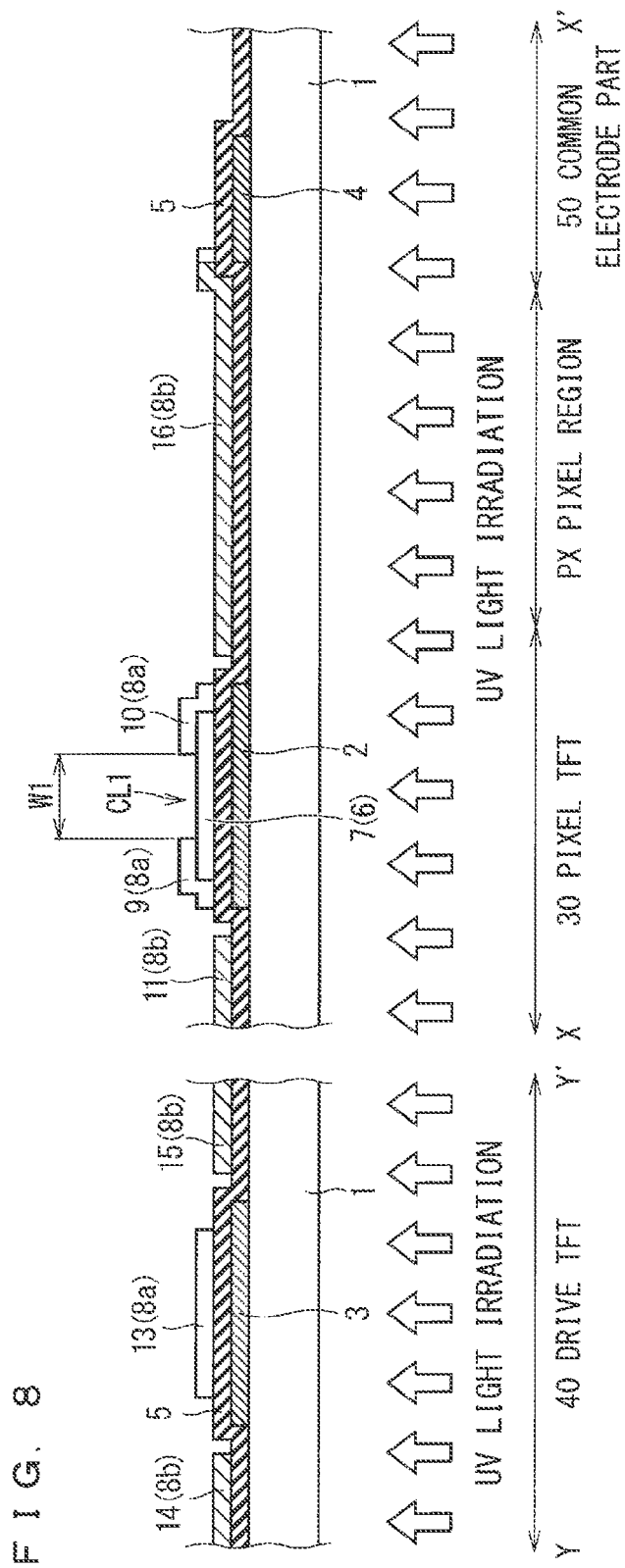

Subsequently, as illustrated in FIG. 8, the entire back surface of the substrate 1 is irradiated with ultraviolet (UV) light by using, for example, a low-pressure mercury lamp. Through this processing, the pattern regions of the oxide film 8a that are irradiated with UV light having transmitted the substrate 1, in other words, the pixel electrode 16, the first source electrode underneath layer wire 11, the second source electrode underneath layer wire 14, and the second drain electrode underneath layer wire 15 are changed from semiconductors to conductors. Accordingly, the pixel electrode 16, the source underneath layer wire 217, the first source electrode underneath layer wire 11, the second source electrode underneath layer wire 14, and the second drain electrode underneath layer wire 15, which are made of the oxide film 8b having conductive characteristics, are formed through this light irradiation process. In this case, each conductor preferably has a specific resistance value equal to or smaller than $1 \times 10^{-2}$ Ω·cm approximately. In other words, an oxide film such as the InGaZnO film according to the first preferred embodiment preferably has an electron carrier density equal to or larger than $1 \times 10^{19}$/cm$^3$.

The oxide film 8a positioned in regions overlapping the first gate electrode 2, the second gate electrode 3, and the common electrode 4 in plan view is shielded from the UV light, and thus maintains semiconductor characteristics. Specifically, the oxide film 8a of which the source contact layer 9 and the drain contact layer 10 positioned in regions overlapping the first gate electrode 2 in plan view are made maintains semiconductor characteristics. The oxide film 8a of which the second semiconductor layer 13 positioned in a region overlapping the second gate electrode 3 in plan view is made maintains semiconductor characteristics.

The UV light preferably has an intensity peak in a wavelength region equal to or shorter than 450 nm to efficiently change the oxide film 8a into a conductor. In the first preferred embodiment, the irradiation is performed by using a low-pressure mercury lamp, but a UV light source is not limited thereto. For example, ultraviolet laser light is applicable.

Subsequently, the second conductive film, of which a source electrode, a drain electrode, and the like are to be made, is deposited. In the first preferred embodiment, a Cu film having a thickness of 200 nm is formed by the sputtering method using Ar gas.

Figure 9:
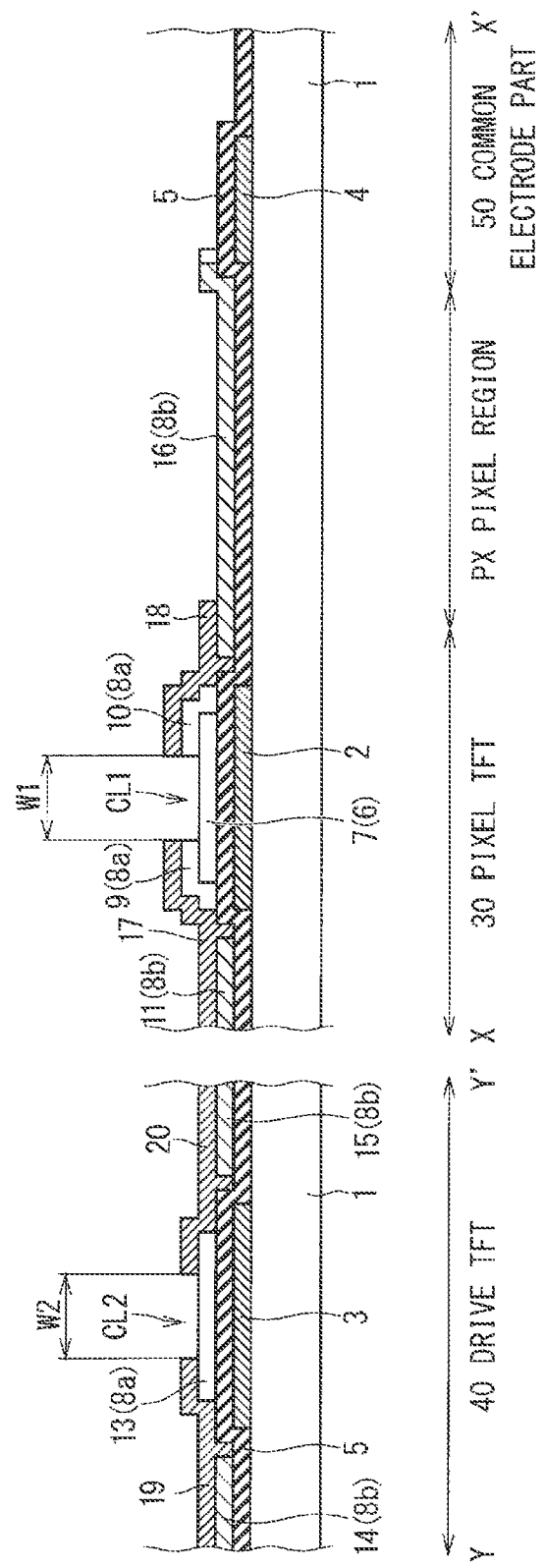

Thereafter, a photoresist pattern is formed through the fourth photoengraving process and used as a mask to pattern the second conductive film by etching. In this example, similarly to the first conductive film, wet etching is performed by using ammonium peroxodisulfate solution. Thereafter, the photoresist pattern is removed to form the first source electrode 17, the first drain electrode 18, the second source electrode 19, and the second drain electrode 20 as illustrated in FIG. 9.

The first source electrode 17 overlaps the source contact layer 9 in plan view and extends over to the first source electrode underneath layer wire 11. The first source electrode 17 is electrically connected with the first semiconductor layer 7 through the source contact layer 9. The first drain electrode 18 overlaps the drain contact layer 10 in plan view and extends over to a region partially overlapping the pixel electrode 16. The first drain electrode 18 is electrically connected with the first semiconductor layer 7 through the drain contact layer 10. In addition, the pixel electrode 16 is electrically connected with the first semiconductor layer 7 through the first drain electrode 18. In the separation part W between the first source electrode 17 and the first drain electrode 18, a region in which the surface of the first semiconductor layer 7 made of the a-Si film 6 therebelow is exposed is formed and functions as the first channel region CL1 of the pixel TFT 30.

The second source electrode 19 overlaps part of the second semiconductor layer 13 in plan view, and extends over to the second source electrode underneath layer wire 14. The second drain electrode 20 overlaps part of the second semiconductor layer 13 in plan view, and extends over to the second drain electrode underneath layer wire 15. In a region overlapping the second gate electrode 3 in plan view, a separation region including the separation part W2 in which the surface of the second semiconductor layer 13 is exposed is formed between the second source electrode 19 and the second drain electrode 20 and functions as a second channel region CL2 of the drive TFT 40.

Subsequently, the second insulating film, of which the protective insulation layer 21 is to be made, is formed on the entire upper main surface of the substrate 1 including the first source electrode 17, the first drain electrode 18, the second source electrode 19, the second drain electrode 20, and the pixel electrode 16. In the first preferred embodiment, the protective insulation layer 21 is formed by stacking and depositing a SiO film having a thickness of 100 nm and a SiN film having a thickness of 200 nm in the stated order by the CVD method.

Thereafter, a photoresist pattern is formed through the fifth photoengraving process and used as a mask to sequentially pattern the SiO and SiN films of the protective insulation layer 21 and the SiN film of the gate insulation layer 5 by etching. In this example, dry etching is performed by using gas containing oxygen ($O_2$) in addition to sulfur hexafluoride ($SF_6$).

Figure 10:
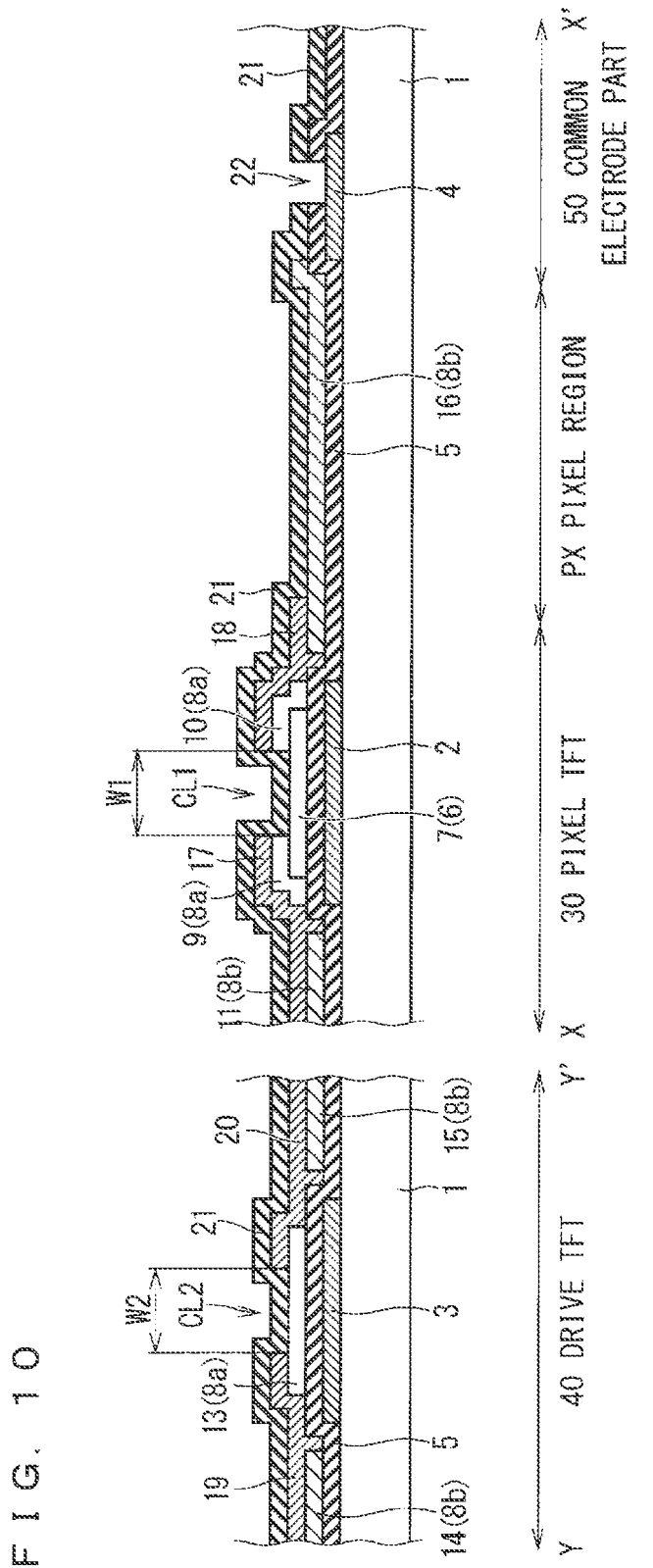
FIGS. 10 and 11 are cross-sectional views each illustrating the process of manufacturing the TFT substrate according to the first preferred embodiment.

Thereafter, the photoresist pattern is removed to form, in the protective insulation layer 21 and the gate insulation layer 5, the common electrode part contact hole 22 through which the surface of the common electrode 4 is partially exposed as illustrated in FIG. 10. The common electrode part contact hole 22 is disposed in a region overlapping the common electrode 4, but not the pixel electrode 16, in plan view.

Subsequently, the third conductive film, of which the counter electrode 25 is to be made, is formed on the protective insulation layer 21 including the common electrode part contact hole. In the first preferred embodiment, an ITO film that is an optically transparent oxide conductive film is used as the third conductive film. ITO is mixed oxide of indium oxide $In_2O_3$ and tin oxide $SnO_2$, and has a mixture ratio of, for example, $In_2O_3$:$SnO_2$=90:10 (weight %). An ITO film typically has a stable crystalline (polycrystalline) structure at room temperature, but in this example, an ITO film having a thickness of 100 nm is deposited in the amorphous state by the sputtering method using gas obtained by mixing Ar with gas containing hydrogen (H), such as hydrogen ($H_2$) gas or steam ($H_2O$).

Thereafter, a photoresist pattern is formed through the sixth photoengraving process and used as a mask to pattern the amorphous ITO film as the third conductive film by etching. In this example, wet etching is performed by using solution containing oxalic acid. Thereafter, the photoresist pattern is removed to form the translucent counter electrode 25 as illustrated in FIG. 4. The counter electrode 25 overlaps the pixel electrode 16 in the pixel region PX on the protective insulation layer 21 in plan view. The counter electrode 25 is connected with the common electrode 4 through the common electrode part contact hole 22.

The counter electrode 25 includes a slit opening SL. With this structure, electric field substantially parallel to the substrate surface is generated above the counter electrode 25 when signal voltage is applied between the pixel electrode 16 and the counter electrode 25. An opening in a comb-teeth shape may be provided in place of the slit opening SL.

As described above, according to the first preferred embodiment, the FFS TFT substrate 100, on which the pixel TFT 30 including a channel layer achieved by the first semiconductor layer 7 made of the a-Si film 6, and the drive TFT 40 including a channel layer achieved by the second semiconductor layer 13 made of the oxide film 8a, are both formed on the single substrate 1, can be produced through the six photoengraving processes.

To assemble a liquid crystal display panel, first, an alignment film and a spacer are formed on the surface of the TFT substrate 100 illustrated in FIGS. 2 and 3. The alignment film is a film for arraying liquid crystals and contains, for example, polyimide. Subsequently, a counter substrate (not illustrated) separately produced and including a color filter and an alignment film is laminated opposite to the TFT substrate 100. In this state, the spacer forms a gap between the TFT substrate and the counter substrate, and liquid crystals are sealed in the gap, thereby producing an in-plane field liquid crystal drive FFS liquid crystal display panel. Lastly, a polarization plate, a wave plate, a backlight unit, and the like are disposed outside of the liquid crystal display panel, which completes an FFS LCD.

(Effects)

On the TFT substrate 100 according to the first preferred embodiment, a pixel-display TFT provided in the display region 150 is achieved by the pixel TFT 30 (first TFT) including a semiconductor layer of the a-Si film 6 with reduced optical degradation. On the TFT substrate 100, a built-in drive circuit for driving the pixel TFT 30 is provided in the frame region 160 positioned around the display region 150, and a TFT provided to the drive circuit is achieved by the drive TFT 40 (second TFT) including a semiconductor layer of the oxide film 8a having a mobility higher than that of the a-Si film 6. Among the two electrodes of the pixel electrode 16 and the counter electrode 25 for in-plane field liquid crystal drive in the FFS scheme, the pixel electrode 16 is achieved by the oxide film 8b changed into a conductor. With this configuration, a narrow-frame LCD having high display quality and high reliability can be manufactured at low cost.

On the TFT substrate 100 according to the first preferred embodiment, the gate electrodes, the gate insulation layers, the source electrodes, and the drain electrodes of the pixel TFT 30 and the drive TFT 40 are made of identical material, which leads to a simplified manufacturing process and cost reduction.

In addition, the source contact layer 9 and the drain contact layer 10, which are used to obtain the excellent electrical connection (ohmic contact) of the first semiconductor layer 7 made of the a-Si film 6 with the first source electrode 17 and the first drain electrode 18 in the pixel TFT 30, are made of the oxide film 8a of the second semiconductor layer 13 at the drive TFT 40. Accordingly, the source contact layer 9 and the drain contact layer 10 are excellently selectively etched with the first semiconductor layer 7 made of the a-Si film 6 as compared to the source contact layer 9 and the drain contact layer 10 made of a conventional n-type low-resistance Si semiconductor film. Thus, when the substrate 1 having a large size is used, the source contact layer 9 and the drain contact layer 10 on the first semiconductor layer 7 made of the a-Si film 6 can be uniformly etched, and any process damage on the surface (first channel region CL1) of the first semiconductor layer 7 made of the a-Si film 6 can be reduced. Accordingly, the pixel TFT 30 having excellent characteristics and reliability can be obtained.

With the above-described configuration, an LCD having excellent display quality and reliability with no display ununiformity can be manufactured.

In the first preferred embodiment, the second insulating film is a stacked film of a SiO film and a SiN film, but may be a single-layer film of a SiN film, a SiO film, or a SiON film, or a stacked film of two or more layers including a SiN film and a SiO film. In the present preferred embodiment, the first insulating film is a single-layer film of a SiN film, but may be a single-layer film of a SiO film or a SiON film, or a stacked film of two or more layers including a SiN film and a SiO film.

Figure 11:
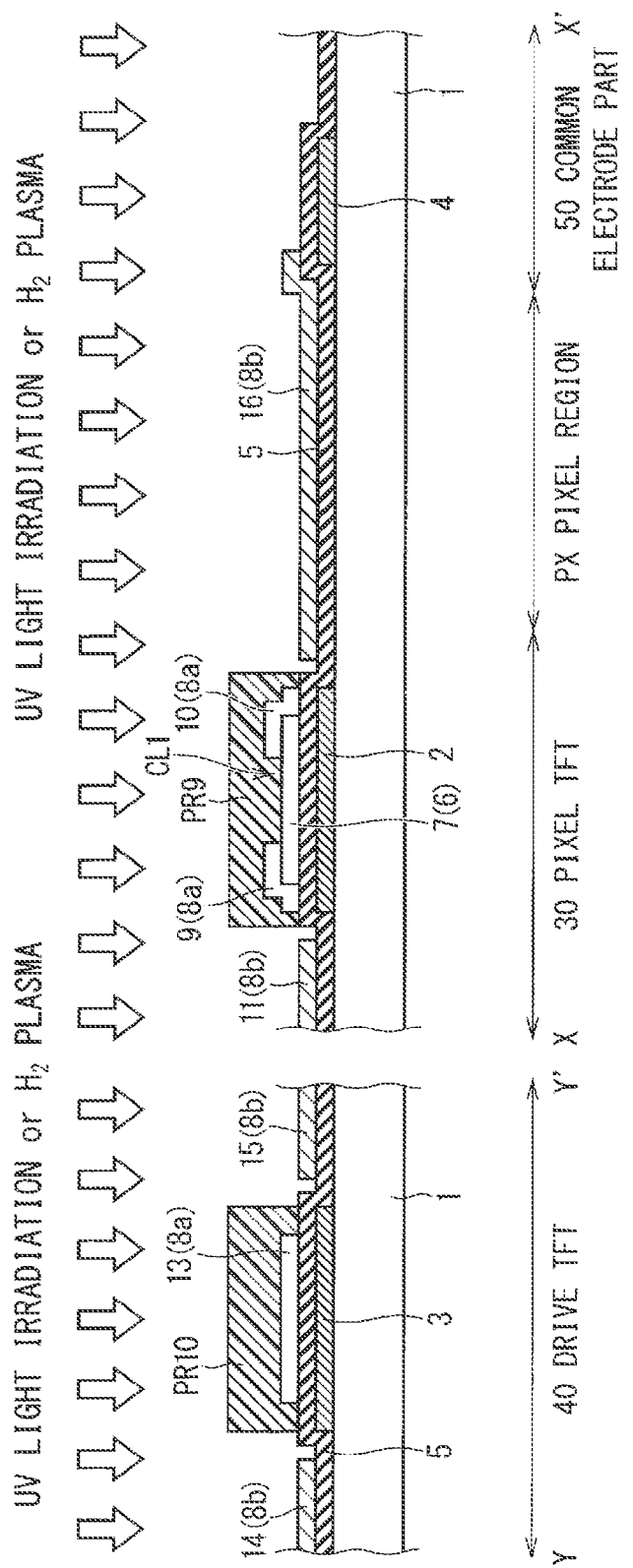

In the manufacturing process according to the first preferred embodiment, the pixel electrode 16, the source underneath layer wire 217, the first source electrode underneath layer wire 11, the second source electrode underneath layer wire 14, and the second drain electrode underneath layer wire 15, which are made of the oxide film 8b, are changed into conductors by irradiating the back surface of the substrate 1 with UV light as illustrated in FIG. 8, but a method of UV light irradiation is not limited thereto. For example, photoresist patterns PR9 and PR10 made of photoresist material may be formed as illustrated in FIG. 11 and used as a mask when the surface of the substrate is irradiated with UV light.

In this case, a new photoengraving process is needed to form the photoresist patterns PR9 and PR10, but direct irradiation of the oxide film 8a with UV light allows more efficient change of the oxide film 8a having semiconductor characteristics into the oxide film 8b having conductive characteristics. In this case, irradiation with UV light or ultraviolet laser light may be replaced with, for example, direct irradiation with $H_2$ plasma or $NH_3$ plasma using reductive hydrogen ($H_2$) gas or ammonia ($NH_3$) gas containing hydrogen.

As described above, the TFT substrate 100 according to the first preferred embodiment includes: the first gate electrode 2 made of the first conductive film and disposed in the predetermined display region 150 (first region) on the substrate 1; the second gate electrode 3 made of the first conductive film having a composition same as that of the first gate electrode 2 and disposed in the predetermined frame region 160 (second region) on the substrate 1; the gate insulation layer 5 disposed on the substrate 1 to cover the first gate electrode 2 and the second gate electrode 3; the first semiconductor layer 7 made of amorphous silicon, disposed on the gate insulation layer 5, and overlapping the first gate electrode 2 in plan view; the source contact layer 9 (first contact layer) made of the oxide film 8a (oxide) having semiconductor characteristics, part of the source contact layer 9 being disposed in contact with the surface of the first semiconductor layer 7; the drain contact layer 10 (second contact layer) made of the oxide film 8a having semiconductor characteristics and a composition same as that of the source contact layer 9, disposed separately from the source contact layer 9, part of the drain contact layer 10 being disposed in contact with the surface of the first semiconductor layer 7; the first source electrode 17 (first electrode) made of the second conductive film and connected with the source contact layer 9; the first drain electrode 18 (second electrode) made of the second conductive film having a composition same as that of the first source electrode 17 and connected with the drain contact layer 10; the second semiconductor layer 13 made of the oxide film 8a having semiconductor characteristics and a composition same as those of the source contact layer 9 and the drain contact layer 10 and disposed on the gate insulation layer 5, and overlapping the second gate electrode 3 in plan view; the second source electrode 19 (third electrode) made of the second conductive film having a composition same as those of the first source electrode 17 and the first drain electrode 18, part of the second source electrode 19 being disposed in contact with the surface of the second semiconductor layer 13; the second drain electrode 20 (fourth electrode) made of the second conductive film having a composition same as those of the first source electrode 17 and the first drain electrode 18, disposed separately from the second source electrode 19 (third electrode), part of the second drain electrode 20 being disposed in contact with the surface of the second semiconductor layer 13; and the pixel electrode 16 made of the oxide film 8b having conductive characteristics and a composition same as that of the oxide film 8a of which the source contact layer 9 is made, the pixel electrode 16 being disposed on the gate insulation layer 5 positioned in the predetermined display region 150 and outside of a region in which the first gate electrode 2 is formed, the pixel electrode 16 being connected with the first drain electrode 18.

With this configuration, the pixel TFT 30 including a channel layer made of amorphous silicon, and the drive TFT 40 including a channel layer made of oxide semiconductor can be formed on an identical substrate at low cost. In addition, the configuration facilitates selective removal of an ohmic contact layer made of the oxide film 8a in a BCE process for a-Si channel layer formation, thereby achieving formation of a semiconductor channel part made of the a-Si film 6 with the uniformity of the shape and characteristics. Thus, the uniformity of characteristics of the pixel TFT 30 can be improved.

The TFT substrate 100 according to the first preferred embodiment further includes: the protective insulation layer 21 disposed to cover the pixel electrode 16; and the counter electrode 25 made of the third conductive film, disposed on the protective insulation layer 21, and overlapping the pixel electrode 16 in plan view.

With this configuration, the thin film transistor substrate 100 that achieves a simplified manufacturing process and cost reduction in usage for an FSS LCD can be obtained.

The TFT substrate 100 according to the first preferred embodiment further includes: the pixel TFT 30 (first TFT) including the first gate electrode 2, the gate insulation layer 5, the first semiconductor layer 7, the source contact layer 9, the drain contact layer 10, the first source electrode 17, and the first drain electrode 18 and disposed in the predetermined display region 150; and the drive TFT 40 (second TFT) including the second gate electrode 3, the gate insulation layer 5, the second semiconductor layer 13, the second source electrode 19, and the second drain electrode 20 and disposed in the predetermined frame region 160. The predetermined display region 150 is a region in which a plurality of pixels are arrayed in a matrix on the substrate 1, and the pixel TFT 30 is a pixel-display TFT provided to each pixel in the display region 150. The predetermined frame region 160 is a region outside of the display region 150, and the drive TFT 40 is a drive-circuit TFT for driving the pixel TFT 30.

With this configuration, the thin film transistor substrate 100 can be obtained by forming the pixel TFT 30 including a channel layer made of amorphous silicon and the drive TFT 40 including a channel layer made of oxide semiconductor on an identical substrate at low cost.

A liquid crystal display device according to the first preferred embodiment includes the thin film transistor substrate 100, a counter substrate disposed opposite to the thin film transistor substrate 100, and a liquid crystal sealed in a gap between the thin film transistor substrate 100 and the counter substrate.

With this configuration, the thin film transistor substrate 100 for a liquid crystal display device, which includes the pixel TFT 30 including a channel layer made of amorphous silicon and the drive TFT 40 including a channel layer made of oxide semiconductor, can be achieved and used to provide a small liquid crystal display device having high display quality at low cost.

The method of manufacturing the TFT substrate 100 according to the first preferred embodiment includes: a process of forming the first gate electrode 2 made of the first conductive film and disposed in the predetermined display region 150 (first region) on the substrate 1; a process of forming the second gate electrode 3 made of the first conductive film having a composition same as that of the first gate electrode 2 and disposed in the predetermined frame region 160 (second region) on the substrate 1; a process of forming the gate insulation layer 5 disposed on the substrate 1 to cover the first gate electrode 2 and the second gate electrode 3; a process of forming the first semiconductor layer 7 made of amorphous silicon, disposed on the gate insulation layer 5, and overlapping the first gate electrode 2 in plan view; a process of forming the source contact layer 9 (first contact layer) made of the oxide film 8a having semiconductor characteristics, part of the source contact layer 9 being disposed in contact with the surface of the first semiconductor layer 7; a process of forming the drain contact layer 10 (second contact layer) made of the oxide film 8a having semiconductor characteristics and a composition same as that of the source contact layer 9, disposed separately from the source contact layer 9, part of the drain contact layer 10 being disposed in contact with the surface of the first semiconductor layer 7; a process of forming the first source electrode 17 (first electrode) made of the second conductive film and connected with the source contact layer 9; a process of forming the first drain electrode 18 (second electrode) made of the second conductive film having a composition same as that of the first source electrode 17 and connected with the drain contact layer 10; a process of forming the second semiconductor layer 13 made of the oxide film 8a having semiconductor characteristics and a composition same as those of the source contact layer 9 and the drain contact layer 10, disposed on the gate insulation layer 5, and overlapping the second gate electrode 3 in plan view; a process of forming the second source electrode 19 (third electrode) made of the second conductive film having a composition same as those of the first source electrode 17 and the first drain electrode 18, part of the second source electrode 19 being disposed in contact with the surface of the second semiconductor layer 13; a process of forming the second drain electrode 20 (fourth electrode) made of the second conductive film having a composition same as those of the first source electrode 17 and the first drain electrode 18, disposed separately from the second source electrode 19, part of the second drain electrode 20 being disposed in contact with the surface of the second semiconductor layer 13; and a process of forming the pixel electrode 16 made of the oxide film 8b having conductive characteristics and a composition same as that of the oxide film 8a of which the source contact layer 9 is made having semiconductor characteristics, the pixel electrode 16 being disposed on the gate insulation layer 5 positioned in the predetermined display region 150 and outside of a region in which the first gate electrode 2 is formed, the pixel electrode 16 being connected with the first drain electrode 18.

With this configuration, the pixel TFT 30 including a channel layer made of amorphous silicon, and the drive TFT 40 including a channel layer made of oxide semiconductor can be formed on an identical substrate at low cost.

The semiconductor channel layer of a drive TFT disposed in the peripheral region of a pixel display region is made of an oxide semiconductor film same as that of the ohmic contact layer of a pixel TFT. Thus, according to the method of manufacturing a TFT substrate according to the present preferred embodiment, a high-performance drive TFT having high mobility for a drive circuit can be efficiently formed on an identical substrate together with a pixel TFT.

For example, the TFT substrate described in the present preferred embodiment can be used to achieve a thin film transistor substrate for a liquid crystal display device, which includes a pixel TFT including a channel layer made of amorphous silicon, and a drive TFT including a channel layer made of oxide semiconductor. The thin film transistor substrate can be used to provide a small liquid crystal display device having high display quality at low cost.

In the method of manufacturing the TFT substrate 100 according to the first preferred embodiment, the process of forming the first semiconductor layer 7 includes, after the process of forming the gate insulation layer 5, a process of forming the amorphous silicon film 6 made of amorphous silicon on the substrate 1, and a process of patterning the amorphous silicon film 6 to form the first semiconductor layer 7. The process of forming the source contact layer 9, the process of forming the drain contact layer 10, the process of forming the second semiconductor layer 13, and the process of forming the pixel electrode 16 each include, after the process of forming the first semiconductor layer 7, a process of forming the oxide film 8a made of oxide having semiconductor characteristics on the substrate 1, and a process of patterning the oxide film 8a all at once to form the source contact layer 9, the drain contact layer 10, the second semiconductor layer 13, and the pixel electrode 16. The process of forming the first source electrode 17, the process of forming the first drain electrode 18, the process of forming the second source electrode 19, and the process of forming the second drain electrode 20 each include, after the process of patterning the oxide film 8a all at once, a process of forming the second conductive film on the substrate 1, and a process of patterning the second conductive film all at once to form the first source electrode 17, the first drain electrode 18, the second source electrode 19, and the second drain electrode 20.

With this configuration, the configuration facilitates selective removal of an ohmic contact layer made of the oxide film 8a in a BCE process for a-Si channel layer formation, thereby achieving formation of a semiconductor channel part made of the a-Si film 6 with the uniformity of the shape and characteristics. Thus, the uniformity of characteristics of the pixel TFT 30 can be improved.

In the method of manufacturing the TFT substrate 100 according to the first preferred embodiment, the process of forming the first gate electrode 2 and the process of forming the second gate electrode 3 include a process of forming the first conductive film having light-shielding characteristics on the surface of the substrate 1, and a process of patterning the first conductive film all at once to form the first gate electrode 2 and the second gate electrode 3. The process of forming the pixel electrode 16 further includes, after the process of patterning the oxide film 8a all at once, a process of irradiating the back surface of the substrate 1 with light including ultraviolet.

With this configuration, the pixel electrode 16, the first source electrode underneath layer wire 11, the second source electrode underneath layer wire 14, and the second drain electrode underneath layer wire 15, which are made of the oxide film 8b having conductive characteristics, can be formed in regions irradiated with UV light having transmitted the substrate 1. In addition, the source contact layer 9, the drain contact layer 10, and the second semiconductor layer 13, which are made of the oxide film 8a having semiconductor characteristics, can be formed in regions shielded from UV light. Accordingly, the manufacturing process is simplified.

The method of manufacturing the TFT substrate 100 according to the first preferred embodiment further includes: a process of forming the protective insulation layer 21 disposed to cover the pixel electrode 16; and a process of forming the counter electrode 25 made of the third conductive film, disposed on the protective insulation layer 21, and overlapping the pixel electrode 16 in plan view.

With this configuration, a thin film transistor substrate that achieves a simplified manufacturing process and cost reduction in usage for an FSS LCD can be obtained.

The method of manufacturing the TFT substrate 100 according to the first preferred embodiment further includes: a process of forming the pixel TFT 30 (first TFT) in the predetermined display region 150 on the substrate 1 and including the process of forming the first gate electrode 2, the process of forming the gate insulation layer 5, the process of forming the first semiconductor layer 7, the process of forming the source contact layer 9, the process of forming the drain contact layer 10, the process of forming the first source electrode 17, and the process of forming the first drain electrode 18; and a process of forming the drive TFT 40 (second TFT) in the predetermined frame region 160 on the substrate 1 and including the process of forming the second gate electrode 3, the process of forming the gate insulation layer 5, the process of forming the second semiconductor layer 13, the process of forming the second source electrode 19, and the process of forming the second drain electrode 20. The predetermined display region 150 is a region in which a plurality of pixels are arrayed in a matrix on the substrate 1, and the pixel TFT 30 is a pixel-display TFT provided to each pixel in the display region 150. The predetermined frame region 160 is a region outside of the display region 150, and the drive TFT 40 is a drive-circuit TFT for driving the pixel TFT 30.

With this configuration, the thin film transistor substrate 100 can be obtained by forming the pixel TFT 30 including a channel layer made of amorphous silicon and the drive TFT 40 including a channel layer made of oxide semiconductor on an identical substrate at low cost.

First Modification of First Preferred Embodiment

A TFT substrate according to a first modification of the first preferred embodiment has a configuration same as that of the TFT substrate described above in the first preferred embodiment except for the configuration of the drive TFT. The configuration of the TFT substrate according to the first modification will be described below in detail with reference to the accompanying drawings. Description of any component same as that in the above-described first preferred embodiment will be omitted.

Figure 12:
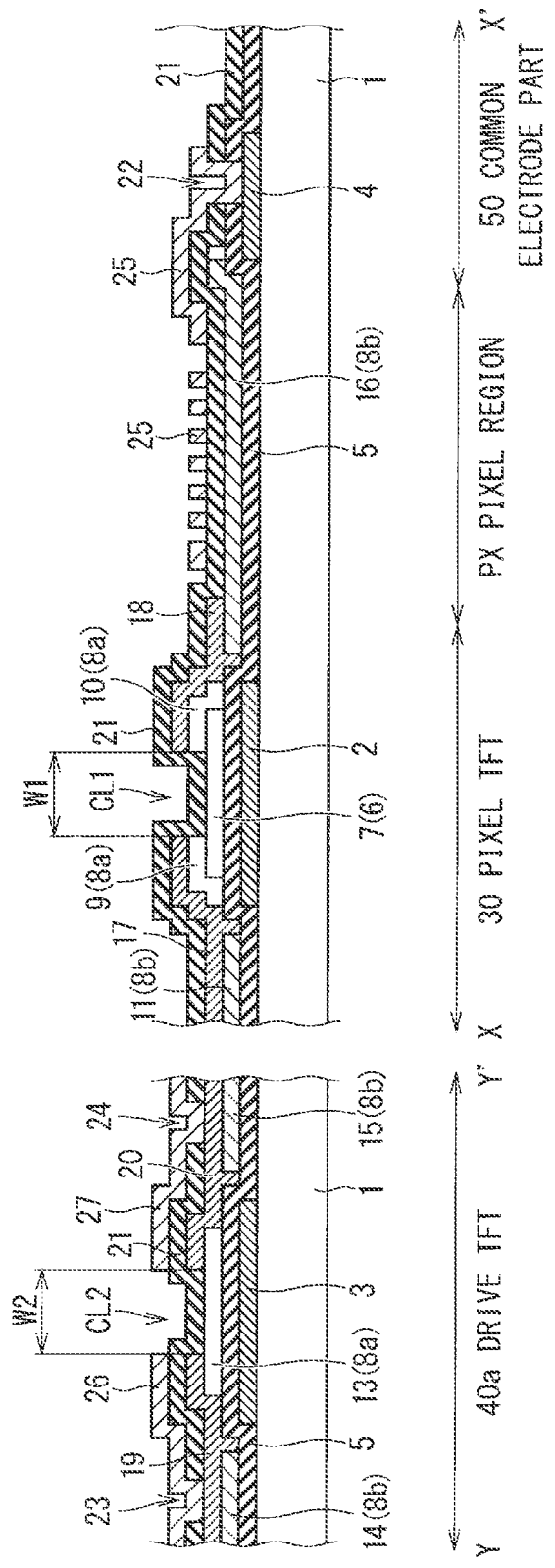
FIG. 12 is a cross-sectional view illustrating part of the configuration of a TFT substrate according to a first modification of the first preferred embodiment.

FIG. 12 is a cross-sectional view of the pixel TFT 30 and a drive TFT 40a disposed on the TFT substrate according to the first modification of the first preferred embodiment. As illustrated in FIG. 12, a first contact hole 23 as a contact hole of a source electrode part is formed through the protective insulation layer 21 positioned in a region overlapping the second source electrode 19 in plan view at the drive TFT 40a, and a second contact hole 24 as a contact hole of a drain electrode part is formed through the protective insulation layer 21 positioned in a region overlapping the second drain electrode 20. Part of the surface of the second source electrode 19 is exposed through the first contact hole 23. Part of the surface of the second drain electrode 20 is exposed through the second contact hole 24. These contact holes are formed through the fifth photoengraving process in the above-described first preferred embodiment.

A third source electrode 26 connected with the second source electrode 19 through the first contact hole 23 and a third drain electrode 27 connected with the second drain electrode 20 through the second contact hole 24 are disposed on the protective insulation layer 21. The third source electrode 26 and the third drain electrode 27 are formed by patterning the third conductive film through the sixth photoengraving process in the above-described first preferred embodiment.

As described above, in the first modification of the first preferred embodiment, the source and drain electrodes included in the drive TFT 40a are each made of at least two layers including the second conductive film and the third conductive film. Thus, when one of the layers is broken due to, for example, pattern defect, the breaking can be compensated by the other layer, thereby preventing occurrence of breaking defect. Accordingly, when the drive TFTs 41 and 42 illustrated in FIG. 1B have configurations same as that of the drive TFT 40a, and the drive voltage generation circuit SC including the drive TFTs is disposed in the peripheral region of the TFT substrate 100, the occurrence of circuit operation defect due to breaking between the drive TFTs can be significantly reduced.

As described above, the protective insulation layer 21 included in the TFT substrate according to the first modification is disposed to further cover the second source electrode 19 (third electrode) and the second drain electrode 20 (fourth electrode), and includes the first contact hole 23 (first opening) through which part of the surface of the second source electrode is exposed, and the second contact hole 24 (second opening) through which part of the surface of the second drain electrode 20 is exposed. The thin film transistor substrate further includes: the third source electrode 26 (fifth electrode) made of the third conductive film having a composition same as that of the counter electrode 25, disposed on the protective insulation layer 21, and connected with the second source electrode 19 through the first contact hole 23; and the third drain electrode 27 (sixth electrode) made of the third conductive film having a composition same as that of the counter electrode 25, disposed on the protective insulation layer 21, and connected with the second drain electrode 20 through the second contact hole 24.

With the above-described configuration, the occurrence of circuit operation defect due to breaking of electrodes and wires can be significantly reduced.

Second Modification of First Preferred Embodiment

In the above-described first preferred embodiment and the first modification thereof, the first source electrode underneath layer wire 11 and the source underneath layer wire 217, which are made of the oxide film 8b having conductive characteristics, are formed underneath the regions overlapping the first source electrode 17 and the source wire 117 in plan view, respectively, but this configuration may be omitted as appropriate. Similarly, the second source electrode underneath layer wire 14 and the second drain electrode underneath layer wire 15, which are made of the oxide film 8b having conductive characteristics, are formed underneath the regions overlapping the second source electrode 19 and the second drain electrode 20 in plan view, respectively, but this configuration may be omitted as appropriate.

Third Modification of First Preferred Embodiment

In the above-described first preferred embodiment and the first modification thereof, the source contact layer 9 is disposed separately from the first source electrode underneath layer wire 11 or the source underneath layer wire 217. The drain contact layer 10 is disposed separately from the pixel electrode 16. The second semiconductor layer 13 of the drive TFT 40 is disposed separately from the second source electrode underneath layer wire 14 or the second drain electrode underneath layer wire 15.

Figure 13:
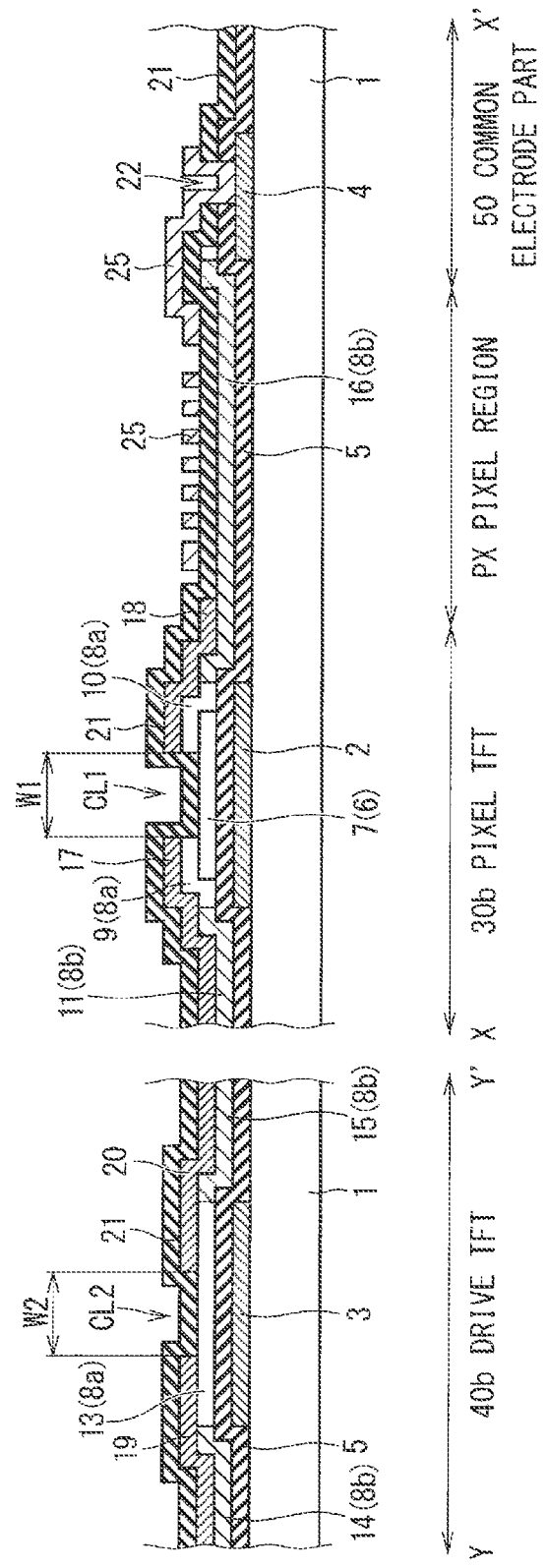
FIG. 13 is a cross-sectional view illustrating part of the configuration of a TFT substrate according to a third modification of the first preferred embodiment.

FIG. 13 is a cross-sectional view of a pixel TFT 30b and a drive TFT 40b disposed on a TFT substrate according to a third modification of the first preferred embodiment. In the third modification, in the pixel TFT 30b, the source contact layer 9 made of the oxide film 8a and the first source electrode underneath layer wire 11 made of the oxide film 8b are formed in a continuously integrated pattern. The drain contact layer 10 made of the oxide film 8a and the pixel electrode 16 made of the oxide film 8b are formed in a continuously integrated pattern. In addition, at the drive TFT 40b, the second semiconductor layer 13 made of the oxide film 8a and the second source electrode underneath layer wire 14 and the second drain electrode underneath layer wire 15 made of the oxide film 8b are formed in a continuously integrated pattern. On the TFT substrate having such a configuration, any necessary region of each oxide film can be selectively changed into a conductor by the manufacturing method according to the first preferred embodiment as illustrated in FIG. 8.

As described above, the pixel electrode 16 of the TFT substrate according to the third modification has a pattern extended from and continuously integrated with the drain contact layer 10 made of the oxide film 8a having semiconductor characteristics.

In the method of manufacturing the TFT substrate according to the third modification, the oxide film 8a is patterned so that the pixel electrode 16 is extended from and continuously integrated with the drain contact layer 10 through the process of patterning the oxide film 8a all at once or the process of patterning the oxide film 8a and the second conductive film all at once to form the source contact layer 9, the drain contact layer 10, the second semiconductor layer 13, and the pixel electrode 16.

With this configuration, any necessary region of the oxide film 8a can be selectively changed into a conductor.

Fourth Modification of First Preferred Embodiment

Although the TFT substrate according to the first preferred embodiment can be produced through the six photoengraving processes, the TFT substrate according to the third modification can be produced through a fewer number of processes, namely, five photoengraving processes.

(Configurations of Pixel TFT and Drive TFT)

The configurations of a pixel TFT and a drive TFT disposed on a TFT substrate according to a fourth modification of the first preferred embodiment will be described below in detail with reference to the accompanying drawings.

Figure 14:
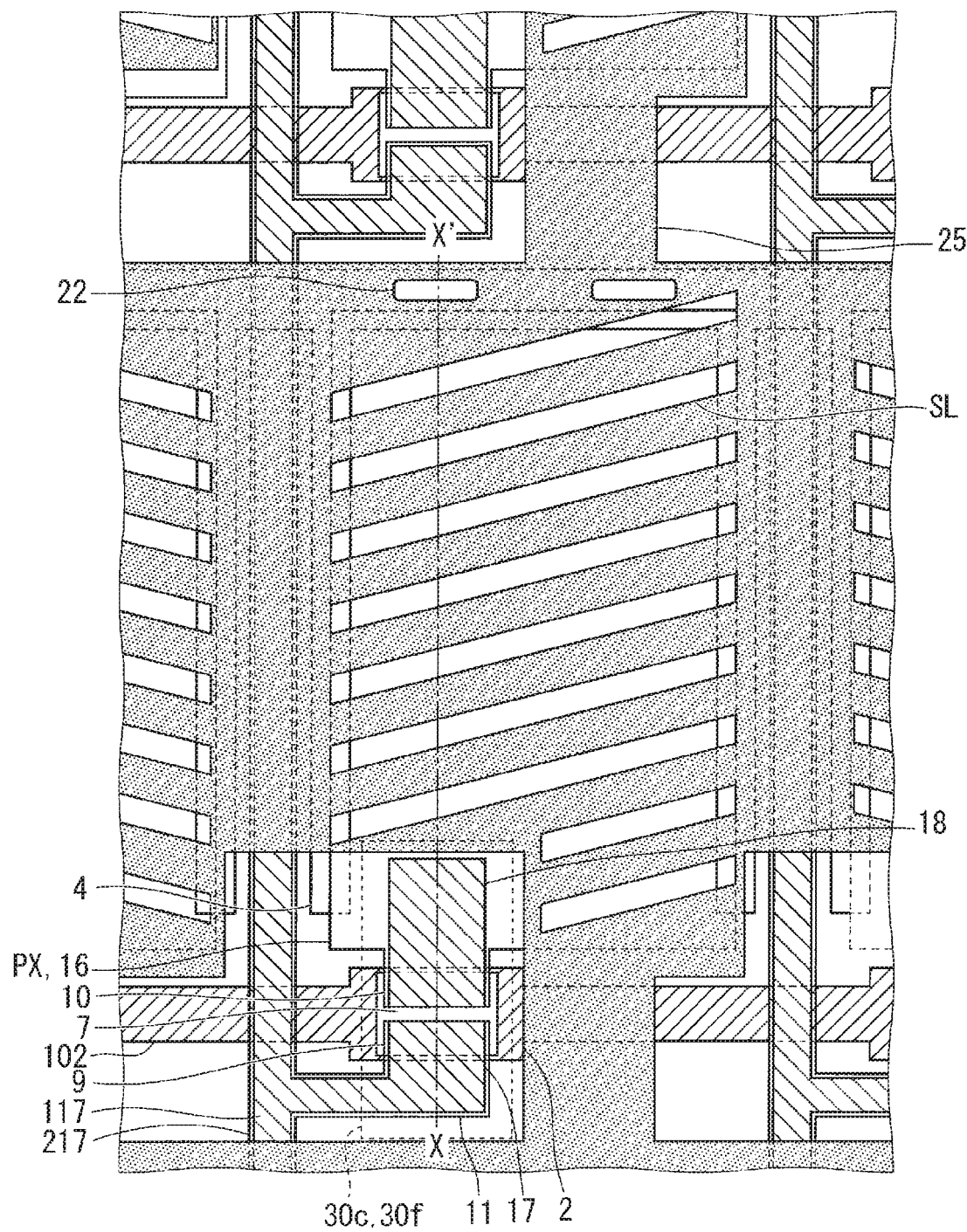
FIG. 14 is a plan view illustrating the structure of a pixel TFT and a pixel region according to a fourth modification of the first preferred embodiment or a third modification of the second preferred embodiment.
Figure 15:
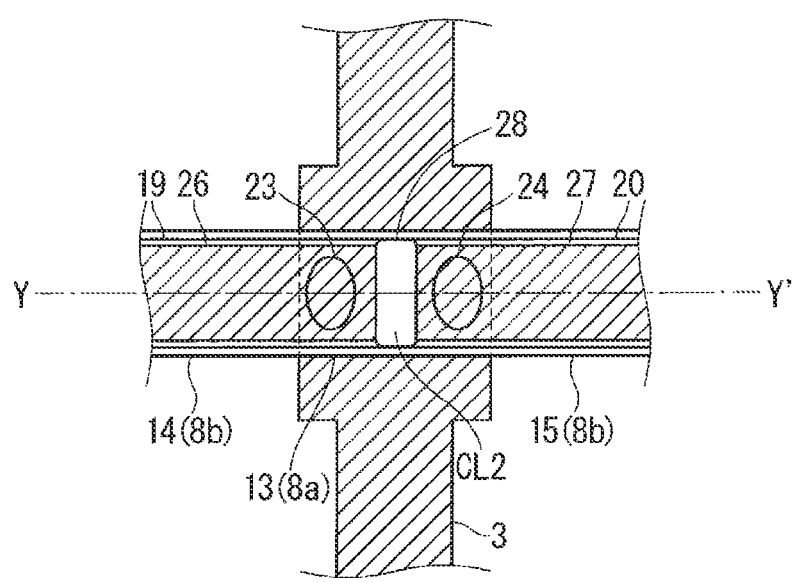
FIG. 15 is a plan view illustrating the structure of a drive TFT according to the fourth modification of the first preferred embodiment or the third modification of the second preferred embodiment.
Figure 16:
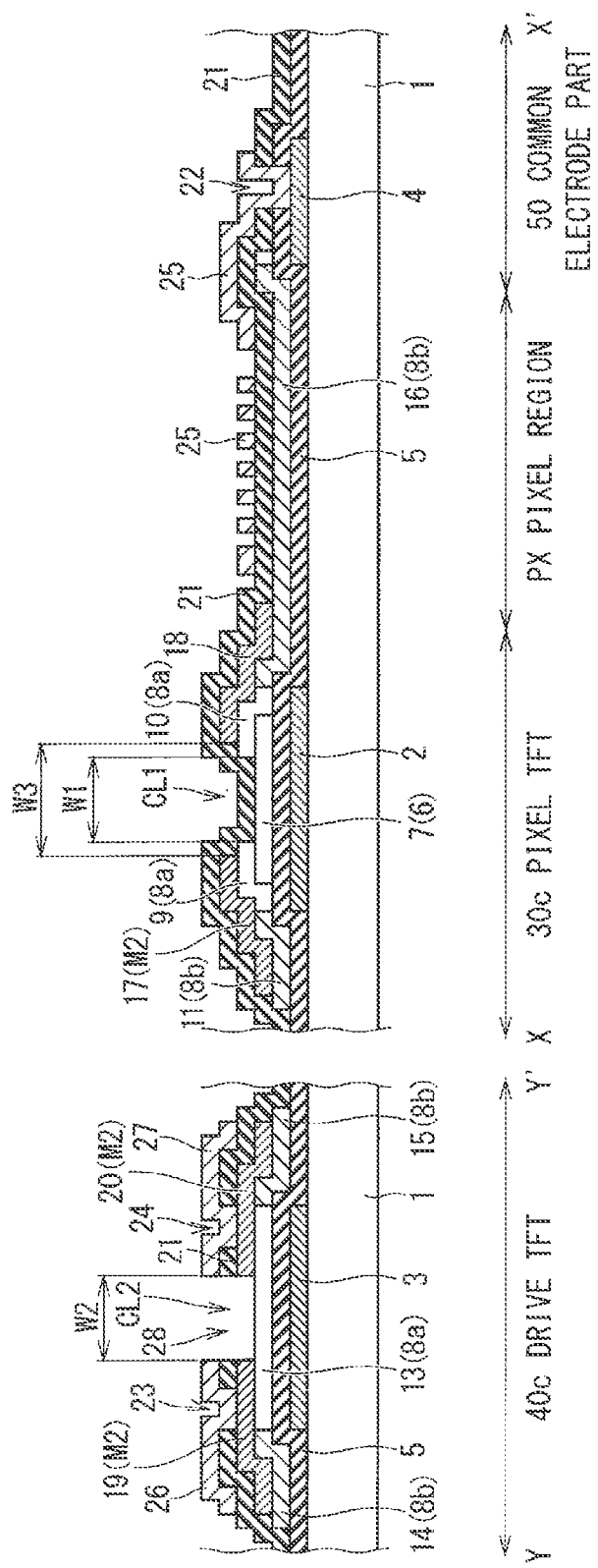
FIG. 16 is a cross-sectional view illustrating part of the configuration of a TFT substrate according to the fourth modification of the first preferred embodiment.

FIG. 14 is a plan view illustrating a pixel TFT 30c and part of the pixel region PX according to the fourth modification of the first preferred embodiment. FIG. 15 is a plan view illustrating a drive TFT 40c according to the fourth modification. The pixel TFT 30c, the pixel region PX, and the drive TFT 40c are formed on a single TFT substrate. FIG. 16 is a cross-sectional view illustrating sectional structures along line X-X' illustrated in FIG. 14 and line Y-Y' illustrated in FIG. 15.

One of structural differences between the above-described TFT substrate according to the first preferred embodiment and the TFT substrate according to the fourth modification includes the shapes of the source contact layer 9 and the drain contact layer 10 included in the pixel TFT 30c, and the shape of the second semiconductor layer 13 included in the drive TFT 40c.

Specifically, in the pixel TFT 30 described in the first preferred embodiment, the source contact layer 9 made of the oxide film 8a is formed in a pattern separated from the first source electrode underneath layer wire 11 and the source underneath layer wire 217 made of the oxide film 8b, as illustrated in FIG. 2 or 4. Similarly, the drain contact layer 10 made of the oxide film 8a is formed in a pattern separated from the pixel electrode 16 made of the oxide film 8b.

However, in the pixel TFT 30c included in the TFT substrate according to the fourth modification, as illustrated in FIG. 14 or 16, the source contact layer 9 made of the oxide film 8a is formed in a pattern continuously integrated with the first source electrode underneath layer wire 11 and the source underneath layer wire 217 made of the oxide film 8b, and the drain contact layer 10 made of the oxide film 8a is formed in a pattern continuously integrated with the pixel electrode 16 made of the oxide film 8b. In these continuously integrated oxide film patterns, the oxide film 8b positioned in a region outside of the pattern of the first gate electrode 2 has conductive characteristics and serves as the first source electrode underneath layer wire 11 and the pixel electrode 16. In the oxide film patterns, the oxide film 8a positioned inside of the first gate electrode 2 has semiconductor characteristics and serves as the source contact layer 9 and the drain contact layer 10. These structures including the continuously integrated oxide film patterns are same as that of the TFT substrate according to the above-described third modification.

In the fourth modification, the first source electrode 17 and the source wire 117 are formed on the source contact layer 9 and the first source electrode underneath layer wire 11, in shapes substantially same as those of the source contact layer 9 and the first source electrode underneath layer wire 11 in plan view, with outer edges slightly on the inside thereof. A partial region of the first drain electrode 18 is formed on the drain contact layer 10, in a shape substantially same as that of the layer in plan view with outer edges positioned slightly inside. The partial region of the first drain electrode 18 overlaps part of the pixel electrode 16 in plan view but is not formed outside of the pixel electrode 16. As illustrated in FIG. 16, the source contact layer 9 and the drain contact layer 10 are formed separately from each other at distance with the separation part W1 interposed therebetween in part of a region overlapping the first semiconductor layer 7. The first source electrode 17 and the first drain electrode 18 are formed to have a separation part W3 larger than the separation part W1 therebetween.

In the drive TFT 40 according to the first preferred embodiment described above, the second semiconductor layer 13 made of the oxide film 8a is formed separately from the second source electrode underneath layer wire 14 and the second drain electrode underneath layer wire 15 made of the oxide film 8b as illustrated in FIG. 3 or 4. In the drive TFT 40c according to the fourth modification, the second semiconductor layer 13 made of the oxide film 8a is formed in a pattern continuously integrated with the second source electrode underneath layer wire 14 and the second drain electrode underneath layer wire 15 made of the oxide film 8b as illustrated in FIG. 15 or 16. In this continuously integrated pattern, the oxide film 8b positioned in a region outside of the pattern of the second gate electrode 3 has conductive characteristics and serves as the second source electrode underneath layer wire 14 and the second drain electrode underneath layer wire 15. The oxide film 8a positioned in a region overlapping the second gate electrode 3 has semiconductor characteristics and serves as the second semiconductor layer 13 of the drive TFT 40c.

The second source electrode 19 and the second drain electrode 20 are formed separately from each other on the pattern in which the second semiconductor layer 13, the second source electrode underneath layer wire 14, and the second drain electrode underneath layer wire 15 are continuously integrated, in a shape substantially same as that of the pattern with outer edges slightly on the inside thereof in plan view.

When the first source electrode 17, the first drain electrode 18, the second source electrode 19, and the second drain electrode 20 are formed as described above, step disconnection defect of the protective insulation layer 21 can be prevented at a stepped part on each pattern edge. Accordingly, for example, TFT characteristic reliability decrease attributable to coverage defect of the protective insulation layer 21 can be reduced.

The protective insulation layer 21 and the gate insulation layer 5 therebelow include the common electrode part contact hole 22 opened therethrough so that part of the surface of the common electrode 4 is exposed at the common electrode part in the pixel region PX. The common electrode part contact hole 22 is disposed in a region overlapping the common electrode 4, but not the pixel electrode 16, in plan view.

In addition, the counter electrode 25 made of the third conductive film is formed to overlap the pixel electrode 16 in the pixel region PX on the protective insulation layer 21 in plan view. In the fourth modification, as illustrated in FIG. 14, the counter electrode 25 has a continuous shape connecting a plurality of pixel regions surrounded by the gate wires 102 and the source wires 117 in plan view. The counter electrode 25 is connected with the common electrode 4 through the common electrode part contact hole 22. Accordingly, a constant common potential signal from the common electrode 4 is applied to the counter electrode 25.

The counter electrode 25 includes a slit opening SL. With this structure, electric field substantially parallel to the substrate surface is generated above the counter electrode 25 when signal voltage is applied between the pixel electrode 16 and the counter electrode 25. Thus, the TFT substrate is applicable to an FFS LCD having in-plane field drive specifications. An opening in a comb-teeth shape may be provided in place of the slit opening SL.

In the drive TFT 40c, the first contact hole 23 is opened so that part of the surface of the second source electrode 19 is exposed in a region overlapping the second source electrode 19 in plan view. The second contact hole 24 is opened so that part of the surface of the second drain electrode 20 is exposed in a region overlapping the second drain electrode 20 in plan view. In addition, the third source electrode 26 and the third drain electrode 27 made of the third conductive film are disposed in regions overlapping the second source electrode 19 and the second drain electrode 20 in plan view, respectively. The third source electrode 26 is connected with the second source electrode 19 through the first contact hole 23, and the third drain electrode is connected with the second drain electrode 20 through the second contact hole 24.

A third contact hole 28 is opened in a region for the second channel region CL2 on the protective insulation layer 21. The third contact hole 28 has a width equal to that of the separation part W2, separates the second source electrode 19 and the second drain electrode 20 from each other, and also separates the third source electrode 26 and the third drain electrode 27 from each other. Accordingly, the second semiconductor layer 13 functions as a channel layer of the second channel region CL2.

As described above, the source and drain electrodes included in the drive TFT 40c are each made of three layers of conductors including the oxide film 8b, the second conductive film, and the third conductive film changed into a conductor. With this configuration, when one of the layers is broken due to pattern defect or the like, the breaking can be compensated by the other two layers, thereby preventing occurrence of breaking defect. Thus, when the drive TFTs 41 and 42 illustrated in FIG. 1b have configurations same as that of the drive TFT 40c and the drive voltage generation circuit SC including the drive TFTs is disposed in the peripheral region of the TFT substrate, the occurrence of circuit operation defect due to breaking between the drive TFTs can be significantly reduced.

(Manufacturing Method)

The following describes a method of manufacturing the TFT substrate according to the fourth modification of the first preferred embodiment with reference to the accompanying drawings. FIGS. 17 to 25 are each a sectional process diagram illustrating the method of manufacturing the TFT substrate according to the fourth modification of the first preferred embodiment. FIG. 16 is a cross-sectional view illustrating a last process. In each process diagram, line X-X' and line Y-Y' correspond to the section along line X-X' illustrated in FIG. 14 and the section along line Y-Y' illustrated in FIG. 15, respectively.

First, the transparent insulation substrate 1 made of, for example, glass is cleaned by using cleaning liquid or pure water. In the fourth modification, the substrate 1 is a glass substrate having a thickness of 0.6 mm. Then, the first conductive film, of which gate electrodes and the like are to be made, is formed entirely on one of main surfaces of the substrate 1 thus cleaned. An upper main surface of the substrate 1 is defined to be a main surface on which the gate electrode and the like are provided.

The first conductive film may be made of metal such as Cr, Mo, Ti, Cu, Ta, W, or Al, or alloy containing the metal element as a primary component in addition to at least one other kind of element. The primary component element is an element in a largest contained amount among elements contained in the alloy. The first conductive film may have a laminated structure including two or more layers made of the metals and the alloy. When the metals and alloy are used, a low-resistance conductive film having a specific resistance value of 50 μΩcm or smaller can be obtained. In the fourth modification of the first preferred embodiment, a Cu film having a thickness of 200 nm is deposited as the first conductive film by the sputtering method using Ar gas.

Figure 17:
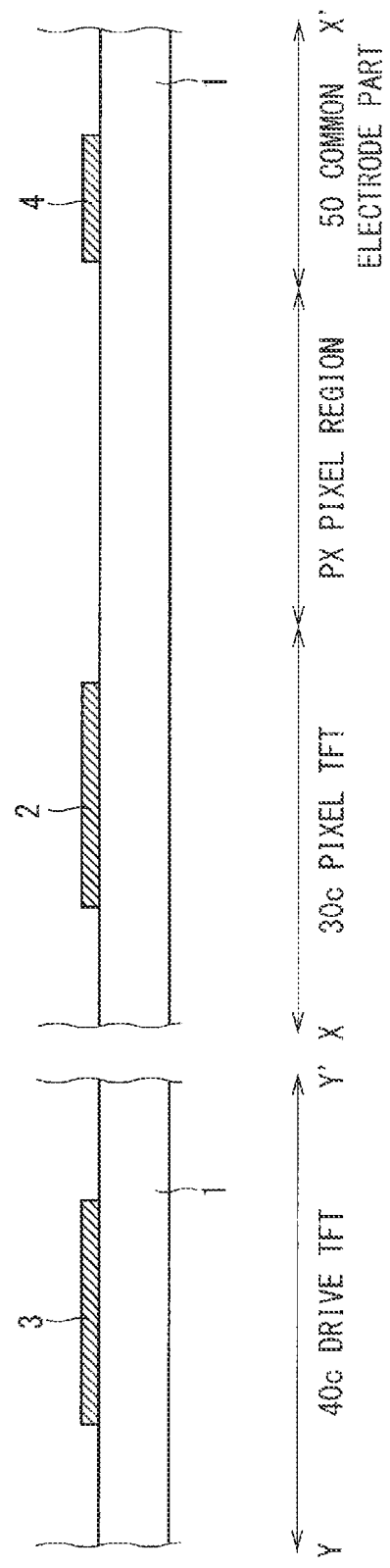

Thereafter, photoresist material is applied on the first conductive film, and a photoresist pattern is formed through the first photoengraving process. The photoresist pattern is used as a mask to pattern the first conductive film by etching. In this example, wet etching is performed by using solution including water solution containing ammonium peroxodisulfate at the concentration of 0.3 weight %. Thereafter, the photoresist pattern is removed to form the first gate electrode 2, the second gate electrode 3, and the common electrode 4 on the upper main surface of the substrate 1, as illustrated in FIG. 17.

Subsequently, the gate insulation layer 5 made of the first insulating film is formed on the entire upper main surface of the substrate 1 to cover the first gate electrode 2, the second gate electrode 3, and the like. The first insulating film functions as the gate insulation layer 5 in a TFT part, and thus is typically called a gate insulating film. In the fourth modification of the first preferred embodiment, the gate insulation layer 5 is formed by depositing SiN by the CVD method. Specifically, the gate insulation layer 5 is a SiN film having a thickness of 400 nm.

Figure 18:
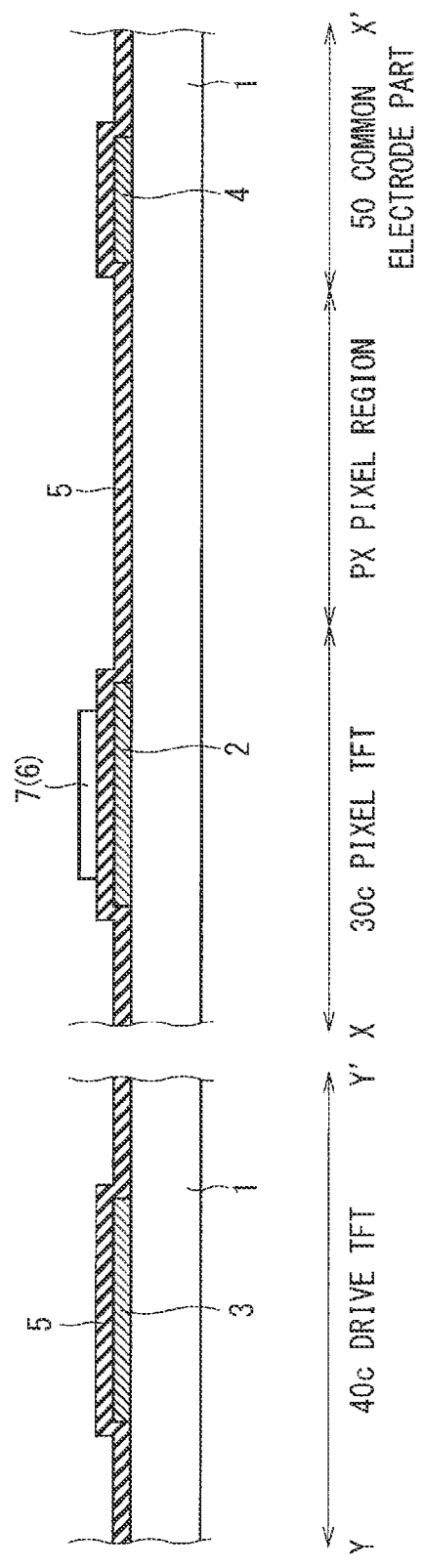

Subsequently, the a-Si film 6 of which the first semiconductor layer 7 is to be made is formed on the gate insulation layer 5. In the fourth modification, the a-Si film 6 having a thickness of 100 nm is deposited by the CVD method. Thereafter, a photoresist pattern is formed through the second photoengraving process and used as a mask to pattern the a-Si film 6 by etching. In this example, dry etching is performed by using gas containing $SF_6$ gas and HCl gas. Thereafter, the photoresist pattern is removed to form the first semiconductor layer 7 made of the a-Si film 6 in a region overlapping the first gate electrode 2 on the gate insulation layer 5 as illustrated in FIG. 18.

Subsequently, the oxide film 8a, of which the second semiconductor layer 13 and the like are to be made, is formed on the gate insulation layer 5 including the first semiconductor layer 7. In the fourth modification of the first preferred embodiment, similarly to the first preferred embodiment, an InGaZnO film having a thickness of 50 nm is deposited as the oxide film 8a by the sputtering method using mixed gas of Ar gas and $O_2$ gas. The InGaZnO film typically has characteristics of an n-type semiconductor having an electron carrier density of $1 \times 10^{12}/cm^3$ to $1 \times 10^{19}/cm^3$ inclusive. When the InGaZnO film is formed by the sputtering method, the electron carrier density of the InGaZnO film can be controlled by changing, for example, the mixture ratio of the Ar gas and the $O_2$ gas.

Thereafter, a second conductive film M2, of which a source electrode, a drain electrode, and the like are to be made, is subsequently deposited on the InGaZnO film. In the fourth modification of the first preferred embodiment, a Cu film having a thickness of 200 nm is formed as the second conductive film M2 by the sputtering method using Ar gas.

Then, a photoresist pattern is formed by patterning, through a photolithography process, photoresist applied and formed through the third photoengraving process. As illustrated in FIG. 19, the photoresist pattern includes a photoresist pattern PR1 as a first resist region having a thickness ha, a photoresist pattern PR2 as a second resist region having the thickness ha, and a photoresist pattern PR3 as a third resist region having a thickness hb. In a region overlapping the first gate electrode 2 in plan view, a region in which the photoresist pattern PR1 and the photoresist pattern PR2 are separated from each other corresponds to the first channel region CL1 of the pixel TFT 30c. The photoresist pattern PR3 corresponds to a formation region of the drive TFT 40c. The photoresist pattern PR2 includes a photoresist pattern PR4 as the pixel region PX having a thickness hc, and the photoresist pattern PR2 and the photoresist pattern PR4 are formed in a continuously integrated shape.

The thickness ha of the photoresist patterns PR1 and PR2 and the thickness hb of the photoresist pattern PR3 are set to be larger than the thickness hc of the photoresist pattern PR4. Specifically, in the fourth modification of the first preferred embodiment, the photoresist patterns are formed so that the thicknesses ha and hb are equal to 2.5 μm approximately and the thickness hc is equal to 1.0 μm approximately. A slight thickness difference is allowable in each of the photoresist patterns PR1. PR2, PR3, and PR4. Such a difference occurs due to the surficial shape of a surface on which a photoresist layer is formed, and has a size substantially equal to the thicknesses of the first conductive film and the a-Si film 6 of the first semiconductor layer 7, for example.

The photoresist pattern having a plurality of thicknesses as illustrated in FIG. 19 can be formed by first applying and forming, for example, positive photoresist containing novolak resin on the second conductive film M2 of the substrate 1 so that a desired maximum film thickness (in the above-described example, 2.5 μm) is obtained, and then controlling, at multiple stages, an exposure amount at photoresist exposure in a photolithography process. Specifically, at the photoresist exposure, regions corresponding to the photoresist patterns PR1, PR2, and PR3 are shielded from exposure light, a region corresponding to the photoresist pattern PR4 is irradiated with exposure light at reduced intensity, and the other region is directly irradiated with exposure light, while exposure processing is performed. Thereafter, when resist development processing is executed, the photoresist is completely removed in the region directly irradiated with exposure light, remains at the maximum film thickness in the shielded region, and has a reduced film thickness in the region irradiated with reduced light. This exposure control at multiple stages may be performed by any well-known photolithography process using a gray-tone or halftone photomask.

Subsequently, as illustrated in FIG. 20, the photoresist patterns PR1, PR2, PR3, and PR4 are used as masks to pattern the second conductive film M2 and the oxide film 8a by etching. First, wet etching is performed by using solution including water solution containing ammonium peroxodisulfate at the concentration of 0.3 weight % to etch the second conductive film M2 made of Cu. Subsequently, wet etching is performed by using solution including water solution containing oxalic acid (dicarboxylic acid) at the concentration of 5 weight % to etch the oxide film 8a made of InGaZnO. Accordingly, in the pixel TFT 30c in particular, the second conductive film M2 and the oxide film 8a are removed to form the first channel region CL1 including the separation part W1 in a region overlapping the first gate electrode 2 and the first semiconductor layer 7.

Similarly to the first preferred embodiment, the oxalic acid solution used to etch the oxide film 8a is weakly acid, and the first semiconductor layer 7 made of the a-Si film 6 is not etched with the water solution at the concentration of 5 weight % used in the fourth modification of the first preferred embodiment, but etchant for the first semiconductor 7 is not limited thereto. The first semiconductor layer 7 is not etched with typical oxalic acid solution either. Accordingly, sufficient etching selectivity is achieved so that selective etching can be uniformly performed only on the oxide film 8a, and thus the favorable first channel region CL1 can be formed on the first semiconductor layer 7. The oxide film 8a that finally forms a channel layer in the drive TFT 40c is covered by the photoresist pattern PR3, and thus not removed through these etching processes.

In addition, as illustrated in FIG. 21, ashing is performed on the entire resist by irradiating the entire substrate 1 with oxygen ($O_2$) plasma, thereby reducing thickness. Accordingly, the photoresist pattern PR4 in a region having a small thickness is completely removed. Simultaneously, the thicknesses of the photoresist patterns PR1, PR2, and PR3 in regions having large thicknesses are reduced. As a result, the photoresist patterns PR1, PR2, and PR3 remain as new photoresist patterns PR1a and PR2a having a thickness ha' and a new photoresist pattern PR3a having a thickness hb', respectively. Simultaneously with the thickness reduction by ashing, the new photoresist patterns PR1a, PR2a, and PR3a have entire outer edges retracted inward in plan view and have shapes in reduced sizes as compared to the original photoresist patterns PR1, PR2, and PR3.

Figure 22:
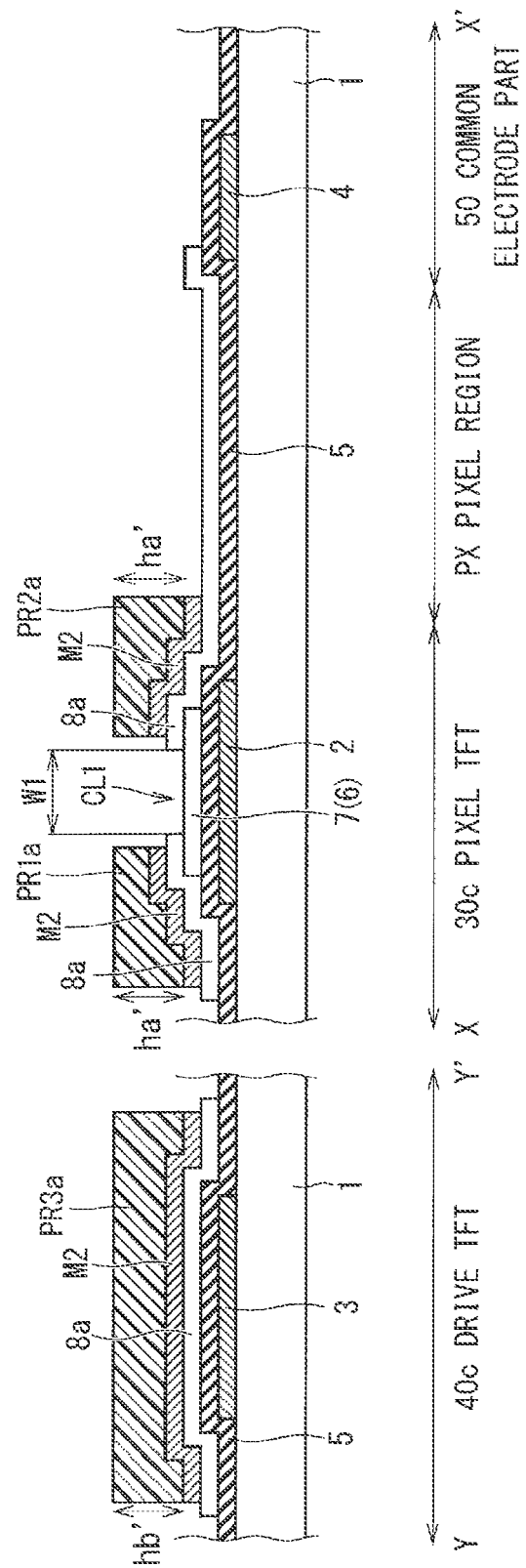

Subsequently, as illustrated in FIG. 22, the photoresist patterns PR1a, PR2a, and PR3a are used as masks to selectively pattern the second conductive film M2 only by etching. In this example, wet etching is performed by using solution including water solution containing ammonium peroxodisulfate at the concentration of 0.3 weight %.

Figure 23:
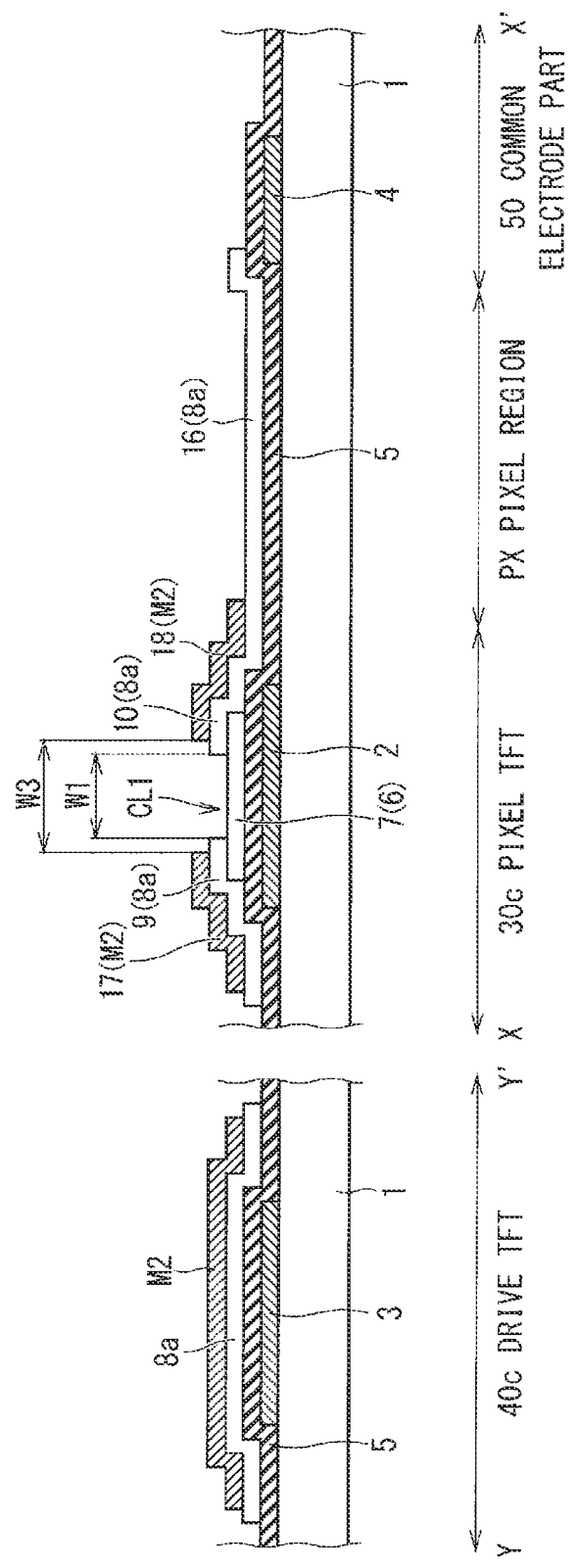

Thereafter, the photoresist pattern is removed to form the first source electrode 17 and the first drain electrode 18 made of the second conductive film M2, and the source contact layer 9 and the drain contact layer 10 made of the oxide film 8a in the pixel TFT 30c as illustrated in FIG. 23. In this process, the first semiconductor layer 7 made of the a-Si film 6 is not etched by the solution including water solution containing ammonium peroxodisulfate at the concentration of 0.3 weight %, which is used to etch the second conductive film M2. Accordingly, sufficient etching selectivity is achieved so that the first channel region CL1 of the first semiconductor layer 7 can maintain a favorable state.

The first source electrode 17 and the first drain electrode 18 formed by patterning the second conductive film M2 have outer edges retracted inward, in plan view, from the pattern outer edges of the source contact layer 9 and the drain contact layer 10 made of the oxide film 8a therebelow. Accordingly, in the fourth modification of the first preferred embodiment, these pattern outer edges have end parts in stepped shapes as illustrated in FIG. 23. Similarly, in the drive TFT 40c, the outer edges of laminated body patterns made of the oxide film 8a and the second conductive film M2 have end parts in stepped shapes.

In the first channel region CL1 in a region overlapping the first gate electrode 2 in plan view, the source contact layer 9 and the drain contact layer 10 on the gate insulation layer 5 are separated from each other at distance with the separation part W1 interposed therebetween. The first source electrode 17 and the first drain electrode 18 overlap the source contact layer 9 and the drain contact layer 10 in plan view and are formed to have the separation part W3 larger than the separation part W1 therebetween.

As illustrated in FIG. 23, in the pixel region PX positioned next to the pixel TFT 30c, the second conductive film M2 as an upper layer is removed, and the pattern of the pixel electrode 16, which is continuously integrated with the pattern of the drain contact layer 10 made of the oxide film 8a, is formed.

Figure 24:
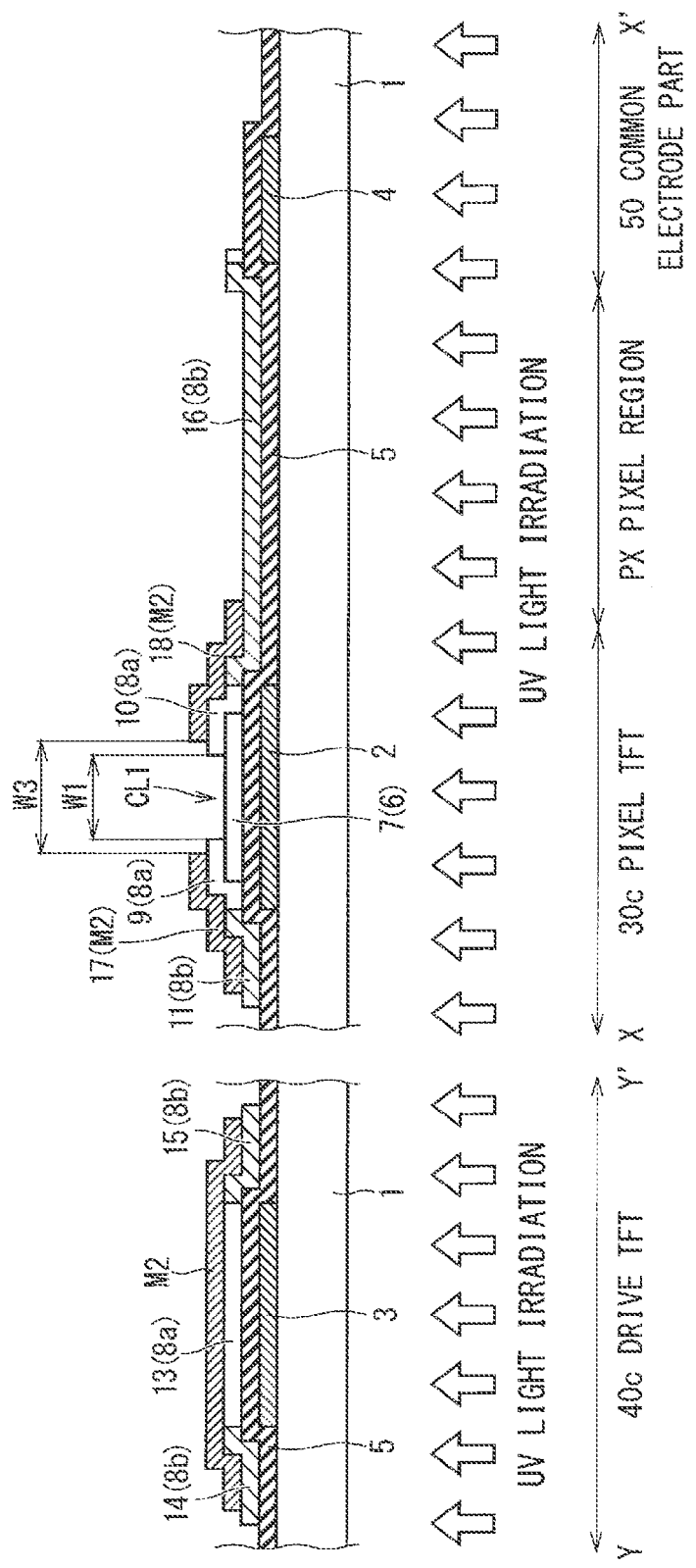

Subsequently, as illustrated in FIG. 24, the entire back surface of the substrate 1 is irradiated with ultraviolet (UV) light by using, for example, a low-pressure mercury lamp. Through this processing, the pattern regions of the oxide film 8a that are irradiated with UV light having transmitted the substrate 1, in other words, regions of the first source electrode underneath layer wire 11 and the pixel electrode 16 in the pixel TFT 30c, and regions of the second source electrode underneath layer wire 14 and the second drain electrode underneath layer wire 15 in the drive TFT 40c are changed from semiconductors to conductors. Accordingly, the first source electrode underneath layer wire 11, the pixel electrode 16, the second source electrode underneath layer wire 14 and the second drain electrode underneath layer wire 15, which are made of the oxide film 8b having conductive characteristics, are formed through this light irradiation process. In this case, each conductor preferably has a specific resistance value equal to or smaller than $1 \times 10^{-2}$ Ω·cm approximately. In other words, an oxide film such as the InGaZnO film according to the fourth modification of the first preferred embodiment preferably has an electron carrier density equal to or larger than $1 \times 10^{19}/cm^3$.

The oxide film 8a formed in regions overlapping the first gate electrode 2, the second gate electrode 3, and the common electrode 4 in plan view is shielded from UV light, and thus maintains semiconductor characteristics. Specifically, the oxide film 8a of which the source contact layer 9 and the drain contact layer 10 positioned in a region overlapping the first gate electrode 2 in plan view are made maintains semiconductor characteristics. In addition, the oxide film 8a of which the second semiconductor layer 13 positioned in a region overlapping the second gate electrode 3 in plan view is made maintains semiconductor characteristics.

The UV light preferably has an intensity peak in a wavelength region equal to or shorter than 450 nm to efficiently change the oxide film 8a into a conductor. In the present preferred embodiment, the irradiation is performed by using a low-pressure mercury lamp, but a UV light source is not limited thereto. For example, ultraviolet laser light is applicable.

Subsequently, the second insulating film, of which the protective insulation layer 21 is to be made, is formed on the entire upper main surface of the substrate 1. In the first preferred embodiment, the protective insulation layer 21 is formed by stacking and depositing a SiO film having a thickness of 100 nm and a SiN film having a thickness of 200 nm in the stated order by the CVD method. In the fourth modification of the first preferred embodiment, at the timing when the insulating film of which the protective insulation layer 21 is to be made is deposited, the oxide film 8a and the second conductive film M2 have end parts in stepped shape as described above, and thus the deposition can be performed with favorable coverage at these stepped parts.

Thereafter, a photoresist pattern is formed through the fourth photoengraving process and used as a mask to sequentially pattern the SiO and SiN films of the protective insulation layer 21 and the SiN film of the gate insulation layer 5 by etching. Dry etching is performed by using gas containing $O_2$ in addition to $SF_6$.

Figure 25:
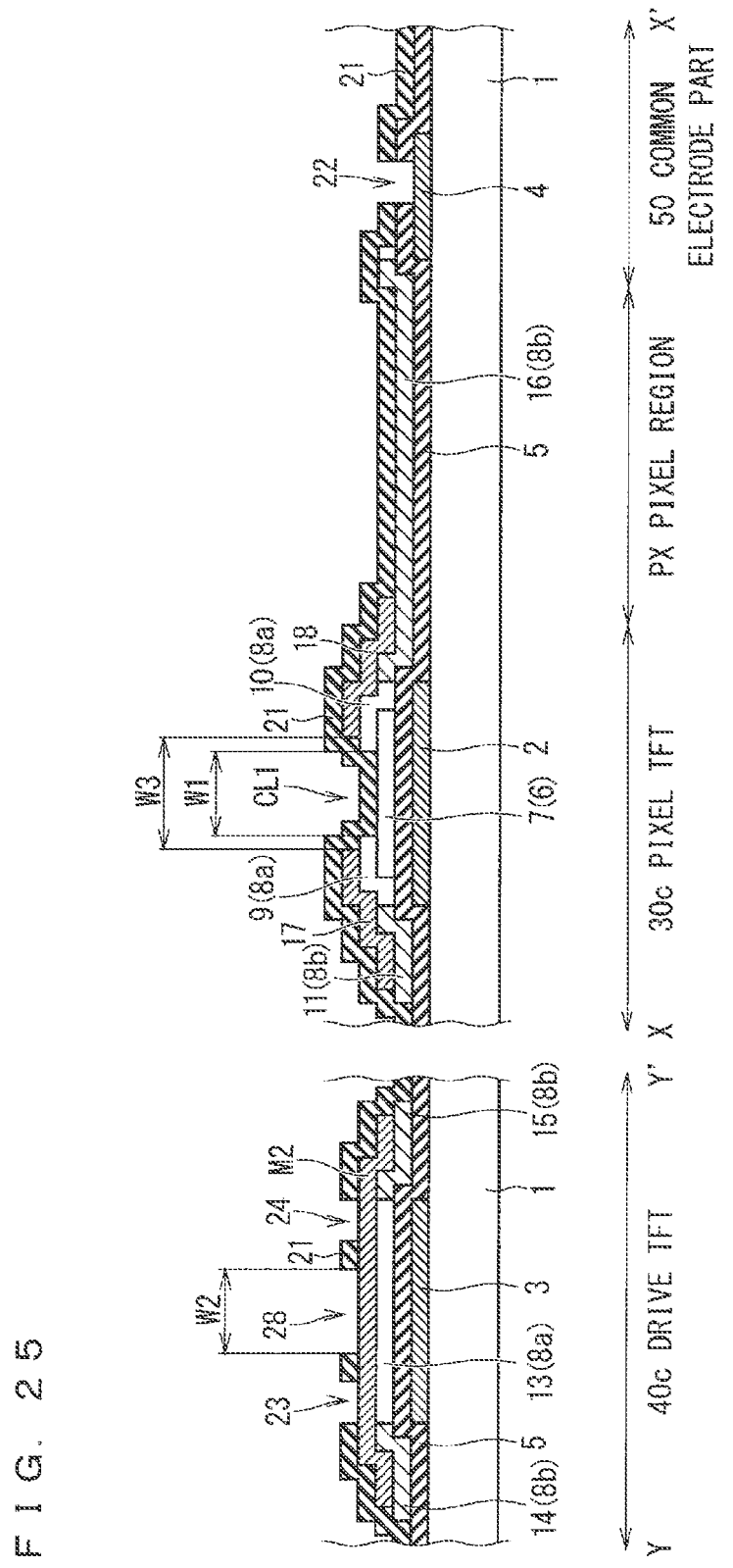

Thereafter, the photoresist pattern is removed to form, at the common electrode part 50, the common electrode part contact hole 22 through the protective insulation layer 21 and the gate insulation layer 5 so that part of the surface of the common electrode 4 is exposed, as illustrated in FIG. 25. The common electrode part contact hole 22 is disposed in a region overlapping the common electrode 4, but not the pixel electrode 16, in plan view.

In addition, at the drive TFT 40c, the first contact hole 23, the second contact hole 24, and the third contact hole 28 are formed on the protective insulation layer 21 so that part of the surface of the second conductive film M2 is exposed. The third contact hole 28 is disposed in a region overlapping the second gate electrode 3 in plan view.

Subsequently, the third conductive film, of which the counter electrode 25 and the like are to be made, is formed on the protective insulation layer 21. In the fourth modification of the first preferred embodiment, similarly to the first preferred embodiment, first, an ITO film that is an optically transparent oxide conductive film is deposited as the third conductive film.

Thereafter, a photoresist pattern is formed through the fifth photoengraving process and used as a mask to pattern the ITO film as the third conductive film by etching. In this example, wet etching is performed by using solution containing oxalic acid. Subsequently, wet etching is performed by using solution including water solution containing ammonium peroxodisulfate at the concentration of 0.3 weight % to pattern a partial region of the second conductive film M2 made of Cu. Thereafter, the photoresist pattern is removed to form the translucent counter electrode 25 in the pixel TFT 30c as illustrated in FIG. 16. The counter electrode 25 overlaps the pixel electrode 16 in the pixel region PX on the protective insulation layer 21 in plan view. The counter electrode 25 is connected with the common electrode 4 through the common electrode part contact hole 22.

As illustrated in FIG. 14, The counter electrode 25 includes the slit opening SL. With this structure, electric field substantially parallel to the substrate surface is generated above the counter electrode 25 when signal voltage is applied between the pixel electrode 16 and the counter electrode 25. An opening in a comb-teeth shape may be provided in place of the slit opening SL.

In addition, as illustrated in FIG. 16, the third source electrode 26 and the third drain electrode 27 made of the third conductive film are formed in the drive TFT 40c. The third source electrode 26 is connected with the second source electrode 19 through the first contact hole 23, and the third drain electrode 27 is connected with the second drain electrode 20 through the second contact hole 24. In the third contact hole 28, the third conductive film made of ITO and the second conductive film made of Cu are removed to form the second channel region CL2 including the separation part W2 on the second semiconductor layer 13 made of the oxide film 8a, thereby forming the drive TFT 40c.

To assemble a liquid crystal display panel, similarly to the first preferred embodiment, first, an alignment film and a spacer are formed on the surface of the TFT substrate illustrated in FIGS. 14 and 15. The alignment film is a film for arraying liquid crystals and contains, for example, polyimide. Subsequently, a counter substrate (not illustrated) separately produced and including a color filter and an alignment film is laminated opposite to the TFT substrate. In this state, the spacer forms a gap between the TFT substrate and the counter substrate, and liquid crystals are sealed in the gap, thereby producing an in-plane field liquid crystal drive FFS liquid crystal display panel. Lastly, a polarization plate, a wave plate, a backlight unit, and the like are disposed outside of the liquid crystal display panel, which completes an FFS LCD.

(Effects)

As described above, the fourth modification of the first preferred embodiment achieves, in addition to the effects of the above-described first preferred embodiment, such an effect that an FFS TFT substrate having a configuration in which the pixel TFT 30c (first TFT) including a semiconductor channel layer made of the a-Si film 6 and the drive-circuit drive TFT 40c (second TFT) including a semiconductor channel layer made of the oxide film 8a are both formed on the single substrate 1 can be produced through the five photoengraving processes fewer than the photoengraving processes in the first preferred embodiment. Accordingly, the productivity can be further improved.

The TFT substrate according to the fourth modification of the first preferred embodiment also achieves, in addition to the effects of the first preferred embodiment, such an effect that, at the timing when the insulating film of which the protective insulation layer 21 is to be made is deposited, stepped shapes can be easily formed at pattern end parts of the oxide film 8a and the second conductive film M2 therebelow, and thus the deposition can be performed with favorable coverage at these stepped parts. Accordingly, a highly reliable TFT substrate can be obtained.

The source and drain electrodes included in the drive TFT 40c are each made of three layers of the oxide film 8b, the second conductive film, and the third conductive film changed into conductors. With this configuration, when one of the layers is broken due to pattern defect or the like, the breaking can be compensated by the other two layers, thereby preventing occurrence of breaking defect. Thus, when the drive voltage generation circuit SC as a combination of a plurality of drive unit TFTs in a complicated manner is disposed in the peripheral region of a TFT substrate, the occurrence of circuit operation defect due to breaking of any drive TFT can be significantly reduced.

With the above-described configuration, an LCD having excellent display quality and reliability with no display ununiformity can be manufactured at high productivity and low cost.

As described above, in the method of manufacturing the TFT substrate according to the fourth modification, the process of forming the first semiconductor layer 7 includes, after the process of forming the gate insulation layer 5, a process of forming the amorphous silicon film 6 made of amorphous silicon on the substrate 1, and a process of patterning the amorphous silicon film 6 to form the first semiconductor layer 7. The process of forming the source contact layer 9, the process of forming the drain contact layer 10, the process of forming the second semiconductor layer 13, and the process of forming the pixel electrode 16 each include, after the process of forming the first semiconductor layer 7: a process of sequentially stacking and forming, on the substrate 1, the oxide film 8a made of oxide having semiconductor characteristics and the second conductive film; and a process of patterning the oxide film 8a and the second conductive film all at once to form the source contact layer 9, the drain contact layer 10, the second semiconductor layer 13, and the pixel electrode 16. The process of forming the first source electrode 17, the process of forming the first drain electrode 18, the process of forming the second source electrode 19, and the process of forming the second drain electrode 20 each include, after the process of patterning the oxide film 8a and the second conductive film all at once, a process of patterning the second conductive film all at once to form the first source electrode 17, the first drain electrode 18, the second source electrode 19, and the second drain electrode 20.

With this configuration, the configuration facilitates selective removal of an ohmic contact layer made of the oxide film 8a in a BCE process for a-Si channel layer formation, thereby achieving formation of a semiconductor channel part made of the a-Si film 6 with the uniformity of the shape and characteristics. Thus, the uniformity of characteristics of the pixel TFT 30c can be improved.

In the method of manufacturing the TFT substrate according to the fourth modification, the process of forming the first gate electrode 2 and the process of forming the second gate electrode 3 each include a process of forming the first conductive film having light-shielding characteristics on the surface of the substrate 1, and a process of patterning the first conductive film all at once to form the first gate electrode 2 and the second gate electrode 3. The process of forming the pixel electrode 16 further includes, after the process of patterning the oxide film 8a and the second conductive film all at once to form the source contact layer 9, the drain contact layer 10, the second semiconductor layer 13, and the pixel electrode 16, a process of irradiating the back surface of the substrate 1 with light including ultraviolet.

With this configuration, the pixel electrode 16, the first source electrode underneath layer wire 11, the second source electrode underneath layer wire 14, and the second drain electrode underneath layer wire 15, which are made of the oxide film 8b having conductive characteristics, can be formed in regions irradiated with UV light having transmitted the substrate 1. In addition, the source contact layer 9, the drain contact layer 10, and the second semiconductor layer 13, which are made of the oxide film 8a having semiconductor characteristics, can be formed in regions shielded from UV light. Accordingly, the manufacturing process is simplified.

The TFT substrate according to the fourth modification can be produced through photoengraving processes fewer than the processes of manufacturing the TFT substrate 100 according to the first preferred embodiment.

Second Preferred Embodiment

A TFT substrate 101 according to the second preferred embodiment has a planar configuration same as the planar configuration of the TFT substrate 100 according to the first preferred embodiment illustrated in FIG. 1A. The plane of the TFT substrate 101 is roughly divided into the display region 150 and the frame region 160 (peripheral region) provided around the display region 150. The display region 150 includes a plurality of pixels (pixel regions) arrayed in a matrix, and each pixel includes a pixel TFT 30d as a first thin film transistor. However, the pixel TFT 30d provided to the TFT substrate 101 according to the second preferred embodiment has a configuration different from that of the pixel TFT 30 provided to the TFT substrate 100 described in the first preferred embodiment.

(Configurations of Pixel TFT and Drive TFT)

The configurations of the pixel TFT 30d as a first thin film transistor and a drive TFT 40d as a second thin film transistor provided to the TFT substrate 101 according to the second preferred embodiment will be described below in detail with reference to the accompanying drawings. The TFT substrate 101 is a TFT substrate to be included in a light transmissive liquid crystal panel, and has FFS in-plane field liquid crystal drive specifications.

FIG. 2 is a diagram illustrating the planar configuration of the pixel TFT 30 according to the first preferred embodiment. The pixel TFT 30d provided to the TFT substrate 101 according to the second preferred embodiment has the same planar configuration. Although described later in detail, the pixel TFT 30d is different from the pixel TFT 30 in the top-bottom positional relation between the first semiconductor layer 7 and the first source electrode 17, and the top-bottom positional relation between the first semiconductor layer 7 and the first drain electrode 18. The pixel TFT 30d has a planar external configuration substantially same as that of the pixel TFT 30 illustrated in FIG. 2.

Figure 26:
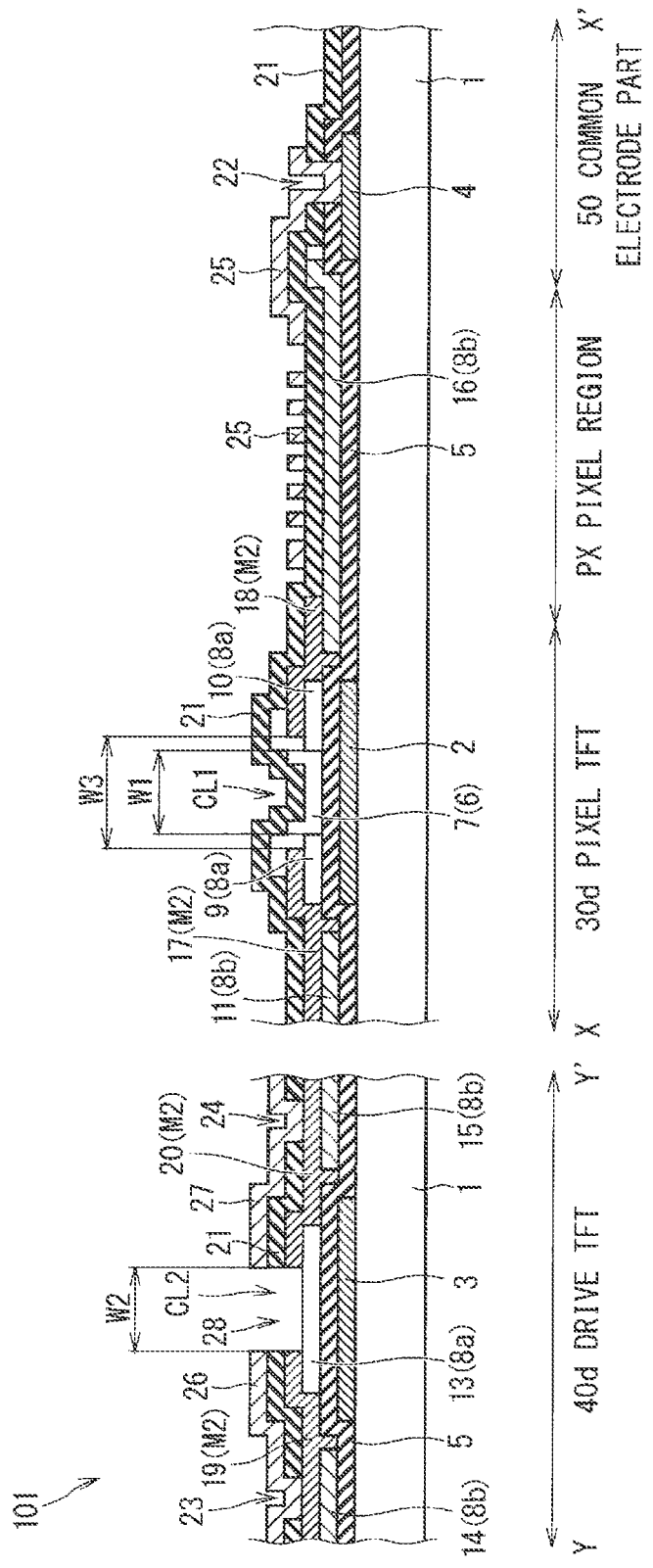
FIG. 26 is a cross-sectional view illustrating part of the configuration of the TFT substrate according to the second preferred embodiment.

FIG. 26 is a cross-sectional view illustrating part of the configuration of the TFT substrate 101. FIG. 26 is a diagram illustrating sectional structures of the pixel TFT 30d and the drive TFT 40d. A section including the pixel TFT 30d corresponds to the section along line X-X' in FIG. 2. The drive TFT 40d has a planar configuration different from that of the drive TFT 40 illustrated in FIG. 3, but a section including the drive TFT 40d illustrated in FIG. 26 corresponds to a section at the position of line Y-Y' in FIG. 3. The configurations of the pixel TFT 30d and the drive TFT 40d will be described below with reference to the accompanying drawings.

The pixel TFT 30d and the drive TFT 40d according to the second preferred embodiment is formed on the substrate 1 that is a transparent insulating substrate made of, for example, glass. The first gate electrode 2, the second gate electrode 3, and the common electrode 4, which are made of the first conductive film of, for example, metal and have light-shielding characteristics, are selectively formed on the substrate 1. The first gate electrode 2 is formed in a region in which the pixel TFT 30d is formed and functions as a gate electrode of the pixel TFT 30d. The second gate electrode 3 is formed in a region in which the drive TFT 40d is formed and functions as a gate electrode of the drive TFT 40d.

A gate insulation layer 5 made of a first insulating film is formed on the entire surface of the substrate 1 to cover the first gate electrode 2, the second gate electrode 3, and the like.

In the region of the pixel TFT 30d, the source contact layer 9 and the drain contact layer 10, which are made of the oxide film 8a having semiconductor characteristics, are selectively formed on the gate insulation layer 5. In a region overlapping the first gate electrode 2 in plan view, the source contact layer 9 and the drain contact layer 10 are separated from each other at distance with the separation part W1 interposed therebetween. Thus, the source contact layer 9 overlaps at least part of the first gate electrode 2 in plan view and is disposed on the gate insulation layer 5. The drain contact layer 10 overlaps at least part of the first gate electrode 2 in plan view, and is disposed on the gate insulation layer 5 and separated from the source contact layer 9 with the separation part W1 interposed therebetween. The source contact layer 9 and the drain contact layer 10 are made of the oxide film 8a having semiconductor characteristics and identical compositions.

The first source electrode 17 made of the second conductive film is formed on the source contact layer 9. The first source electrode 17 is disposed to cover the source contact layer 9 except for part of the source contact layer 9 positioned on the separation part W1 side. The first drain electrode 18 made of the second conductive film having a composition same as that of the first source electrode 17 is formed on the drain contact layer 10. The first drain electrode 18 is disposed to cover the drain contact layer 10 except for part of the drain contact layer 10 positioned on the separation part W1 side. In other words, part of the first source electrode 17 overlaps the source contact layer 9 in plan view. The first source electrode 17 extends over the gate insulation layer 5 from the source contact layer 9. Part of the first drain electrode 18 overlaps the drain contact layer 10 in plan view. The first drain electrode 18 extends over the gate insulation layer 5 from the drain contact layer 10. The first source electrode 17 and the first drain electrode 18 are formed to have the separation part W3 larger than the separation part W1 therebetween.

The first semiconductor layer 7 made of the a-Si film 6 is formed on the separation part W1 across which the source contact layer 9 and the drain contact layer 10 are separated from each other on the gate insulation layer 5, and is formed over the source contact layer 9, the drain contact layer 10, part of the first source electrode 17, and part of the first drain electrode 18. In other words, the first semiconductor layer 7 extends from the gate insulation layer 5 in the separation part W1 to part of the first source electrode 17 and part of the first drain electrode 18. The first semiconductor layer 7 is disposed in contact with the source contact layer 9 and the drain contact layer 10 in the separation part W3.

The source contact layer 9 functions as an ohmic contact layer connecting the first semiconductor layer 7 and the first source electrode 17 at favorable electric property. The drain contact layer 10 functions as an ohmic contact layer connecting the first semiconductor layer 7 and the first drain electrode 18 at favorable electric property. The first semiconductor layer 7 in the separation part W1 and the separation part W3 functions as the first channel region CL1 of the pixel TFT 30d.

In the region of the drive TFT 40d, the second semiconductor layer 13 is formed on the gate insulation layer 5. The second semiconductor layer 13 is disposed in a region overlapping the second gate electrode 3 in plan view. The second semiconductor layer 13 is made of the oxide film 8a having semiconductor characteristics and a composition same as those of the source contact layer 9 and the drain contact layer 10.

The second source electrode 19 and the second drain electrode 20 made of the second conductive film are selectively provided on the second semiconductor layer 13 and separated from each other with the separation part W2 interposed therebetween. Part of the second source electrode 19 is disposed in contact with the surface of the second semiconductor layer 13. The second source electrode 19 extends from the second semiconductor layer 13 to the gate insulation layer 5. In other words, the second source electrode 19 overlaps part of the second semiconductor layer 13 in plan view. The second drain electrode 20 is disposed separately from the second source electrode. Part of the second drain electrode 20 is disposed in contact with the surface of the second semiconductor layer 13. The second drain electrode 20 extends from the second semiconductor layer 13 to the gate insulation layer 5. In other words, the second drain electrode 20 overlaps the second semiconductor layer 13 in plan view. The second source electrode 19 and the second drain electrode 20 are made of the second conductive film having a composition same as those of the first source electrode 17 and the first drain electrode 18.

The second semiconductor layer 13 made of the oxide film 8a having semiconductor characteristics is connected with each of the second source electrode 19 and the second drain electrode 20 at favorable electric property. The second semiconductor layer 13 in the separation part W2 functions as the second channel region CL2 of the drive TFT 40d.

The first source electrode underneath layer wire 11 or the source underneath layer wire 217 made of the oxide film 8b having conductive characteristics may be formed on the gate insulation layer 5 underneath a region overlapping part of the source wire 117 and the first source electrode 17 in plan view. The second source electrode underneath layer wire 14 and the second drain electrode underneath layer wire 15 made of the oxide film 8b having conductive characteristics may be formed on the gate insulation layer 5 underneath a region overlapping the second source electrode 19 and the second drain electrode 20 in plan view. These underneath layer wires function as auxiliary wires and auxiliary electrodes of the source wire 117, the second source electrode 19 and the second drain electrode 20, respectively, thereby preventing generation of breaking defect, for example, when part of the wires and electrodes has any pattern defect or the like.

In the pixel region PX, the pixel electrode 16 made of the oxide film 8b having conductive characteristics is formed on the gate insulation layer 5.

A protective insulation layer 21 made of a second insulating film is formed on the entire surface of the substrate including the first source electrode 17, the first drain electrode 18, the second source electrode 19, the second drain electrode 20, and the pixel electrode 16. The common electrode part contact hole 22 is opened through the protective insulation layer 21 and the gate insulation layer 5 therebelow so that part of the surface of the common electrode 4 is exposed in the pixel region PX. The common electrode part contact hole 22 is disposed in a region overlapping the common electrode 4, but not the pixel electrode 16, in plan view.

The counter electrode 25 made of the third conductive film is formed on the protective insulation layer 21 in the pixel region PX, overlapping the pixel electrode 16 in plan view. In the second preferred embodiment, the counter electrode 25 has a continuous shape connecting a plurality of pixel regions surrounded by the gate wires 102 and the source wires 117 in plan view. The counter electrode 25 is connected with the common electrode 4 through the common electrode part contact hole 22. Accordingly, a constant common potential signal from the common electrode 4 is applied to the counter electrode 25.

The counter electrode 25 includes a slit opening SL. With this structure, electric field substantially parallel to the substrate surface is generated above the counter electrode 25 when signal voltage is applied between the pixel electrode 16 and the counter electrode 25. Thus, the TFT substrate 101 is applicable to an FFS LCD having in-plane field drive specifications. An opening in a comb-teeth shape may be provided in place of the slit opening SL.

In the drive TFT 40d, the first contact hole 23 is opened through the protective insulation layer 21 so that part of the surface of the second source electrode 19 is exposed in a region overlapping the second source electrode 19 in plan view, and the second contact hole 24 is opened through the protective insulation layer 21 so that part of the surface of the second drain electrode 20 is exposed in a region overlapping the second drain electrode 20 in plan view. In addition, the third source electrode 26 and the third drain electrode 27 made of the third conductive film are disposed in regions overlapping the second source electrode 19 and the second drain electrode 20 in plan view, respectively. The third source electrode 26 is connected with the second source electrode 19 through the first contact hole 23, and the third drain electrode is connected with the second drain electrode 20 through the second contact hole 24.

A third contact hole 28 is opened in a region for the second channel region CL2 on the protective insulation layer 21. In the third contact hole 28, each of a pair of the second source electrode 19 and the third source electrode 26 and a pair of the second drain electrode 20 and the third drain electrode 27 are separated from each other with the separation part W2 interposed therebetween. Accordingly, the second semiconductor layer 13 functions as the second channel region CL2 of the drive TFT 40*d*.

As described above, the source and drain electrodes included in the drive TFT 40*d* are each made of three layers of conductors including the oxide film 8*b*, the second conductive film, and the third conductive film changed into conductors. With this configuration, when one of the layers is broken due to pattern defect or the like, the breaking can be compensated by the other two layers, thereby preventing occurrence of breaking defect. Thus, when the drive voltage generation circuit SC as a combination of the plurality of drive TFTs 40, 41, and 42 is disposed in the peripheral region of the TFT substrate 101 as illustrated in FIGS. 1A and 1B, the occurrence of circuit operation defect due to breaking of the drive TFT 40*d* can be significantly reduced.

The following describes the configuration of a liquid crystal display panel including the above-described TFT substrate 101. In the configuration of the liquid crystal display panel, first, an alignment film and a spacer are disposed on the surface of the TFT substrate 101 illustrated in FIG. 1A. The alignment film is a film for arraying liquid crystals and made of, for example, polyimide. Subsequently, a counter substrate (not illustrated) separately prepared and including a color filter and an alignment film is disposed opposite to the TFT substrate 101. In this state, the spacer forms a gap between the TFT substrate 101 and the counter substrate, and liquid crystals are sealed in the gap, thereby producing an in-plane field drive FFS liquid crystal display panel. Lastly, a polarization plate, a wave plate, a backlight unit, and the like are disposed outside of the liquid crystal display panel, which completes an FFS LCD.

(Manufacturing Method)

The following describes a method of manufacturing the TFT substrate 101 according to the second preferred embodiment with reference to the accompanying drawings. FIGS. 27 to 32 are each a sectional process diagram illustrating the method of manufacturing the TFT substrate 101 according to the second preferred embodiment. FIG. 26 is a cross-sectional view illustrating a last process. In FIGS. 27 to 32, a section including the pixel TFT 30*d* corresponds to the section along line X-X' in FIG. 2, and a section including the drive TFT 40*d* corresponds to a section at the position of the section along line Y-Y' in FIG. 3.

First, the transparent insulation substrate 1 made of, for example, glass is cleaned by using cleaning liquid or pure water. In the first preferred embodiment, the substrate 1 is a glass substrate having a thickness of 0.6 mm. Then, the first conductive film, of which gate electrodes and the like are to be made, is formed entirely on one of main surfaces of the substrate 1 thus cleaned. The upper main surface of the substrate 1 is defined to be a main surface on which the gate electrode and the like are provided.

The first conductive film may be made of metal such as Cr, Mo, Ti, Cu, Ta, W, or Al, or alloy containing the metal element as a primary component in addition to at least one other kind of element. In the second preferred embodiment, a Cu film having a thickness of 200 nm is formed as the first conductive film by the sputtering method using Ar gas.

Figure 27:
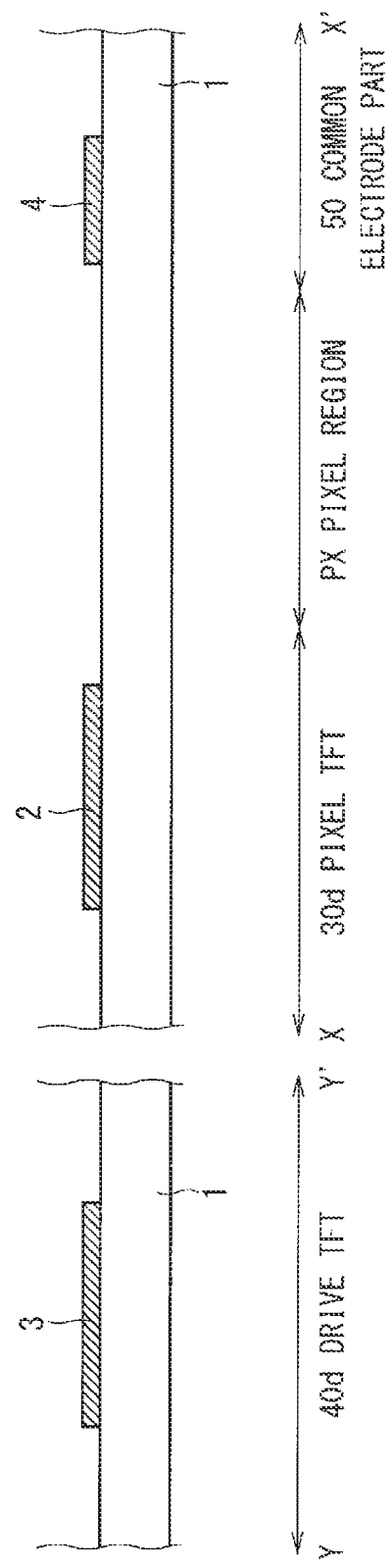
FIGS. 27 to 32 are cross-sectional views each illustrating a process of manufacturing the TFT substrate according to the second preferred embodiment.

Thereafter, photoresist material is applied on the first conductive film, and a photoresist pattern is formed through the first photoengraving process and used as a mask to pattern the first conductive film by etching. In this example, wet etching is performed by using solution including water solution containing ammonium peroxodisulfate at the concentration of 0.3 weight %. Thereafter, the photoresist pattern is removed to form the first gate electrode 2, the second gate electrode 3, and the common electrode 4 made of the first conductive film on the upper main surface of the substrate 1, as illustrated in FIG. 27.

Subsequently, the gate insulation layer 5 made of the first insulating film is formed on the entire upper main surface of the substrate 1 to cover the first gate electrode 2, the second gate electrode 3, and the like. In the second preferred embodiment, the gate insulation layer 5 is formed by depositing a SiN film by the CVD method.

Subsequently, the oxide film 8*a*, of which the second semiconductor layer 13 and the like are to be made, is formed on the gate insulation layer 5. In the second preferred embodiment, similarly to the first preferred embodiment, an InGaZnO film having a thickness of 50 nm is formed by the sputtering method using mixed gas of Ar gas and $O_2$ gas. The InGaZnO film typically has characteristics of an n-type semiconductor having an electron carrier density of $1\times10^{12}/cm^3$ to $1\times10^{19}/cm^3$ inclusive. When the InGaZnO film is formed by the sputtering method, the electron carrier density of the InGaZnO film can be controlled by changing, for example, the mixture ratio of the Ar gas and the $O_2$ gas.

Figure 28:
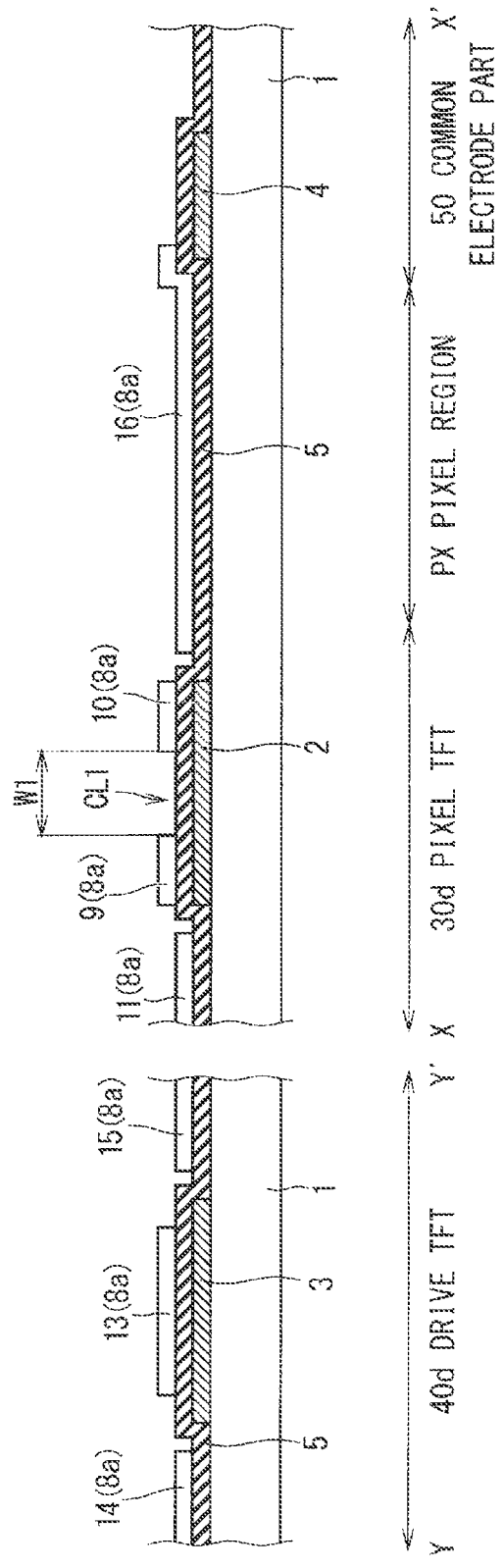

Thereafter, a photoresist pattern is formed through the second photoengraving process and used as a mask to pattern the oxide film 8*a* made of InGaZnO by etching. In this example, wet etching is performed by using solution including water solution containing oxalic acid (dicarboxylic acid) at the concentration of 5 weight %. Thereafter, the photoresist pattern is removed. As illustrated in FIG. 28, in the pixel TFT 30*d*, the source contact layer 9 and the drain contact layer 10 separated from each other with the separation part W1 interposed therebetween are formed on the gate insulation layer 5 in a region overlapping the first gate electrode 2 in plan view. In the drive TFT 40*d*, the second semiconductor layer 13 is formed on the gate insulation layer 5 in a region overlapping the second gate electrode 3 in plan view.

The source contact layer 9 and the drain contact layer 10 are n-type semiconductor, and the source contact layer 9 functions as an ohmic contact layer disposed between the first semiconductor layer 7 and the first source electrode 17 to be described later to connect the first semiconductor layer 7 and the first source electrode 17 at favorable electric property. The drain contact layer 10 functions as an ohmic contact layer disposed between the first semiconductor layer 7 and the first drain electrode 18 to be described later to connect the first semiconductor layer 7 and the first drain electrode 18 at favorable electric property. To sufficiently achieve the functions, the source contact layer 9 and the drain contact layer 10 are preferably made of an n-type semiconductor having an electron carrier density of $1\times10^{12}/cm^3$ to $1\times10^{19}/cm^3$ inclusive. In other words, the specific resistance value is preferably 0.1 $\Omega\cdot$cm to $1\times10^6$ $\Omega\cdot$cm inclusive.

The second semiconductor layer 13 made of InGaZnO and formed on a region overlapping the second gate electrode 3 in the drive TFT 40*d* functions as a semiconductor channel layer of the drive TFT 40*d*. To sufficiently achieve the function, the second semiconductor layer 13 preferably has an electron carrier density of $1\times10^{12}/cm^3$ to $1\times10^{19}/cm^3$ inclusive, similarly to the source contact layer 9 and the drain contact layer 10 described above. In other words, the specific resistance value is preferably 0.1 Ω·cm to $1 \times 10^6$ Ω·cm inclusive. Thus, in the second preferred embodiment, the source contact layer 9, the drain contact layer 10, and the second semiconductor layer 13 can be simultaneously formed through the same process by using the oxide film 8a made of InGaZnO and having the same semiconductor characteristics.

In the second preferred embodiment, as illustrated in FIG. 28, the pattern of the pixel electrode 16 is formed in the pixel region PX by using the oxide film 8a made of InGaZnO through the second photoengraving process. In addition, in the pixel TFT 30d, the pattern of the first source electrode underneath layer wire 11 is formed in a region overlapping the first source electrode 17 to be described later in plan view and a region overlapping the source wire 117 in plan view in FIG. 2. In the drive TFT 40d, the patterns of the second source electrode underneath layer wire 14 and the second drain electrode underneath layer wire 15 are formed in regions overlapping the second source electrode 19 to be described later and the second drain electrode 20 to be described later in plan view, respectively.

Figure 29:
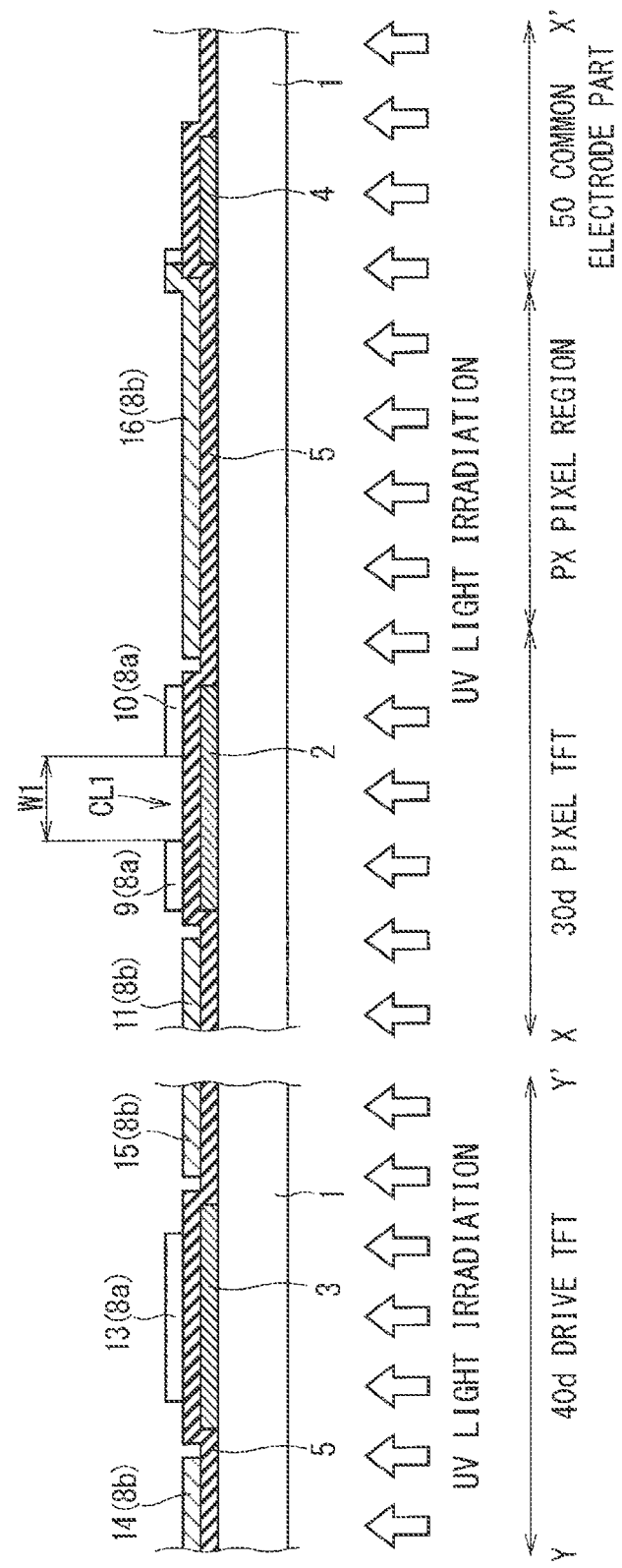

Subsequently, as illustrated in FIG. 29, the entire back surface of the substrate 1 is irradiated with UV light by using, for example, a low-pressure mercury lamp. Through this processing, the pattern regions of the oxide film 8a that are irradiated with UV light having transmitted the substrate 1, in other words, the pixel electrode 16, the first source electrode underneath layer wire 11, the second source electrode underneath layer wire 14, and the second drain electrode underneath layer wire 15 are changed from semiconductors to conductors. Accordingly, the pixel electrode 16, the first source electrode underneath layer wire 11, the second source electrode underneath layer wire 14, and the second drain electrode underneath layer wire 15, which are made of the oxide film 8b having conductive characteristics, are formed through this light irradiation process. In this case, each conductor preferably has a specific resistance value equal to or smaller than $1 \times 10^{-2}$ Ω·cm approximately. In other words, the oxide film 8a such as the InGaZnO film according to the first preferred embodiment preferably has an electron carrier density equal to or larger than $1 \times 10^{19}/\text{cm}^3$.

The oxide film 8a positioned in regions overlapping the first gate electrode 2, the second gate electrode 3, and the common electrode 4 in plan view is shielded from UV light, and thus maintains semiconductor characteristics.

The UV light preferably has an intensity peak in a wavelength region equal to or shorter than 450 nm to efficiently change the oxide film 8a into a conductor. In the second preferred embodiment, the irradiation is performed by using a low-pressure mercury lamp, but a UV light source is not limited thereto. For example, ultraviolet laser light is applicable.

Subsequently, the second conductive film M2, of which a source electrode, a drain electrode, and the like are to be made, is deposited. In the second preferred embodiment, a Cu film having a thickness of 200 nm is formed by the sputtering method using Ar gas.

Figure 30:
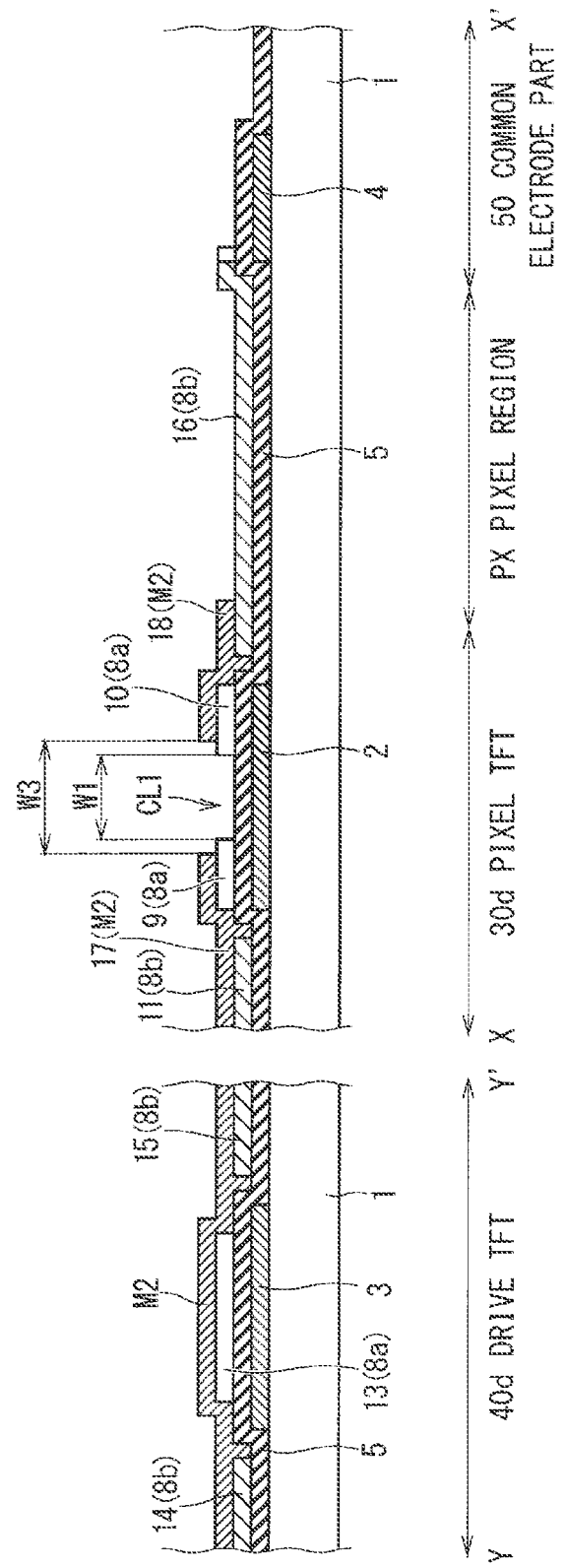

Thereafter, a photoresist pattern is formed through the third photoengraving process and used as a mask to pattern the second conductive film M2 by etching. In this example, similarly to the first conductive film, wet etching is performed by using ammonium peroxodisulfate solution. Thereafter, the photoresist pattern is removed to form the first source electrode 17 and the first drain electrode 18 in the pixel TFT 30d, in particular, as illustrated in FIG. 30.

In the pixel TFT 30d, the first source electrode 17 overlaps the source contact layer 9 in plan view and extends over to the first source electrode underneath layer wire 11. The first drain electrode 18 overlaps the drain contact layer 10 in plan view, is separated from the first source electrode 17 with the separation part W3 interposed therebetween, and extends over to a region partially overlapping the pixel electrode 16.

In the drive TFT 40d, the second conductive film M2 extends over to the second source electrode underneath layer wire 14 and the second drain electrode underneath layer wire 15 from a region partially overlapping the second semiconductor layer 13 in plan view. In this example, the second source electrode 19 and the second drain electrode 20 are not formed in separated shapes.

Figure 31:
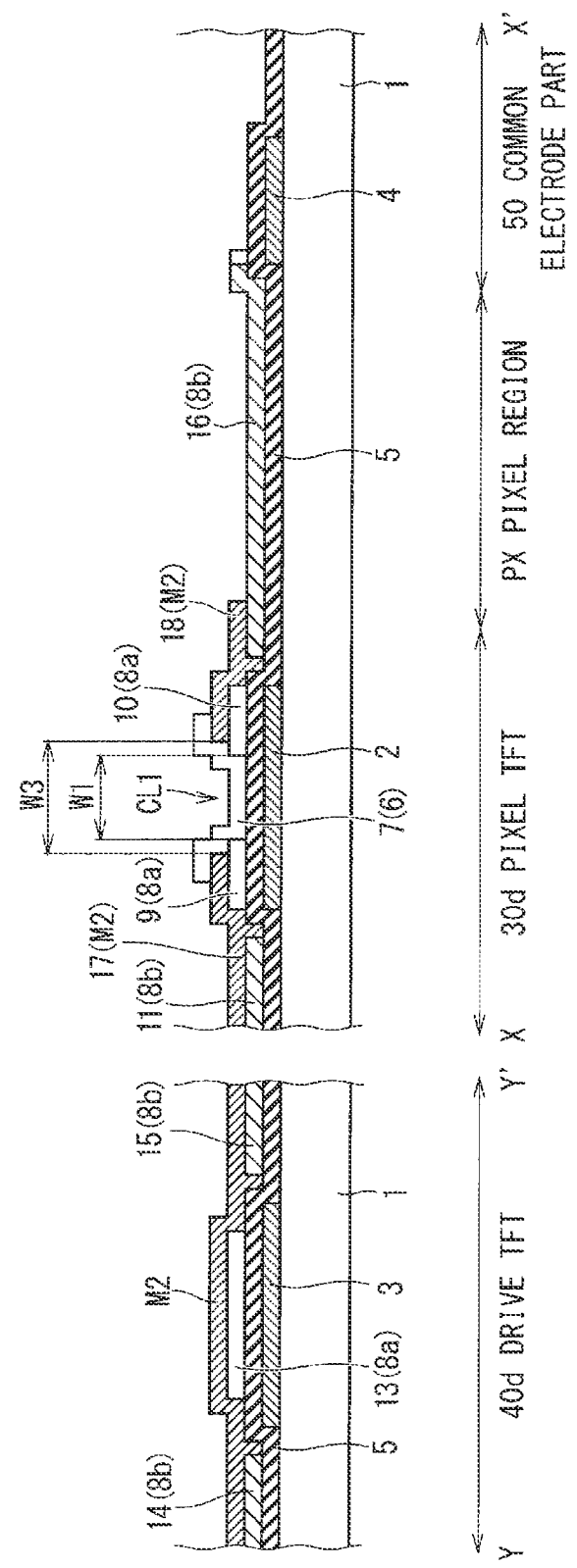

Subsequently, the a-Si film 6 having a thickness of 100 nm is deposited on the substrate 1 by the CVD method. Thereafter, a photoresist pattern is formed through the fourth photoengraving process and used as a mask to pattern the a-Si film 6 by etching. In this example, dry etching is performed by using gas containing $SF_6$ gas and HCl gas. Thereafter, the photoresist pattern is removed to form, in the pixel TFT 30d, the first semiconductor layer 7 made of the a-Si film 6 in a region extending from the separation part W1 across which the source contact layer 9 and the drain contact layer 10 on the gate insulation layer 5 are separated from each other to the source contact layer 9, the drain contact layer 10, part of the first source electrode 17, and part of the first drain electrode 18, as illustrated in FIG. 31.

The first semiconductor layer 7 is electrically connected with the first source electrode 17 through the source contact layer 9. The first semiconductor layer 7 is also electrically connected with the first drain electrode 18 through the drain contact layer 10 and further electrically connected with the pixel electrode 16 through the first drain electrode 18. The separation part W1 between the source contact layer 9 and the drain contact layer 10, and the separation part W3 between the first source electrode 17 and the first drain electrode 18 serve as the first channel region CL1 of the first semiconductor layer 7. The second semiconductor layer 13 of the drive TFT 40d is covered by the second conductive film M2 and never in direct contact with the a-Si film 6. The oxide film 8a having semiconductor characteristics, of which the second semiconductor layer 13 is made, is not changed into a conductor through reduction by hydrogenated amorphous silicon contained in the a-Si film 6.

Subsequently, the second insulating film, of which the protective insulation layer 21 is to be made, is formed on the substrate 1. In the second preferred embodiment, the protective insulation layer 21 is formed by stacking and depositing a SiO film having a thickness of 100 nm and a SiN film having a thickness of 200 nm in the stated order by the CVD method.

Thereafter, a photoresist pattern is formed through the fifth photoengraving process and used as a mask to sequentially pattern the SiO and SiN films of the protective insulation layer 21 and the SiN film of the gate insulation layer 5 by etching. In this example, dry etching is performed by using gas containing $O_2$ in addition to $SF_6$.

Figure 32:
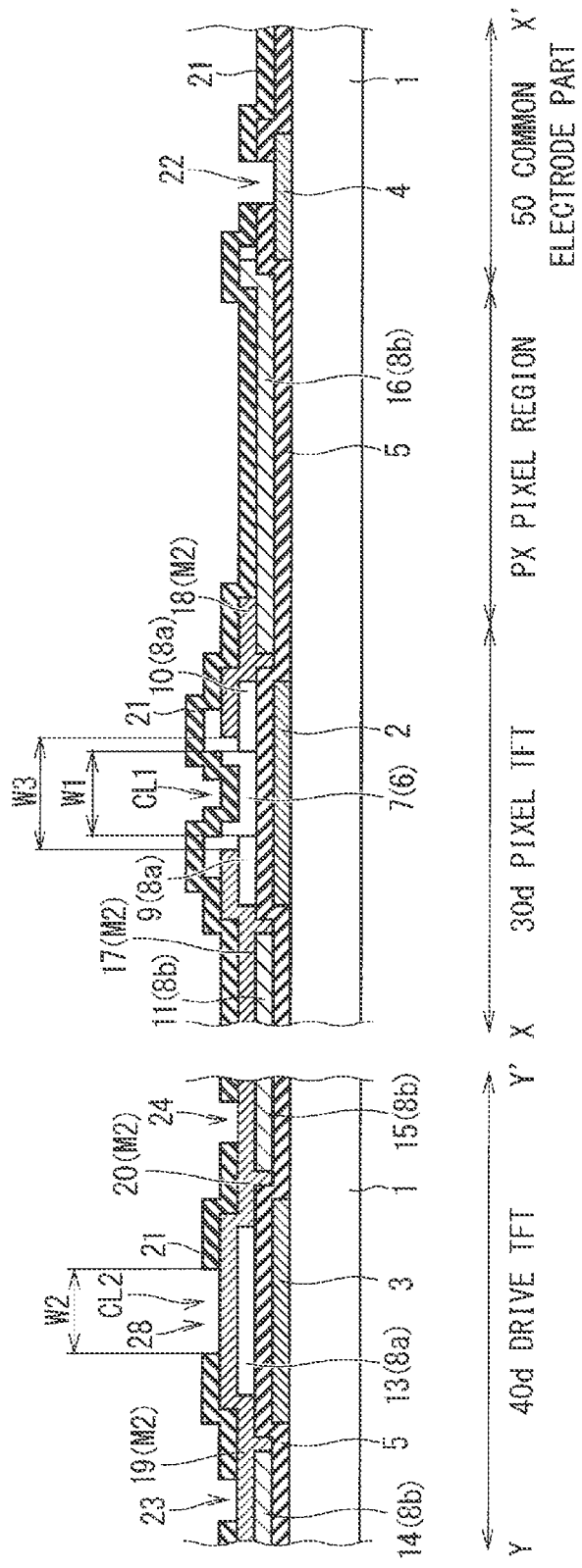

Thereafter, the photoresist pattern is removed to form, in the pixel region PX of the pixel TFT 30d, the common electrode part contact hole 22 through the protective insulation layer 21 and the gate insulation layer 5 so that part of the surface of the common electrode 4 is exposed, as illustrated in FIG. 32. The common electrode part contact hole 22 is disposed in a region overlapping the common electrode 4, but not the pixel electrode 16, in plan view.

In the drive TFT 40d, the first contact hole 23, the second contact hole 24, and the third contact hole 28 are formed through the protective insulation layer 21 so that part of the surface of the second conductive film M2 is exposed. The third contact hole 28 is disposed in a region overlapping the second gate electrode 3 in plan view.

Subsequently, the third conductive film, of which the counter electrode 25 and the like are to be made, is formed on the protective insulation layer 21. In the second preferred embodiment, similarly to the first preferred embodiment, first, an ITO film that is an optically transparent oxide conductive film is deposited as the third conductive film.

Thereafter, a photoresist pattern is formed through the sixth photoengraving process and used as a mask to pattern the ITO film as the third conductive film by etching. In this example, wet etching is performed by using solution containing oxalic acid. Subsequently, wet etching is performed by using solution including water solution containing ammonium peroxodisulfate at the concentration of 0.3 weight % to pattern a partial region of the second conductive film M2 made of Cu. Thereafter, the photoresist pattern is removed to form the translucent counter electrode 25 in the pixel TFT 30d as illustrated in FIG. 26. The counter electrode 25 overlaps the pixel electrode 16 in the pixel region PX on the protective insulation layer 21 in plan view. The counter electrode 25 is connected with the common electrode 4 through the common electrode part contact hole 22.

The counter electrode 25 includes a slit opening SL. With this structure, electric field substantially parallel to the substrate surface is generated above the counter electrode 25 when signal voltage is applied between the pixel electrode 16 and the counter electrode 25. An opening in a comb-teeth shape may be provided in place of the slit opening SL.

In addition, as illustrated in FIG. 26, the third source electrode 26 and the third drain electrode 27 are formed in the drive TFT 40d. The third source electrode 26 is connected with the second source electrode 19 through the first contact hole 23, and the third drain electrode 27 is connected with the second drain electrode 20 through the second contact hole 24. In the third contact hole 28, the third conductive film made of ITO and the second conductive film M2 made of Cu are removed to form the second channel region CL2 including the separation part W2 on the second semiconductor layer 13 made of the oxide film 8a, thereby forming the drive TFT 40d.

To assemble a liquid crystal display panel, first, an alignment film and a spacer are formed on the surface of the TFT substrate 101 illustrated in FIG. 1A. The alignment film is a film for arraying liquid crystals and contains, for example, polyimide. Subsequently, a counter substrate (not illustrated) separately produced and including a color filter and an alignment film is laminated opposite to the TFT substrate 101. In this state, the spacer forms a gap between the TFT substrate 101 and the counter substrate, and liquid crystals are sealed in the gap, thereby producing an in-plane field liquid crystal drive FFS liquid crystal display panel. Lastly, a polarization plate, a wave plate, a backlight unit, and the like are disposed outside of the liquid crystal display panel, which completes an FFS LCD.

(Effects)

As described above, according to the second preferred embodiment, the FFS TFT substrate 101 in which the pixel TFT 30d (first TFT) including a semiconductor layer of the a-Si film 6, and the drive-circuit drive TFT 40d (second TFT) including a semiconductor layer of the oxide film 8a are both formed on the single substrate 1 can be produced through the six photoengraving processes.

In addition, since the a-Si film 6 of the pixel TFT 30d is disposed on the ohmic contact layers of the source contact layer 9 and the drain contact layer 10, the first source electrode 17, and the first drain electrode 18, no ohmic contact layer removal process is needed in a BCE process, and thus the shape and characteristics of a semiconductor channel region of the a-Si film 6 can be uniformly formed. Accordingly, the uniformity of characteristics of the pixel TFT 30d in the pixel region can be improved. No process damage occurs due to the ohmic contact layer removal process, and thus the characteristics and reliability of the pixel TFT 30d can be improved.

In the second preferred embodiment, the second insulating film is a stacked film of a SiO film and a SiN film, but may be a single-layer film of a SiN film, a SiO film, or a SiON film, or a stacked film of two or more layers including a SiN film and a SiO film. In the present preferred embodiment, the first insulating film is a single-layer film of a SiN film, but may be a single-layer film of a SiO film or a SiON film, or a stacked film of two or more layers including a SiN film and a SiO film.

In the manufacturing process according to the second preferred embodiment, the pixel electrode 16, the first source electrode underneath layer wire 11, the second source electrode underneath layer wire 14, and the second drain electrode underneath layer wire 15, which are made of the oxide film 8b, are changed into conductors by irradiating the back surface of the substrate 1 with UV light as illustrated in FIG. 29, but a method of UV light irradiation is not limited thereto. As described above in the first preferred embodiment, a photoresist mask made of photoresist material may be formed and used as a mask to irradiate the surface of the substrate with UV light.

In this case, a new photoengraving process is needed to form the photoresist mask, but direct irradiation of the oxide film 8a with UV light allows more efficient change of the oxide film 8a having semiconductor characteristics into the oxide film 8b having conductive characteristics. In this case, irradiation with UV light or ultraviolet laser light may be replaced with, for example, direct irradiation with $H_2$ plasma or $NH_3$ plasma using reductive $H_2$ gas or $NH_3$ gas containing hydrogen.

As described above, the TFT substrate 101 according to the second preferred embodiment includes: the first gate electrode 2 made of the first conductive film and disposed in the predetermined display region 150 (first region) on the substrate 1; the second gate electrode 3 made of the first conductive film having a composition same as that of the first gate electrode 2 and disposed in the predetermined frame region 160 (second region) on the substrate 1; the gate insulation layer 5 disposed on the substrate 1 to cover the first gate electrode 2 and the second gate electrode 3; the source contact layer 9 (first contact layer) made of the oxide film 8a (oxide) having semiconductor characteristics, and disposed on the gate insulation layer 5, part of the source contact layer 9 overlapping the first gate electrode 2 in plan view; the drain contact layer 10 (second contact layer) made of the oxide film 8a having semiconductor characteristics and a composition same as that of the source contact layer 9, disposed on the gate insulation layer 5, and separated from the source contact layer 9 with the separation part W1 (first separation part) interposed therebetween, part of the drain contact layer 10 overlapping the first gate electrode 2 in plan view; the first source electrode 17 (first electrode) made of the second conductive film and disposed on the source contact layer 9; and the first drain electrode 18 (second electrode) made of the second conductive film having a composition same as that of the first source electrode 17, disposed on the drain contact layer 10, and separated from the first source electrode 17 with the separation part W3 (second separation part) interposed therebetween. The separation part W3 positioned between the first source electrode 17 and the first drain electrode 18 is larger than the separation part W1 positioned between the source contact layer 9 and the drain contact layer 10. The TFT substrate 101 further includes: the first semiconductor layer 7 made of amorphous silicon, disposed over the gate insulation layer 5 exposed in the separation part W1, part of the first source electrode 17, and part of the first drain electrode 18, the first semiconductor layer 7 being disposed in contact with the source contact layer 9 and the drain contact layer 10 exposed in the separation part W3; the second semiconductor layer 13 made of the oxide film 8a having semiconductor characteristics and a composition same as those of the source contact layer 9 and the drain contact layer 10, the second semiconductor 13 being disposed on the gate insulation layer 5 and overlapping the second gate electrode 3 in plan view; the second source electrode 19 (third electrode) made of the second conductive film having a composition same as those of the first source electrode 17 and the first drain electrode 18, part of the second source electrode 19 being disposed in contact with the surface of the second semiconductor layer 13; the second drain electrode 20 (fourth electrode) made of the second conductive film having a composition same as those of the first source electrode 17 and the first drain electrode 18, and disposed separately from the second source electrode 19, part of the first drain electrode 18 being disposed in contact with the surface of the second semiconductor layer 13; and the pixel electrode 16 made of the oxide film 8b having conductive characteristics and a composition same as that of the oxide film 8a of which the source contact layer 9 is made having semiconductor characteristics, the pixel electrode 16 being disposed on the gate insulation layer 5 positioned in the predetermined display region 150 and outside of a region in which the first gate electrode 2 is formed, the pixel electrode 16 being connected with the first drain electrode 18.

With this configuration, the pixel TFT 30d including a channel layer made of amorphous silicon and the drive TFT 40d including a channel layer made of oxide semiconductor can be formed on an identical substrate at low cost. In addition, no ohmic contact layer removal process is needed in a BCE process, thereby achieving formation of a semiconductor channel part made of the a-Si film 6 with the uniformity of the shape and characteristics. Thus, the uniformity of characteristics of the pixel TFT 30d can be improved.

The TFT substrate 101 according to the second preferred embodiment further includes: the protective insulation layer 21 disposed to cover the pixel electrode 16; and the counter electrode 25 made of the third conductive film, disposed on the protective insulation layer 21, and overlapping the pixel electrode 16 in plan view.

With this configuration, the thin film transistor substrate 101 that achieves a simplified manufacturing process and cost reduction can be obtained in usage for an FSS LCD.

The protective insulation layer 21 included in the TFT substrate 101 according to the second preferred embodiment is disposed to cover the second source electrode 19 and the second drain electrode 20, and includes the first contact hole 23 (first opening) through which part of the surface of the second source electrode 19 is exposed, and the second contact hole 24 (second opening) through which part of the surface of the second drain electrode 20 is exposed. The TFT substrate 101 further includes: the third source electrode 26 (fifth electrode) made of the third conductive film having a composition same as that of the counter electrode 25, disposed on the protective insulation layer 21, and connected with the second source electrode 19 through the first contact hole 23; and the third drain electrode 27 (sixth electrode) made of the third conductive film having a composition same as that of the counter electrode 25, disposed on the protective insulation layer 21, and connected with the second drain electrode 20 through the second contact hole 24.

With the above-described configuration, the occurrence of circuit operation defect due to breaking of electrodes and wires can be significantly reduced.

The TFT substrate 101 according to the second preferred embodiment further includes: the pixel TFT 30d (first TFT) disposed in the predetermined display region 150 and including the first gate electrode 2, the gate insulation layer 5, the first semiconductor layer 7, the source contact layer 9, the drain contact layer 10, the first source electrode 17, and the first drain electrode 18; and the drive TFT 40d (second TFT) disposed in the predetermined frame region 160 and including the second gate electrode 3, the gate insulation layer 5, the second semiconductor layer 13, the second source electrode 19, and the second drain electrode 20. The predetermined display region 150 is a region in which a plurality of pixels are arrayed in a matrix on the substrate 1, and the pixel TFT 30d is a pixel-display thin film transistor provided to each pixel in the display region. The predetermined frame region 160 is a region outside of the display region 150, and the drive TFT 40d is a drive-circuit thin film transistor for driving the pixel TFT 30d.

With this configuration, the thin film transistor substrate 101 in which the pixel TFT 30d including a channel layer made of amorphous silicon and the drive TFT 40d including a channel layer made of oxide semiconductor are formed on an identical substrate at low cost can be obtained.

A liquid crystal display device according to the second preferred embodiment includes the thin film transistor substrate 101, the counter substrate disposed opposite to the thin film transistor substrate 101, and a liquid crystal sealed in a gap between the thin film transistor substrate 101 and the counter substrate.

With this configuration, the thin film transistor substrate 101 for a liquid crystal display device, which includes the pixel TFT 30d including a channel layer made of amorphous silicon and the drive TFT 40d including a channel layer made of oxide semiconductor can be achieved and used to provide a small liquid crystal display device having high display quality at low cost.

The method of manufacturing the TFT substrate 101 according to the second preferred embodiment includes: a process of forming the first gate electrode 2 made of the first conductive film and disposed in the predetermined display region 150 on the substrate 1; a process of forming the second gate electrode 3 made of the first conductive film having a composition same as that of the first gate electrode 2 and disposed in the predetermined frame region 160 on the substrate 1; a process of forming the gate insulation layer 5 disposed on the substrate 1 to cover the first gate electrode 2 and the second gate electrode 3; a process of forming the source contact layer 9 (first contact layer) made of the oxide film 8a having semiconductor characteristics and disposed on the gate insulation layer 5, part of the source contact layer 9 overlapping the first gate electrode 2 in plan view; a process of forming the drain contact layer 10 (second contact layer) made of the oxide film 8a having semiconductor characteristics and a composition same as that of the source contact layer 9, disposed on the gate insulation layer 5, and separated from the source contact layer 9 with the separation part W1 (first separation part) interposed therebetween, part of the drain contact layer 10 overlapping the first gate electrode 2 in plan view; a process of forming the first source electrode 17 (first electrode) made of the second conductive film and disposed on the source contact layer 9; and a process of forming the first drain electrode 18 (second electrode) made of the second conductive film having a composition same as that of the first source electrode 17, disposed on the drain contact layer 10, and separated from the first source electrode 17 with the separation part W3 (second separation part) interposed therebetween. The separation part W3 positioned between the first source electrode 17 and the first drain electrode 18 is larger than the separation part W1 positioned between the source contact layer 9 and the drain contact layer 10. The method of manufacturing the TFT substrate 101 further includes: a process of forming the first semiconductor layer 7 made of amorphous silicon, disposed over the surface of the gate insulation layer 5 exposed in the separation part W1, part of the first source electrode 17, and part of the first drain electrode 18, the first semiconductor layer 7 being disposed in contact with the source contact layer 9 and the drain contact layer 10 exposed in the separation part W3; a process of forming the second semiconductor layer 13 made of the oxide film 8a having semiconductor characteristics and a composition same as those of the source contact layer 9 and the drain contact layer 10, the second semiconductor layer 13 being disposed on the gate insulation layer 5 and overlapping the second gate electrode 3 in plan view; a process of forming the second source electrode 19 (third electrode) made of the second conductive film having a composition same as those of the first source electrode 17 and the first drain electrode 18, part of the second source electrode 19 being disposed in contact with the surface of the second semiconductor layer 13; a process of forming the second drain electrode 20 (fourth electrode) made of the second conductive film having a composition same as those of the first source electrode 17 and the first drain electrode 18 and disposed separately from the second source electrode 19, part of the second drain electrode 20 being disposed in contact with the surface of the second semiconductor layer 13; and a process of forming the pixel electrode 16 made of the oxide film 8b having conductive characteristics and a composition same as that of the oxide film 8a of which the source contact layer 9 is made having semiconductor characteristics, the pixel electrode 16 being disposed on the gate insulation layer 5 positioned in the predetermined display region 150 and outside of a region in which the first gate electrode 2 is formed, the pixel electrode 16 being connected with the first drain electrode 18.

With this configuration, the pixel TFT 30d including a channel layer made of amorphous silicon and the drive TFT 40d including a channel layer made of oxide semiconductor can be formed on an identical substrate at low cost.

The semiconductor channel layer of a drive TFT disposed in the peripheral region of a pixel display region is made of an oxide semiconductor film same as that of the ohmic contact layer of a pixel TFT. Thus, according to the method of manufacturing a TFT substrate according to the present preferred embodiment, a high-performance drive TFT having high mobility for a drive circuit can be efficiently formed on an identical substrate together with a pixel TFT.

For example, the TFT substrate described in the present preferred embodiment can be used to achieve a thin film transistor substrate for a liquid crystal display device, which includes a pixel TFT including a channel layer made of amorphous silicon, and a drive TFT including a channel layer made of oxide semiconductor. The thin film transistor substrate can be used to provide a small liquid crystal display device having high display quality at low cost.

In the method of manufacturing the TFT substrate 101 according to the second preferred embodiment, the process of forming the source contact layer 9, the process of forming the drain contact layer 10, the process of forming the second semiconductor layer 13, and the process of forming the pixel electrode 16 each include, after the process of forming the gate insulation layer 5: a process of forming the oxide film 8a made of oxide having semiconductor characteristics on the substrate 1; and a process of patterning the oxide film 8a all at once to form the source contact layer 9, the drain contact layer 10, the second semiconductor layer 13, and the pixel electrode 16. The process of forming the first source electrode 17 and the process of forming the first drain electrode 18 each include, after the process of patterning the oxide film 8a all at once: a process of forming the second conductive film on the substrate 1; and a process of patterning the second conductive film all at once to form the first source electrode 17 and the first drain electrode 18. The process of forming the first semiconductor layer 7 includes, after the process of forming the first source electrode 17 and the process of forming the first drain electrode 18: a process of forming the amorphous silicon film 6 made of amorphous silicon on the substrate 1 while the second semiconductor layer 13 is covered by the second conductive film; and a process of patterning the amorphous silicon film 6 to form the first semiconductor layer 7. The process of forming the second source electrode 19 and the process of forming the second drain electrode 20 each include, after the process of forming the first semiconductor layer 7, a process of further patterning the second conductive film all at once to form the second source electrode 19 and the second drain electrode 20.

With this configuration, no process of selectively removing an ohmic contact layer made of the oxide film 8a and the a-Si film 6 is needed in a BCE process for a-Si channel layer formation, thereby achieving formation of a semiconductor channel part made of the a-Si film 6 with the uniformity of the shape and characteristics. Thus, the uniformity of characteristics of the pixel TFT 30d can be improved.

In the method of manufacturing the TFT substrate 101 according to the second preferred embodiment, the process of forming the first gate electrode 2 and the process of forming the second gate electrode 3 each include a process of forming the first conductive film having light-shielding characteristics on the surface of the substrate 1, and a process of patterning the first conductive film all at once to form the first gate electrode 2 and the second gate electrode 3. The process of forming the pixel electrode 16 further includes, after the process of patterning the oxide film 8a all at once, a process of irradiating the back surface of the substrate 1 with light including ultraviolet.

With this configuration, the pixel electrode 16, the first source electrode underneath layer wire 11, the second source electrode underneath layer wire 14, and the second drain electrode underneath layer wire 15, which are made of the oxide film 8b having conductive characteristics, can be formed in regions irradiated with UV light having transmitted the substrate 1. In addition, the source contact layer 9, the drain contact layer 10, and the second semiconductor layer 13, which are made of the oxide film 8a having semiconductor characteristics, can be formed in regions shielded from UV light. Accordingly, the manufacturing process is simplified.

The method of manufacturing the TFT substrate 101 according to the second preferred embodiment further includes: a process of forming the protective insulation layer 21 disposed to cover the pixel electrode 16; and a process of forming the counter electrode 25 made of the third conductive film, disposed on the protective insulation layer 21, and overlapping the pixel electrode 16 in plan view.

With this configuration, a thin film transistor substrate that achieves a simplified manufacturing process and cost reduction in usage for an FSS LCD can be obtained.

The method of manufacturing the TFT substrate 101 according to the second preferred embodiment further includes: a process of forming the pixel TFT 30d in the predetermined display region 150 on the substrate 1, the process of forming the pixel TFT 30d including the process of forming the first gate electrode 2, the process of forming the gate insulation layer 5, the process of forming the source contact layer 9, the process of forming the drain contact layer 10, the process of forming the first source electrode 17, the process of forming the first drain electrode 18, and the process of forming the first semiconductor layer 7; and a process of forming the drive TFT 40d in the predetermined frame region 160 on the substrate 1, the process of forming the drive TFT 40d including the process of forming the second gate electrode 3, the process of forming the gate insulation layer 5, the process of forming the second semiconductor layer 13, the process of forming the second source electrode 19, and the process of forming the second drain electrode 20. The predetermined display region 150 is the region in which a plurality of pixels arrayed in a matrix on the substrate 1, and the pixel TFT 30d is a pixel-display thin film transistor provided to each pixel in the display region 150. The predetermined frame region 160 is a region outside of the display region 150, and the drive TFT 40d is a drive-circuit thin film transistor for driving the pixel TFT 30d.

With this configuration, the thin film transistor substrate 100 in which the pixel TFT 30d including a channel layer made of amorphous silicon and the drive TFT 40d including a channel layer made of oxide semiconductor are formed on an identical substrate at low cost can be obtained.

First Modification of Second Preferred Embodiment

In the second preferred embodiment, the first source electrode underneath layer wire 11 and the source underneath layer wire 217, which are made of the oxide film 8b having conductive characteristics, are formed underneath a region overlapping the first source electrode 17 or the source wire 117 in plan view, but this configuration may be omitted as appropriate, similarly to the second modification of the first preferred embodiment. Similarly, the second source electrode underneath layer wire 14 and the second drain electrode underneath layer wire 15, which are made of the oxide film 8b having conductive characteristics, are formed underneath the regions overlapping the second source electrode 19 and the second drain electrode 20 in plan view, respectively, but this configuration may be omitted as appropriate.

Second Modification of Second Preferred Embodiment

In the second preferred embodiment, the source contact layer 9 is disposed separately from the patterns of the first source electrode underneath layer wire 11 and the source underneath layer wire 217. The drain contact layer 10 is disposed separately from the pattern of the pixel electrode 16. The second semiconductor layer 13 is disposed separately from the second source electrode underneath layer wire 14 and the second drain electrode underneath layer wire 15.

Figure 33:
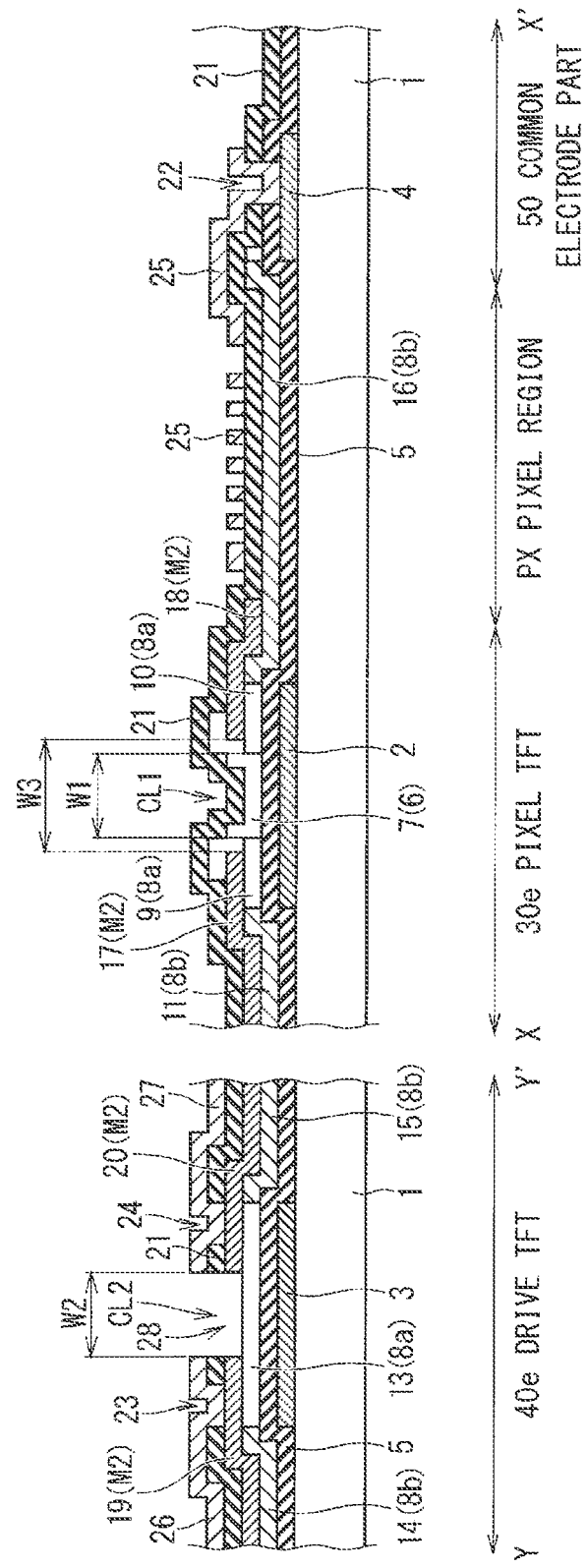
FIG. 33 is a cross-sectional view illustrating part of the configuration of a TFT substrate according to a second modification of the second preferred embodiment.

FIG. 33 is a cross-sectional view of a pixel TFT 30e and a drive TFT 40e disposed on a TFT substrate according to a second modification of the second preferred embodiment. Similarly to the third modification of the first preferred embodiment, the source contact layer 9 made of the oxide film 8a may be formed in a continuously integrated pattern with the first source electrode underneath layer wire 11 or the source underneath layer wire 217 that are made of the oxide film 8b. The drain contact layer 10 made of the oxide film 8a may be formed in a continuously integrated pattern with the pixel electrode 16 made of the oxide film 8b. The second semiconductor layer 13 made of the oxide film 8a may be formed in a continuously integrated pattern with the second source electrode underneath layer wire 14 and the second drain electrode underneath layer wire 15 made of the oxide film 8b.

The pixel electrode 16 included in the TFT substrate according to the second modification of the second preferred embodiment has a pattern extended from and continuously integrated with the drain contact layer 10 made of the oxide film 8a having semiconductor characteristics (second contact layer).

In a method of manufacturing the TFT substrate according to the second modification of the second preferred embodiment, the process of patterning the oxide film 8a all at once or the process of patterning the oxide film 8a and the second conductive film all at once to form the source contact layer 9 (first contact layer), the drain contact layer 10, the second semiconductor layer 13, and the pixel electrode 16, includes patterning the oxide film 8a so that the pixel electrode 16 is extended from and continuously integrated with the drain contact layer 10.

With this configuration, any necessary region of the oxide film 8a can be selectively changed into a conductor.

Third Modification of Second Preferred Embodiment

The above-described FFS TFT substrate 101 according to the second preferred embodiment has a configuration in which the pixel TFT 30d (first TFT) including a semiconductor layer of the a-Si film 6 and the drive-circuit drive TFT 40d (second TFT) including a semiconductor layer of the oxide film 8a are both disposed on the single substrate 1. Similarly to the TFT substrate 100 described in the fourth modification of the first preferred embodiment, the TFT substrate 101 can be manufactured through five photoengraving processes including a halftone process.

(Configurations of Pixel TFT and Drive TFT)

The configurations of a pixel TFT and a drive TFT formed on a TFT substrate according to a third modification of the second preferred embodiment will be described below in detail with reference to the accompanying drawings.

FIGS. 14 and 15 are diagrams illustrating the planar configurations of the pixel TFT 30 and the drive TFT 40, respectively, according to the fourth modification of the first preferred embodiment. A pixel TFT 30f and a drive TFT 40f according to the third modification of the second preferred embodiment have the same planar configurations. Although described later, the pixel TFT 30f has a planar external configuration substantially same as that of the pixel TFT 30 illustrated in FIG. 14 except for the top-bottom positional relation between the first semiconductor layer 7 and the first source electrode 17 and the top-bottom positional relation between the first semiconductor layer 7 and the first drain electrode 18.

Figure 34:
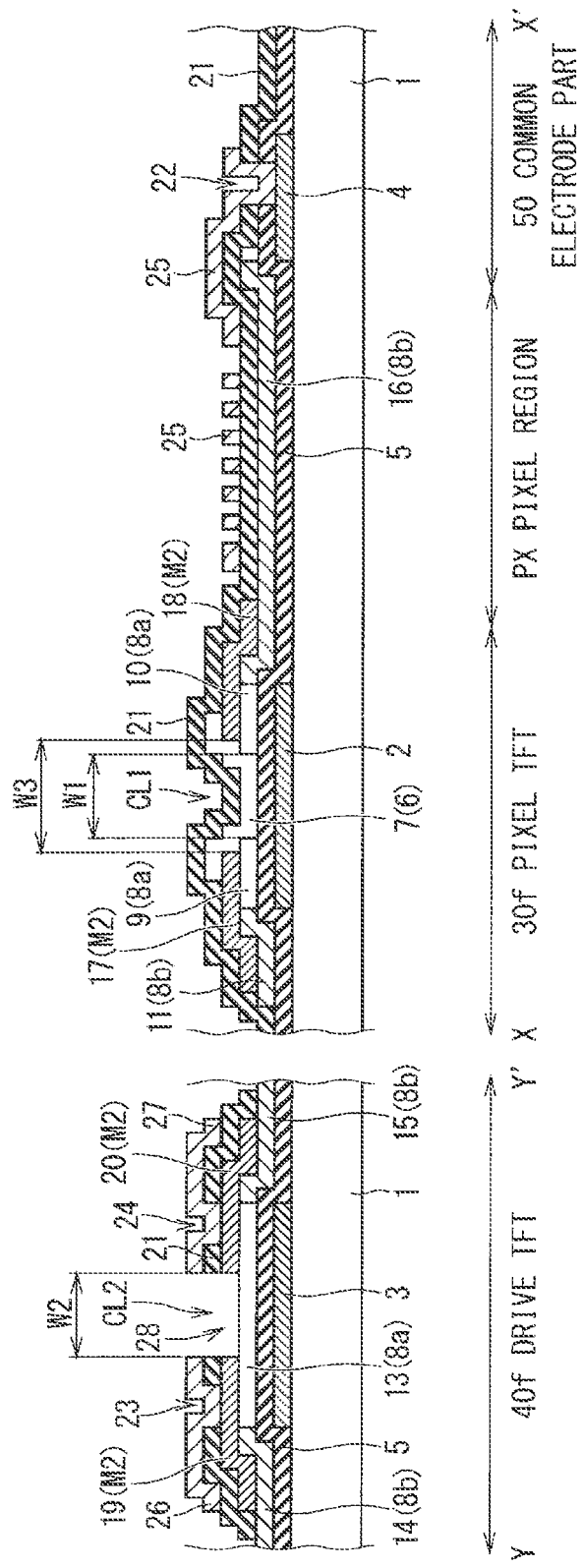
FIG. 34 is a cross-sectional view illustrating part of the configuration of a TFT substrate according to the third modification of the second preferred embodiment.

FIG. 34 is a cross-sectional view illustrating part of the configuration of the TFT substrate according to the third modification of the second preferred embodiment. FIG. 34 is a cross-sectional view illustrating sectional structures along line X-X' illustrated in FIG. 14 and line Y-Y' illustrated in FIG. 15. The following describes the configurations of the pixel TFT 30f and the drive TFT 40f with reference to FIGS. 14, 15, and 34.

One of large structural differences between the above-described TFT substrate according to the second preferred embodiment and the TFT substrate according to the third modification includes the shapes of the source contact layer 9 and the drain contact layer 10 included in the pixel TFT 30f and the shape of the second semiconductor layer 13 included in the drive TFT 40f.

Specifically, in the pixel TFT 30f, according to the second preferred embodiment, the source contact layer 9 made of the oxide film 8a is formed in a pattern separated from the first source electrode underneath layer wire 11 or the source underneath layer wire 217 that are made of the oxide film 8b, as illustrated in FIG. 2 in plan view. Similarly, the drain contact layer 10 made of the oxide film 8a is formed in a pattern separated from the pixel electrode 16 made of the oxide film 8b.

However, in the pixel TFT 30f included in the TFT substrate according to the third modification, as illustrated in FIG. 14 or 34, the source contact layer 9 made of the oxide film 8a is formed in a continuously integrated pattern with the first source electrode underneath layer wire 11 or the source underneath layer wire 217 that are made of oxide film 8b. The drain contact layer 10 made of the oxide film 8a is formed in a pattern continuously integrated with the pixel electrode 16 made of the oxide film 8b. In these continuously integrated oxide film patterns, the oxide film 8b positioned in a region outside of the pattern of the first gate electrode 2 has conductive characteristics and serves as the first source electrode underneath layer wire 11 and the pixel electrode 16. In the oxide film patterns, the oxide film 8a positioned inside of the first gate electrode 2 has semiconductor characteristics and serves as the source contact layer 9 and the drain contact layer 10. The source contact layer 9 and the drain contact layer 10 are separated from each other at distance with the separation part W1 interposed therebetween in a region overlapping the first gate electrode 2 in plan view.

In the third modification of the second preferred embodiment, the first source electrode 17 and the source wire 117 are formed on the source contact layer 9 and on the first source electrode underneath layer wire 11 or the source underneath layer wire 217, in shapes substantially same as those of the layer and wire in plan view with outer edges positioned slightly inside. A partial region of the first drain electrode 18 is formed on the drain contact layer 10, in a shape substantially same as that of the layer in plan view with outer edges positioned slightly inside. The partial region of the first drain electrode 18 overlaps part of the pixel electrode 16 in plan view but is not formed outside of the pixel electrode 16. In a region overlapping the first gate electrode 2 in plan view, the first source electrode 17 and the first drain electrode 18 overlap the source contact layer 9 and the drain contact layer 10, respectively, in plan view and are formed to have the separation part W3 larger than the separation part W1 therebetween.

The first semiconductor layer 7 made of the a-Si film 6 is formed on the separation part W1 across which the source contact layer 9 and the drain contact layer 10 are separated from each other on the gate insulation layer 5, and is formed over the source contact layer 9, the drain contact layer 10, part of the first source electrode 17, and part of the first drain electrode 18. In the separation part W1 and the separation part W3, the first semiconductor layer 7 functions as the first channel region CL1 of the pixel TFT 30f.

In the drive TFT 40d according to the second preferred embodiment, as illustrated in FIG. 26, the second semiconductor layer 13 made of the oxide film 8a is formed separately from the second source electrode underneath layer wire 14 and the second drain electrode underneath layer wire 15. However, in the drive TFT 40f according to the third modification of the second preferred embodiment, as illustrated in FIG. 34, the second semiconductor layer 13 is formed in a continuously integrated pattern with the second source electrode underneath layer wire 14 and the second drain electrode underneath layer wire 15. In this continuously integrated pattern, a region outside of the pattern of the second gate electrode 3 is changed into a conductor, and functions as the second source electrode underneath layer wire 14 and the second drain electrode underneath layer wire 15. A region inside the second gate electrode 3 remains as semiconductor and functions as the second semiconductor layer 13 of the drive TFT 40f.

The second source electrode 19 and the second drain electrode 20 are formed separately from each other on the pattern in which the second semiconductor layer 13, the second source electrode underneath layer wire 14, and the second drain electrode underneath layer wire 15 are continuously integrated, in shapes substantially same as those of the layer and wires in plan view with outer edges positioned slightly inside.

The protective insulation layer 21 made of the second insulating film is disposed to cover the first channel region CL1, the first source electrode 17, the first drain electrode 18, and the pixel electrode 16 of the pixel TFT 30f, and the second channel region CL2, the second source electrode 19, and the second drain electrode 20 of the drive TFT 40f, and the like.

The common electrode part contact hole 22 is opened through the protective insulation layer 21 and the gate insulation layer 5 therebelow so that part of the surface of the common electrode 4 is exposed in the pixel region PX. The common electrode part contact hole 22 is disposed in a region overlapping the common electrode 4, but not the pixel electrode 16, in plan view.

In addition, the counter electrode 25 made of the third conductive film is formed to overlap the pixel electrode 16 in the pixel region PX on the protective insulation layer 21 in plan view. In the third modification of the second preferred embodiment, the counter electrode 25 has a continuous shape connecting a plurality of pixel regions surrounded by the gate wires 102 and the source wires 117 in plan view. The counter electrode 25 is connected with the common electrode 4 through the common electrode part contact hole 22. Accordingly, a constant common potential signal from the common electrode 4 is applied to the counter electrode 25.

The counter electrode 25 includes a slit opening SL. With this structure, electric field substantially parallel to the substrate surface is generated above the counter electrode 25 when signal voltage is applied between the pixel electrode 16 and the counter electrode 25. Thus, the TFT substrate 100 is applicable to an FFS LCD having in-plane field drive specifications. An opening in a comb-teeth shape may be provided in place of the slit opening SL.

In the drive TFT 40f, the first contact hole 23 is opened through the protective insulation layer 21 so that part of the surface of the second source electrode 19 is exposed in a region overlapping the second source electrode 19 in plan view, and the second contact hole 24 is opened through the protective insulation layer 21 so that part of the surface of the second drain electrode 20 is exposed in a region overlapping the second drain electrode 20 in plan view. In addition, the third source electrode 26 and the third drain electrode 27 made of the third conductive film are disposed in regions overlapping the second source electrode 19 and the second drain electrode 20 in plan view, respectively. The third source electrode 26 is connected with the second source electrode 19 through the first contact hole 23, and the third drain electrode is connected with the second drain electrode 20 through the second contact hole 24.

A third contact hole 28 is opened in a region for the second channel region CL2 on the protective insulation layer 21. The third contact hole 28 has a width equal to that of the separation part W2, separates the second source electrode 19 and the second drain electrode 20 from each other, and also separates the third source electrode 26 and the third drain electrode 27 from each other. Accordingly, the second semiconductor layer 13 functions as a channel layer of the second channel region CL2.

As described above, the source and drain electrodes included in the drive TFT 40f are each made of three layers of the oxide film 8b, the second conductive film, and the third conductive film changed into conductors. With this configuration, when one of the layers is broken due to pattern defect or the like, the breaking can be compensated by the other two layers, thereby preventing occurrence of breaking defect. Thus, when the drive voltage generation circuit SC as a combination of the plurality of drive TFTs 40, 41, and 42 is disposed in the peripheral region of the TFT substrate 100 as illustrated in FIGS. 1A and 1B, the occurrence of circuit operation defect due to breaking of the drive TFT can be significantly reduced.

(Manufacturing Method)

The following describes a method of manufacturing the TFT substrate according to the third modification of the second preferred embodiment with reference to the accompanying drawings. FIGS. 35 to 43 are each a sectional process diagram illustrating the method of manufacturing the TFT substrate according to the third modification of the second preferred embodiment. FIG. 34 is a cross-sectional view illustrating a last process. In each process diagram, line X-X' and line Y-Y' correspond to sections taken along line X-X' illustrated in FIG. 14 and line Y-Y' illustrated in FIG. 15, respectively.

First, the transparent insulation substrate 1 made of, for example, glass is cleaned by using cleaning liquid or pure water. In the third modification, the substrate 1 is a glass substrate having a thickness of 0.6 mm. Then, the first conductive film, of which gate electrodes and the like are to be made, is formed entirely on one of main surfaces of the substrate 1 thus cleaned. An upper main surface of the substrate 1 is defined to be a main surface on which the gate electrode and the like are provided.

The first conductive film may be made of metal such as Cr, Mo, Ti, Cu, Ta, W, or Al, or alloy containing the metal element as a primary component in addition to at least one other kind of element. The primary component element is an element in a largest contained amount among elements contained in the alloy. The first conductive film may have a laminated structure including two or more layers made of the metals and the alloy. When the metals and alloy are used, a low-resistance conductive film having a specific resistance value of 50 μΩcm or smaller can be obtained. In the third modification, a Cu film having a thickness of 200 nm is formed as the first conductive film by the sputtering method using Ar gas.

Figure 35:
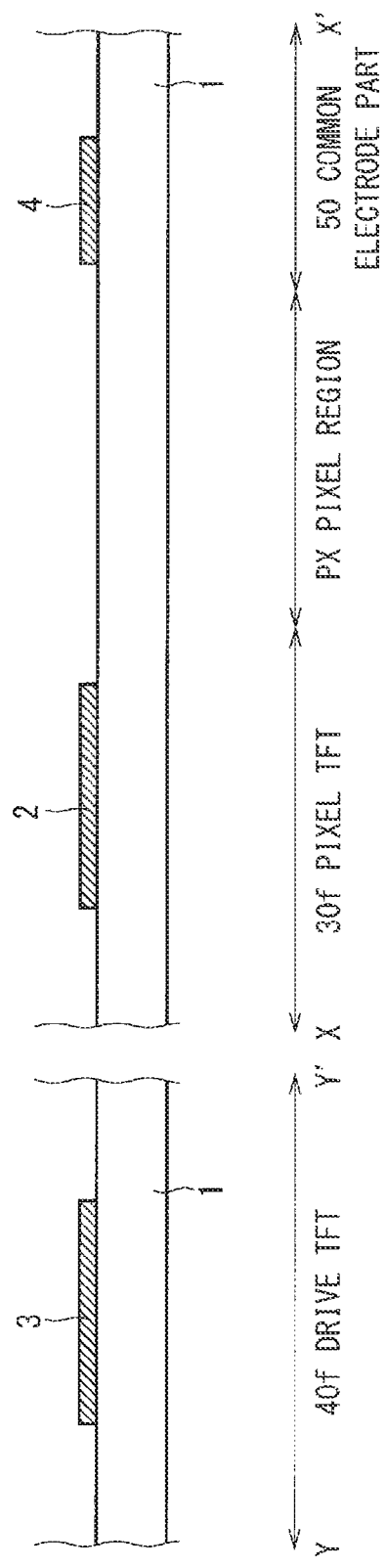

Thereafter, photoresist material is applied on the first conductive film, and a photoresist pattern is formed through the first photoengraving process and used as a mask to pattern the first conductive film by etching. In this example, wet etching is performed by using solution including water solution containing ammonium peroxodisulfate at the concentration of 0.3 weight %. Thereafter, the photoresist pattern is removed to form the first gate electrode 2, the second gate electrode 3, and the common electrode 4 on the upper main surface of the substrate 1 as illustrated in FIG. 35.

Subsequently, the gate insulation layer 5 made of the first insulating film is deposited on the entire upper main surface of the substrate 1 to cover the first gate electrode 2, the second gate electrode 3, and the like, and then the oxide film 8a of which the second semiconductor layer 13 and the like are to be made, and the second conductive film M2, of which a source electrode, a drain electrode, and the like are to be made, are sequentially deposited.

In the third modification of the second preferred embodiment, similarly to the second preferred embodiment, an InGaZnO film having a thickness of 50 nm is deposited as the oxide film 8a by the sputtering method using mixed gas of Ar gas and $O_2$ gas. The InGaZnO film typically has characteristics of an n-type semiconductor having an electron carrier density of $1\times10^{12}/cm^3$ to $1\times10^{19}/cm^3$ inclusive. When the InGaZnO film is formed by the sputtering method, the electron carrier density of the InGaZnO film can be controlled by changing, for example, the mixture ratio of the Ar gas and the $O_2$ gas. A Cu film having a thickness of 200 nm is deposited as the second conductive film M2 by the sputtering method using Ar gas.

Figure 36:
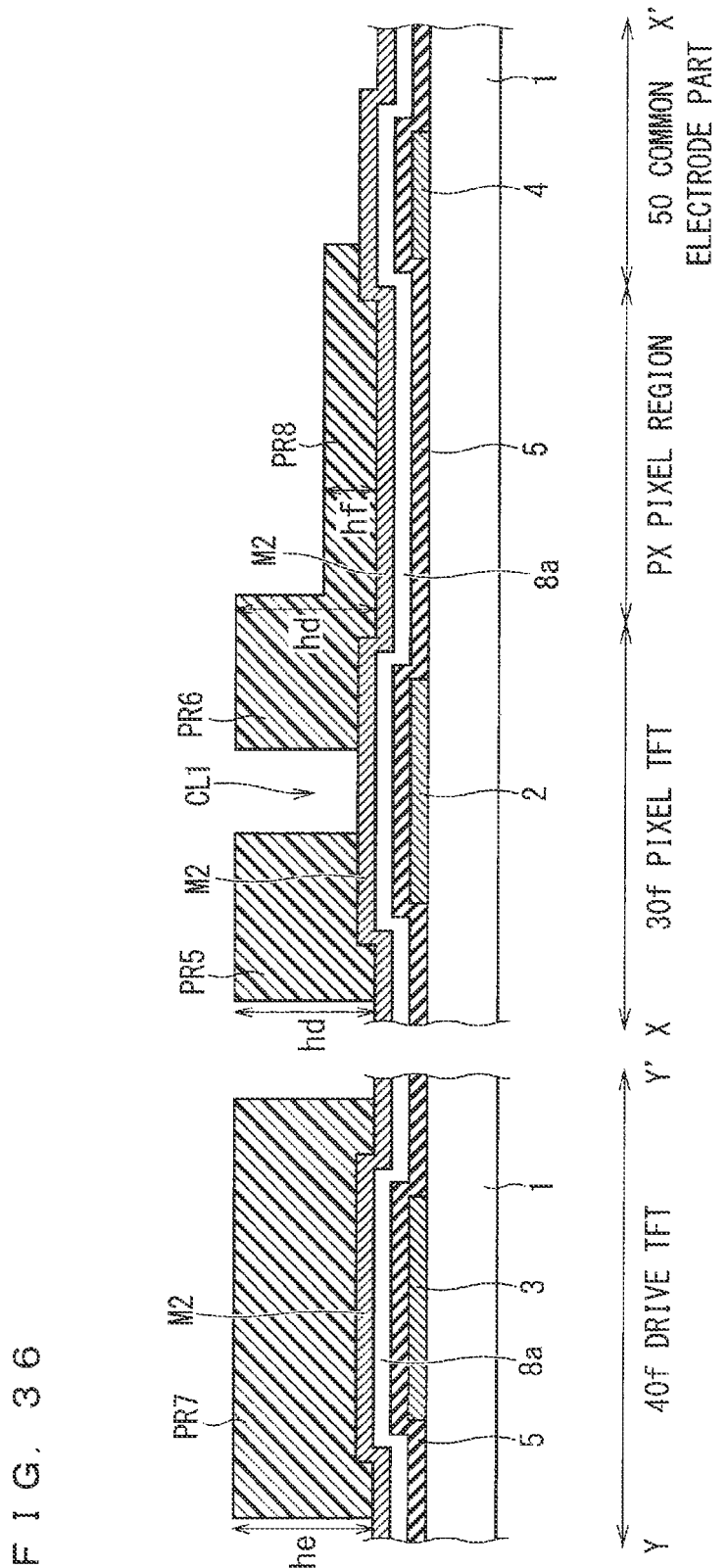

Then, a photoresist pattern is formed by patterning, through a photolithography process, the photoresist applied and formed through the second photoengraving process. As illustrated in FIG. 36, the photoresist pattern includes a photoresist pattern PR5 as a first region having a thickness hd, a photoresist pattern PR6 as a second region having the thickness hd, and a photoresist pattern PR7 as a third region having a thickness he. A region across which the photoresist pattern PR5 and the photoresist pattern PR6 are separated from each other corresponds to the first channel region CL1 of the pixel TFT 30f. The photoresist pattern PR7 corresponds to a formation region of the drive TFT 40f. The photoresist pattern PR6 includes a photoresist pattern PR8 as the pixel region PX having a thickness hf, and the photoresist pattern PR6 and the photoresist pattern PR8 are formed in a continuously integrated shape.

The thickness hd of the photoresist patterns PR5 and PR6 and the thickness he of the photoresist pattern PR7 are set to be larger than the thickness hf of the photoresist pattern PR8. Specifically, in the third modification of the second preferred embodiment, the photoresist patterns are formed so that the thicknesses hd and he are equal to 2.5 μm approximately and the thickness hf is equal to 1.0 μm approximately. A slight thickness difference is allowable in each of the photoresist patterns PR5, PR6, PR7, and PR8. Such a difference occurs due to the surficial shape of a surface on which a photoresist layer is formed, and has a size substantially equal to the thickness of the first conductive film, for example.

The photoresist pattern having a plurality of thicknesses as illustrated in FIG. 36 can be formed by first applying and forming, for example, positive photoresist containing novolak resin on the second conductive film M2 of the substrate 1 so that a desired maximum film thickness (in the above-described example, 2.5 µm) is obtained, and then controlling, at multiple stages, an exposure amount at photoresist exposure in a photolithography process. Specifically, at the photoresist exposure, regions corresponding to the photoresist patterns PR5, PR6, and PR7 are shielded from exposure light, a region corresponding to the photoresist pattern PR8 is irradiated with exposure light at reduced intensity, and the other region is directly irradiated with exposure light. Thereafter, when resist development processing is executed, the photoresist is completely removed in the region directly irradiated with exposure light, remains at the maximum film thickness in the shielded region, and has a reduced film thickness in the region irradiated with reduced light. This exposure control at multiple stages may be performed by any well-known photolithography process using a gray-tone or halftone photomask.

Figure 37:
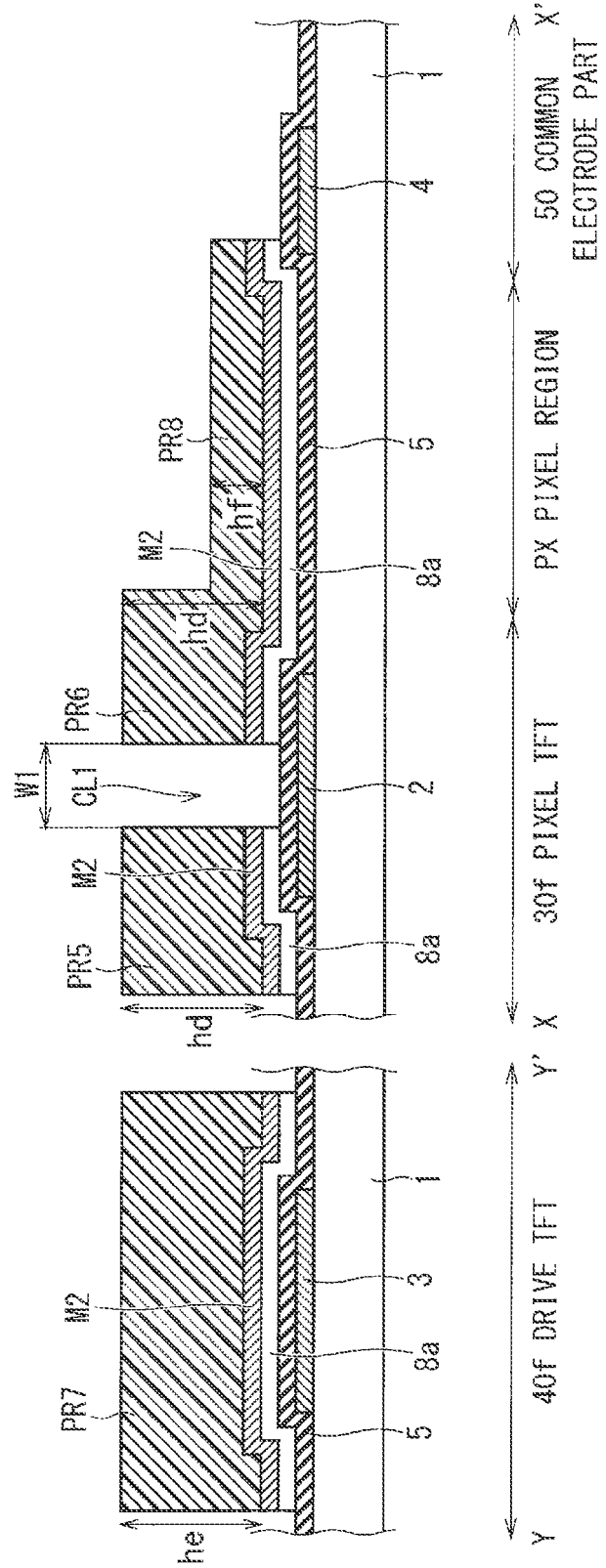

Subsequently, as illustrated in FIG. 37, the photoresist patterns PR5, PR6, PR7, and PR8 are used as masks to pattern the second conductive film M2 and the oxide film 8a by etching. First, wet etching is performed by using solution including water solution containing ammonium peroxodisulfate at the concentration of 0.3 weight % to etch the second conductive film M2 made of Cu. Subsequently, wet etching is performed by using solution including water solution containing oxalic acid (dicarboxylic acid) at the concentration of 5 weight % to etch the oxide film 8a made of InGaZnO. Accordingly, in the pixel TFT 30f, in particular, the second conductive film M2 and the oxide film 8a on the gate insulation layer 5 are removed to form the separation part W1 in the first channel region CL1 in a region overlapping the first gate electrode 2 in plan view.

Figure 38:
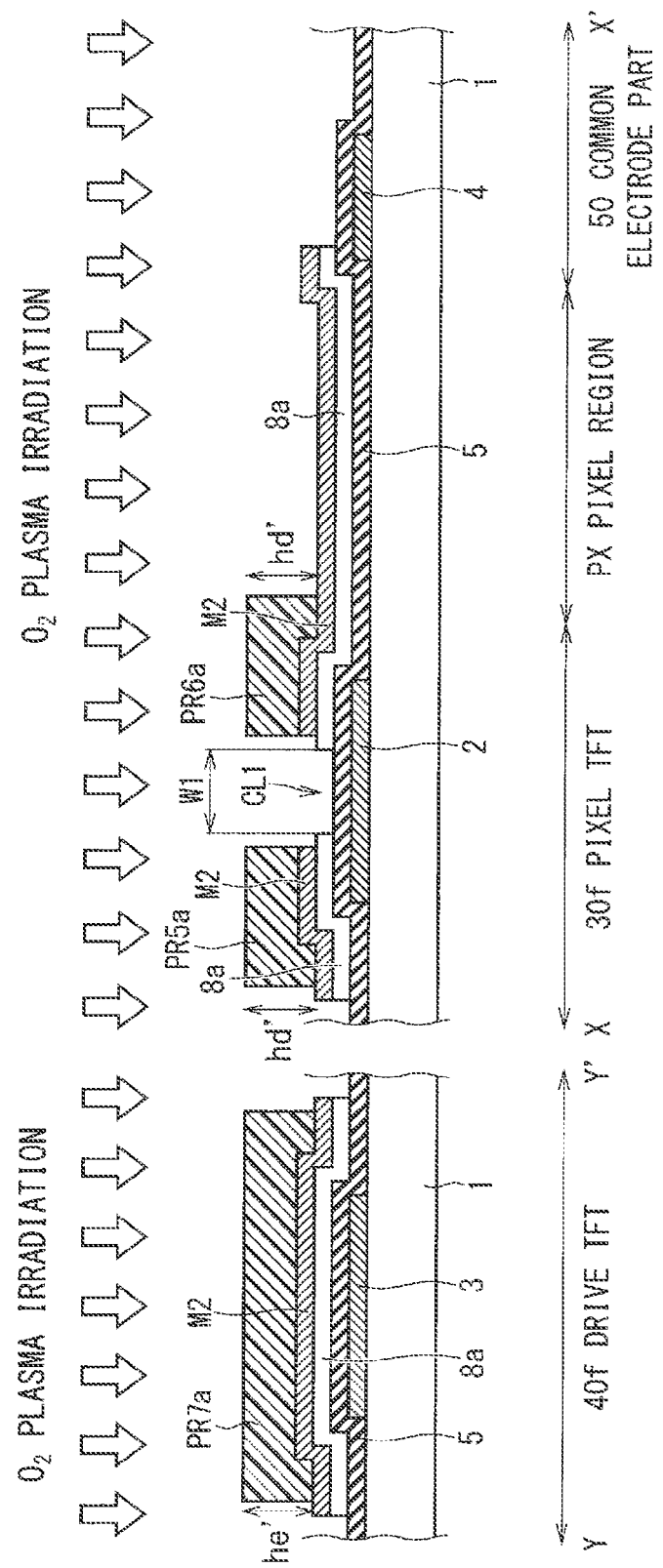

In addition, as illustrated in FIG. 38, ashing is performed on the entire resist by irradiating the entire substrate 1 with $O_2$ plasma, thereby reducing thickness. Accordingly, the photoresist pattern PR8 in a region having a small thickness is completely removed. Simultaneously, thickness is reduced so that the photoresist patterns PR5, PR6, and PR7 in regions having large thicknesses remain as new photoresist patterns PR5a and PR6a having a thickness hd' and a new photoresist pattern PR7a having a thickness he', respectively. Simultaneously with the thickness reduction by ashing, the new photoresist patterns PR5a, PR6a, and PR7a have entire outer edges retracted inward in plan view and have shapes in reduced sizes as compared to the original photoresist patterns PR5, PR6, and PR7.

Figure 39:
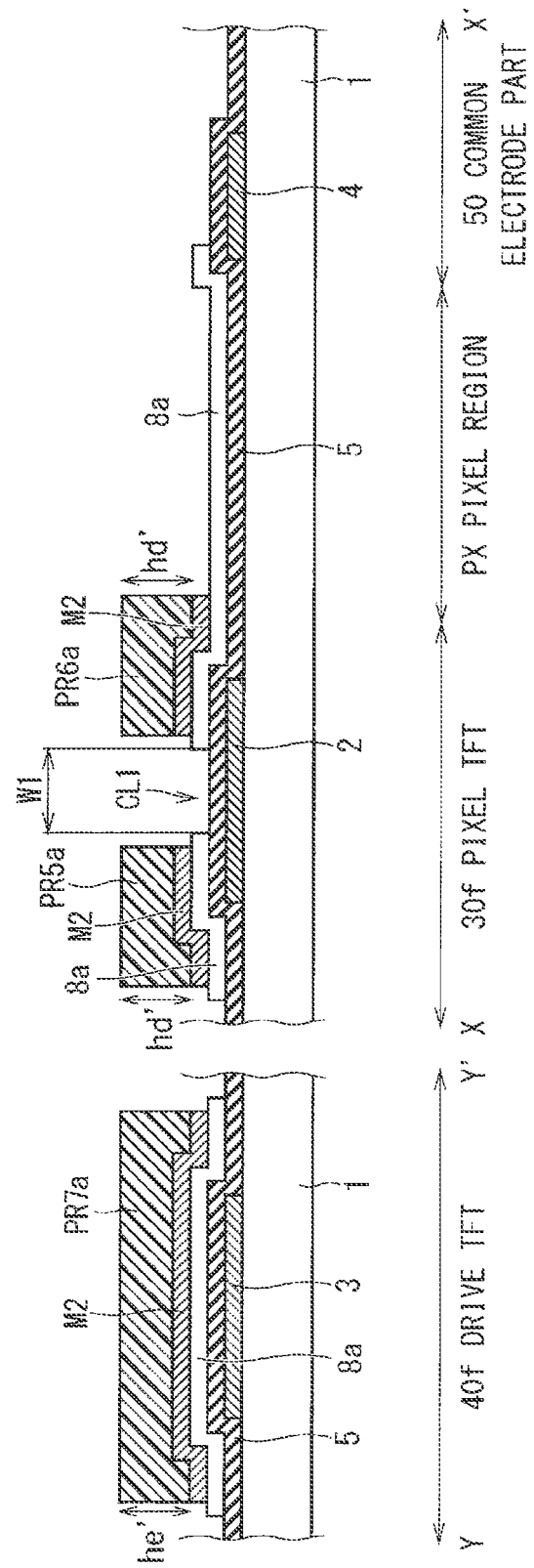

Subsequently, as illustrated in FIG. 39, the photoresist patterns PR5a. PR6a, and PR7a are used as masks to selectively pattern the second conductive film M2 only by etching. In this example, wet etching is performed by using solution including water solution containing ammonium peroxodisulfate at the concentration of 0.3 weight %.

Figure 40:
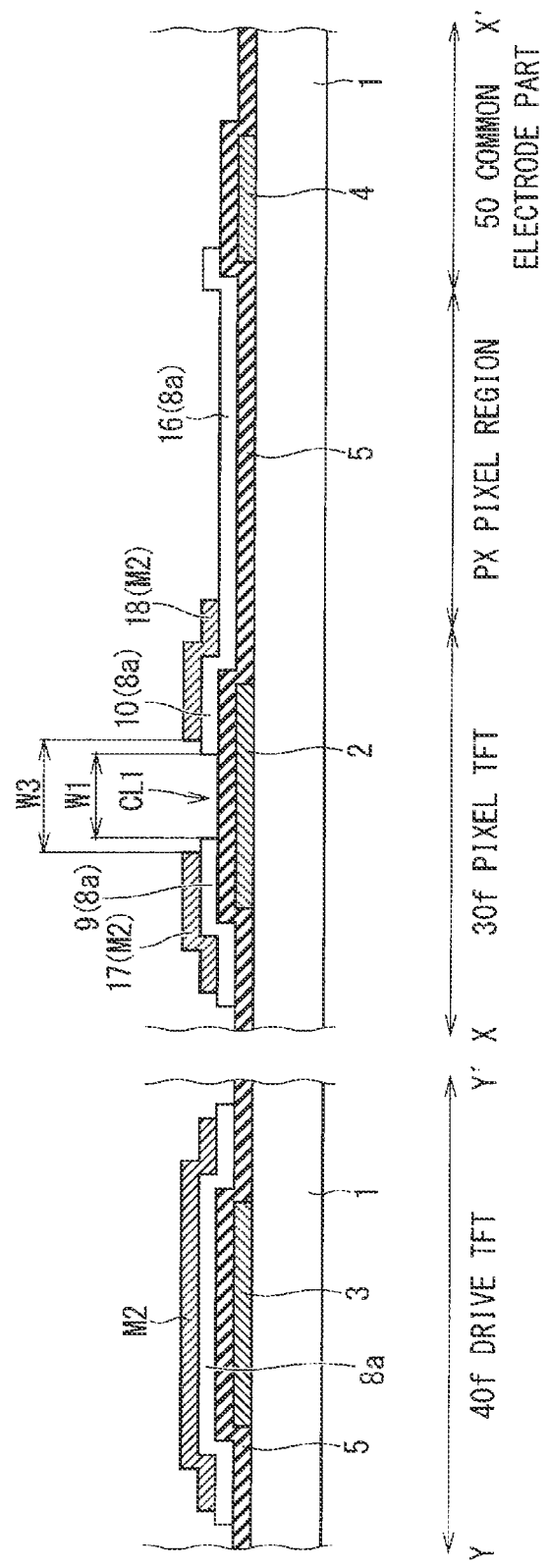

Thereafter, in the pixel TFT 30f, in particular the photoresist pattern is removed to form the first source electrode 17 and the first drain electrode 18 made of the second conductive film M2, and the source contact layer 9 and the drain contact layer 10 made of the oxide film 8a, as illustrated in FIG. 40.

The first source electrode 17 and the first drain electrode 18 formed by patterning the second conductive film M2 have outer edges retracted inward, in plan view, from the pattern outer edges of the source contact layer 9 and the drain contact layer 10 made of the oxide film 8a therebelow. Accordingly, in the third modification of the second preferred embodiment, these pattern outer edges have end parts in stepped shape as illustrated in FIG. 40.

In the first channel region CL1 in a region overlapping the first gate electrode 2 in plan view, the source contact layer 9 and the drain contact layer 10 on the gate insulation layer 5 separated from each other at distance with the separation part W1 interposed therebetween. The first source electrode 17 and the first drain electrode 18 overlap the source contact layer 9 and the drain contact layer 10 in plan view and are formed to have the separation part W3 larger than the separation part W1 therebetween.

In the pixel region PX positioned next to the pixel TFT 30f, the second conductive film M2 as an upper layer is removed, and the pattern of the pixel electrode 16, which is continuously integrated with the pattern of the drain contact layer 10 made of the oxide film 8a, is formed.

In the drive TFT 40f, the outer edges of laminated body patterns made of the oxide film 8a and the second conductive film M2 have end parts in stepped shape.

Subsequently, as illustrated in FIG. 41, the entire back surface of the substrate 1 is irradiated with UV light by using, for example, a low-pressure mercury lamp. Through this processing, the pattern regions of the oxide film 8a that are irradiated with UV light having transmitted the substrate 1, in other words, the regions of the first source electrode underneath layer wire 11, the source underneath layer wire 217 (not illustrated in FIG. 41), and the pixel electrode 16 in the pixel TFT 30f, and the regions of the second source electrode underneath layer wire 14 and the second drain electrode underneath layer wire 15 in the drive TFT 40f are changed from semiconductors to conductors. Accordingly, the pixel electrode 16, the first source electrode underneath layer wire 11, the second source electrode underneath layer wire 14, and the second drain electrode underneath layer wire 15, which are made of the oxide film 8b having conductive characteristics, are formed through this light irradiation process. In this case, each conductor preferably has a specific resistance value equal to or smaller than $1 \times 10^{-2}$ Ω·cm approximately. In other words, the oxide film 8a such as the InGaZnO film according to the third modification of the second preferred embodiment preferably has an electron carrier density equal to or larger than $1 \times 10^{19}/cm^3$.

The oxide film 8a positioned in regions overlapping the first gate electrode 2, the second gate electrode 3, and the common electrode 4 in plan view is shielded from UV light, and thus maintains semiconductor characteristics. Specifically, the oxide film 8a of which the source contact layer 9 and the drain contact layer 10 positioned in regions overlapping the first gate electrode 2 in plan view are made maintains semiconductor characteristics. The oxide film 8a of which the second semiconductor layer 13 positioned in a region overlapping the second gate electrode 3 in plan view is made maintains semiconductor characteristics.

The oxide film 8a in a region overlapping the first gate electrode 2 in plan view functions as the source contact layer 9 and the drain contact layer 10 of the pixel TFT 30f, and the oxide film 8a in a region overlapping the second gate electrode 3 in plan view functions as the second semiconductor layer 13 of the drive TFT 40f.

The UV light preferably has an intensity peak in a wavelength region equal to or shorter than 450 nm to efficiently change the oxide film 8a into a conductor. In the third modification, the irradiation is performed by using a low-pressure mercury lamp, but a UV light source is not limited thereto. For example, ultraviolet laser light is applicable.

Subsequently, an a-Si film having a thickness of 100 nm is deposited on the substrate 1 by the CVD method. Thereafter, a photoresist pattern is formed through the third photoengraving process and used as a mask to pattern the a-Si film by etching. In this example, dry etching is performed by using gas containing $SF_6$ gas and HCl gas. Thereafter, the photoresist pattern is removed to form, in the pixel TFT 30f, the first semiconductor layer 7 made of the a-Si film 6 on the separation part W1 across which the source contact layer 9 and the drain contact layer 10 are separated from each other on the gate insulation layer 5, and over the source contact layer 9, the drain contact layer 10, part of the first source electrode 17, and part of the first drain electrode 18, as illustrated in FIG. 42.

The first semiconductor layer 7 is electrically connected with the first source electrode 17 through the source contact layer 9. The first semiconductor layer 7 is also electrically connected with the first drain electrode 18 through the drain contact layer 10 and further electrically connected with the pixel electrode 16 through the first drain electrode 18. The separation part W1 between the source contact layer 9 and the drain contact layer 10, and the separation part W3 between the first source electrode 17 and the first drain electrode 18 serve as the first channel region CL1 of the first semiconductor layer 7. The second semiconductor layer 13 of the drive TFT 40f is covered by the second conductive film M2 and never in direct contact with the a-Si film 6. The oxide film 8a having semiconductor characteristics, of which the second semiconductor layer 13 is made, is not changed into a conductor through reduction by hydrogenated amorphous silicon contained in the a-Si film 6.

Subsequently, the second insulating film, of which the protective insulation layer 21 is to be made, is formed on the substrate 1. In the third modification of the second preferred embodiment, the protective insulation layer 21 is formed by stacking and depositing a SiO film having a thickness of 100 nm and a SiN film having a thickness of 200 nm in the stated order by the CVD method.

Thereafter, a photoresist pattern is formed through the fourth photoengraving process and used as a mask to sequentially pattern the SiO and SiN films of the protective insulation layer 21 and the SiN film of the gate insulation layer 5 by etching. In this example, dry etching is performed by using gas containing $O_2$ in addition to $SF_6$.

Figure 43:
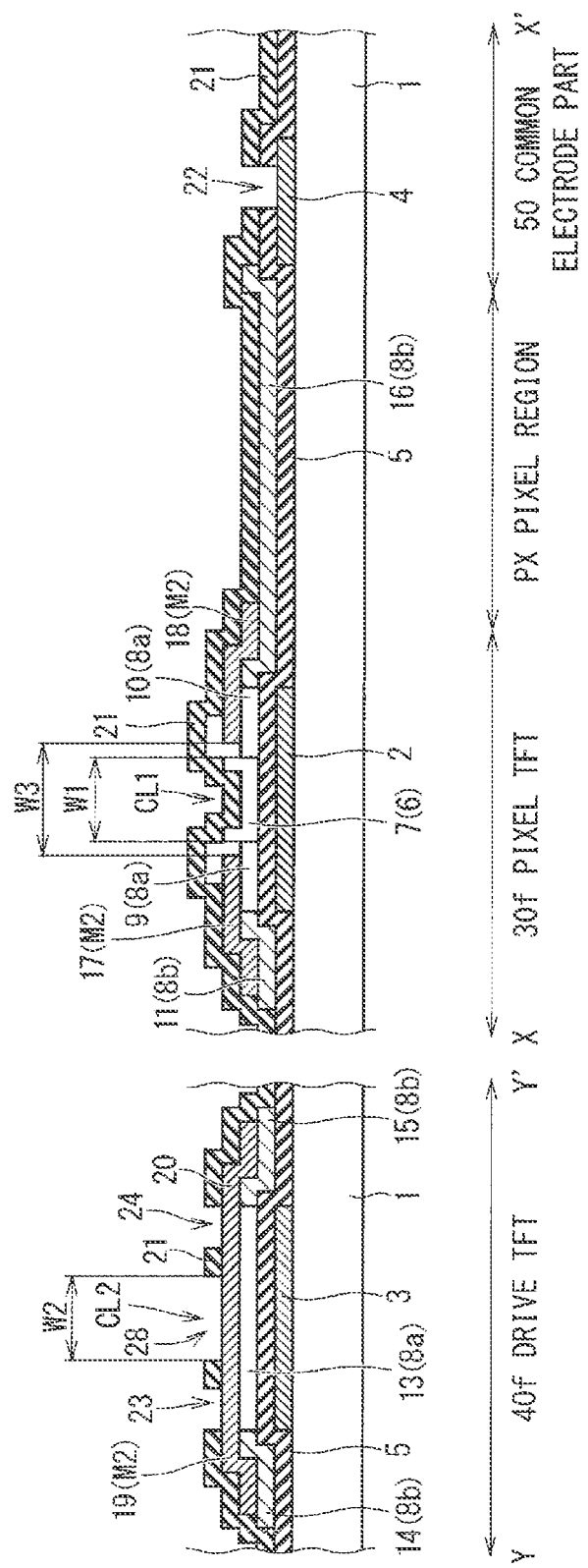

Thereafter, the photoresist pattern is removed to form, in the pixel region PX of the pixel TFT 30f, the common electrode part contact hole 22 through the protective insulation layer 21 and the gate insulation layer 5 so that part of the surface of the common electrode 4 is exposed, as illustrated in FIG. 43. The common electrode part contact hole 22 is disposed in a region overlapping the common electrode 4, but not the pixel electrode 16, in plan view.

In the drive TFT 40f, the first contact hole 23, the second contact hole 24, and the third contact hole 28 are formed through the protective insulation layer 21 so that part of the surface of the second conductive film M2 is exposed. The third contact hole 28 is disposed in a region overlapping the second gate electrode 3 in plan view.

Subsequently, the third conductive film, of which the counter electrode 25 and the like are to be made, is formed on the protective insulation layer 21. In the third modification of the second preferred embodiment, similarly to the second preferred embodiment, first, an ITO film that is an optically transparent oxide conductive film is deposited as the third conductive film.

Thereafter, a photoresist pattern is formed through the fifth photoengraving process and used as a mask to pattern the ITO film as the third conductive film by etching. In this example, wet etching is performed by using solution containing oxalic acid. Subsequently, wet etching is performed by using solution including water solution containing ammonium peroxodisulfate at the concentration of 0.3 weight % to pattern a partial region of the second conductive film M2 made of Cu. Thereafter, the photoresist pattern is removed to form the translucent counter electrode 25 in the pixel TFT 30f as illustrated in FIG. 34. The counter electrode 25 overlaps the pixel electrode 16 in the pixel region PX on the protective insulation layer 21 in plan view. The counter electrode 25 is connected with the common electrode 4 through the common electrode part contact hole 22.

The counter electrode 25 includes a slit opening SL. With this structure, electric field substantially parallel to the substrate surface is generated above the counter electrode 25 when signal voltage is applied between the pixel electrode 16 and the counter electrode 25. An opening in a comb-teeth shape may be provided in place of the slit opening SL.

In addition, as illustrated in FIG. 34, the third source electrode 26 and the third drain electrode 27 are formed in the drive TFT 40f. The third source electrode 26 is connected with the second source electrode 19 through the first contact hole 23, and the third drain electrode 27 is connected with the second drain electrode 20 through the second contact hole 24. In the third contact hole 28, the third conductive film made of ITO and the second conductive film M2 made of Cu are removed to form the second channel region CL2 including the separation part W2 on the second semiconductor layer 13 made of the oxide film 8a, thereby forming the drive TFT 401f.

To assemble a liquid crystal display panel, First, an alignment film and a spacer are formed on the surface of the TFT substrate illustrated in FIGS. 14 and 15. The alignment film is a film for arraying liquid crystals and contains, for example, polyimide. Subsequently, a counter substrate (not illustrated) separately produced and including a color filter and an alignment film is laminated opposite to the TFT substrate. In this state, the spacer forms a gap between the TFT substrate and the counter substrate, and liquid crystals are sealed in the gap, thereby producing an in-plane field liquid crystal drive FFS liquid crystal display panel. Lastly, a polarization plate, a wave plate, a backlight unit, and the like are disposed outside of the liquid crystal display panel, which completes an FFS LCD.

(Effects)

As described above, the third modification of the second preferred embodiment achieves, in addition to the effects of the above-described second preferred embodiment, such an effect that the FFS TFT substrate 100, in which the pixel TFT 30f (first TFT) including a semiconductor layer of the a-Si film 6 and the drive-circuit drive TFT 40f (second TFT) including a semiconductor layer of the oxide film 8a are both formed on the single substrate 1, can be produced through five photoengraving processes, which is fewer than the photoengraving processes in the second preferred embodiment. Thus, the productivity can be further improved.

In the method of manufacturing the TFT substrate according to the third modification of the second preferred embodiment, the process of forming the source contact layer 9, the process of forming the drain contact layer 10, the process of forming the second semiconductor layer 13, and the process of forming the pixel electrode 16 each include, after the process of forming the gate insulation layer 5: a process of sequentially stacking and forming, on the substrate 1, the oxide film 8a made of oxide having semiconductor characteristics and the second conductive film; and a process of patterning the oxide film 8a and the second conductive film all at once to form the source contact layer 9, the drain contact layer 10, the second semiconductor layer 13, and the pixel electrode 16. The process of forming the first source electrode 17 and the process of forming the first drain electrode 18 each include, after the process of patterning the oxide film 8a and the second conductive film all at once, a process of patterning the second conductive film all at once to form the first source electrode 17 and the first drain electrode 18. The process of forming the first semiconductor layer 7 includes, after the process of forming the first source electrode 17 and the process of forming the first drain electrode 18: a process of forming the amorphous silicon film 6 made of amorphous silicon on the substrate 1 while the second semiconductor layer 13 is covered by the second conductive film; and a process of patterning the amorphous silicon film 6 to form the first semiconductor layer 7. The process of forming the second source electrode 19 and the process of forming the second drain electrode 20 each include, after the process of forming the first semiconductor layer 7, a process of patterning the second conductive film all at once to form the second source electrode 19 and the second drain electrode 20.

With this configuration, no ohmic contact layer removal process is needed in a BCE process, thereby achieving formation of a semiconductor channel part made of the a-Si film 6 with the uniformity of the shape and characteristics. Thus, the uniformity of characteristics of the pixel TFT 30f can be improved.

In the method of manufacturing the TFT substrate according to the third modification of the second preferred embodiment, the process of forming the first gate electrode 2 and the process of forming the second gate electrode 3 each include a process of forming the first conductive film having light-shielding characteristics on the surface of the substrate 1, and a process of patterning the first conductive film all at once to form the first gate electrode 2 and the second gate electrode 3. The process of forming the pixel electrode 16 further includes, after the process of forming the first source electrode 17 and the process of forming the first drain electrode 18, a process of irradiating the back surface of the substrate 1 with light including ultraviolet.

With this configuration, the pixel electrode 16, the first source electrode underneath layer wire 11, the second source electrode underneath layer wire 14, and the second drain electrode underneath layer wire 15, which are made of the oxide film 8b having conductive characteristics, can be formed in regions irradiated with UV light having transmitted the substrate 1. In addition, the source contact layer 9, the drain contact layer 10, and the second semiconductor layer 13, which are made of the oxide film 8a having semiconductor characteristics, can be formed in regions shielded from UV light. Accordingly, the manufacturing process is simplified.

The TFT substrate according to the third modification can be produced through photoengraving processes fewer than the processes of manufacturing the TFT substrate 100 according to the first preferred embodiment.

In the exemplary descriptions of the preferred embodiments 1 and 2 and the modifications thereof, the oxide film 8a is an InGaZnO film having an atom composition ratio of In:Ga:Zn:O=1:1:1:4, but is not limited thereto. For example, the oxide film 8a may be an oxide semiconductor film containing at least one kind of metallic oxide such as InZnO oxide, InGaO oxide, InSnO oxide, InSnZnO oxide, InGaZnSnO oxide, InAlZnO oxide, InHf(hafnium)ZnO oxide, InZr(zirconium)ZnO oxide. InMg(magnesium)ZnO oxide, InY(yttrium)ZnO oxide, or ZnSnO oxide. Similarly to the InGaZnO film, the oxide semiconductor material typically has characteristics of an n-type semiconductor having an electron carrier density of $1\times10^{12}/cm^3$ to $1\times10^{19}/cm^3$ inclusive. The electron carrier density can be controlled by changing, for example, the mixture ratio of the Ar gas and the $O_2$ gas by the sputtering method. In addition, the oxide semiconductor film can be changed into the oxide film 8b having conductive characteristics by reducing the specific resistance through irradiation with UV light, and thus can achieve effects same as those achieved by the InGaZnO oxide film according to the preferred embodiments.

Accordingly, the oxide film 8a having semiconductor characteristics, which is included in a TFT substrate in the preferred embodiments and the examples, contains at least one kind of metallic oxide. The pixel electrode 16 contains at least one kind of metallic oxide contained in the oxide film 8a having semiconductor characteristics, of which the source contact layer 9, the drain contact layer 10, and the second semiconductor layer 13 are made. With this configuration, the pixel electrode 16, the source contact layer 9, and the drain contact layer 10 can be manufactured through the same process, which achieves a simplified manufacturing process and cost reduction.

The preferred embodiments of the present invention may be freely combined or each preferred embodiment may be modified or omitted as appropriate within the scope of the invention. Although the present invention is described above in detail, the above description is merely exemplary in any aspect and does not limit the present invention. Numerous modifications not exemplarily described above would be thought of without departing from the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate comprising:
    a first gate electrode made of a first conductive film and disposed in a predetermined first region on a substrate;
    a second gate electrode made of the first conductive film having a composition same as a composition of the first gate electrode and disposed in a predetermined second region on the substrate;
    a gate insulation layer disposed on the substrate and covering the first gate electrode and the second gate electrode;
    a first semiconductor layer made of amorphous silicon, disposed on the gate insulation layer, and overlapping the first gate electrode in plan view;
    a first contact layer made of oxide having semiconductor characteristics, a part of the first contact layer being disposed in contact with a front surface of the first semiconductor layer;
    a second contact layer made of the oxide having the semiconductor characteristics and a composition same as a composition of the first contact layer, and disposed separately from the first contact layer, a part of the second contact layer being disposed in contact with the front surface of the first semiconductor layer;

a first electrode made of a second conductive film and connected with the first contact layer;

a second electrode made of the second conductive film having a composition same as a composition of the first electrode and connected with the second contact layer;

a second semiconductor layer made of the oxide having the semiconductor characteristics and a composition same as the composition of the first contact layer and the second contact layer, disposed on the gate insulation layer, and overlapping the second gate electrode in plan view;

a third electrode made of the second conductive film having a composition same as the composition of the first electrode and the second electrode, a part of the third electrode being disposed in contact with a surface of the second semiconductor layer;

a fourth electrode made of the second conductive film having a composition same as the composition of the first electrode and the second electrode, and disposed separately from the third electrode, a part of the fourth electrode being disposed in contact with the surface of the second semiconductor layer; and a pixel electrode made of oxide having conductive characteristics, a composition of the oxide having the conductive characteristics being same as the composition of the oxide having the semiconductor characteristics of which the first contact layer, the second contact layer and the second semiconductor layer are made, the pixel electrode being disposed on the gate insulation layer positioned in the predetermined first region and outside of a region in which the first gate electrode is formed, the pixel electrode being connected with the second electrode.

2. The thin film transistor substrate according to claim 1, wherein
the oxide having the semiconductor characteristics includes at least one kind of metallic oxide, and
the pixel electrode includes at least one kind of metallic oxide included in the oxide that has the semiconductor characteristics and of which the first contact layer, the second contact layer, and the second semiconductor layer are each made.

3. The thin film transistor substrate according to claim 1, wherein the pixel electrode includes a pattern extended from and continuously integrated with the second contact layer made of the oxide having the semiconductor characteristics.

4. The thin film transistor substrate according to claim 1, further comprising:

a protective insulation layer disposed to cover the pixel electrode; and a counter electrode made of a third conductive film, disposed on the protective insulation layer, and overlapping the pixel electrode in plan view.

5. The thin film transistor substrate according to claim 4, wherein
the protective insulation layer is disposed to further cover the third electrode and the fourth electrode and includes a first opening in which a part of a surface of the third electrode is exposed and a second opening in which a part of a surface of the fourth electrode is exposed, and
the thin film transistor substrate further comprising:

a fifth electrode made of the third conductive film having a composition same as a composition of the counter electrode, disposed on the protective insulation layer, and connected with the third electrode through the first opening; and a sixth electrode made of the third conductive film having a composition same as the composition of the counter electrode, disposed on the protective insulation layer, and connected with the fourth electrode through the second opening.

6. The thin film transistor substrate according to claim 1, further comprising:

a first thin film transistor disposed in the predetermined first region and including the first gate electrode, the gate insulation layer, the first semiconductor layer, the first contact layer, the second contact layer, the first electrode, and the second electrode; and a second thin film transistor disposed in the predetermined second region and including the second gate electrode, the gate insulation layer, the second semiconductor layer, the third electrode, and the fourth electrode, wherein the predetermined first region is a display region in which a plurality of pixels are arrayed in a matrix on the substrate, the first thin film transistor is a pixel-display thin film transistor provided to each pixel in the display region, the predetermined second region is a region outside of the display region, and the second thin film transistor is a thin film transistor for a drive circuit configured to drive the first thin film transistor.

* * * * *